US00RE40205E

(19) United States
(12) Reissued Patent
Funaba et al.

(10) Patent Number: US RE40,205 E
(45) Date of Reissued Patent: Apr. 1, 2008

(54) SEMICONDUCTOR DEVICE AND TIMING CONTROL CIRCUIT

(75) Inventors: Seiji Funaba, Chiyoda-ku (JP); Yoji Nishio, Chiyoda-ku (JP); Yuichi Okuda, Chiyoda-ku (JP); Yoshinobu Nakagome, Chiyoda-ku (JP)

(73) Assignee: Elpida Memory, Inc., Tokyo (JP)

(21) Appl. No.: 10/226,019

(22) Filed: Aug. 23, 2002

Related U.S. Patent Documents

Reissue of:
(64) Patent No.: 6,269,051
Issued: Jul. 31, 2001
Appl. No.: 09/640,670
Filed: Aug. 18, 2000

U.S. Applications:
(62) Division of application No. 09/563,160, filed on May 1, 2000, now Pat. No. 6,212,127.

(30) Foreign Application Priority Data

Jun. 18, 1999 (JP) ..... 11-171864

(51) Int. Cl.
*G11C 11/4076* (2006.01)

(52) U.S. Cl. ..... 365/194; 365/233; 327/158; 327/161

(58) Field of Classification Search ..... 327/161
See application file for complete search history.

(56) References Cited

U.S. PATENT DOCUMENTS 5,430,394 A * 7/1995 McMinn et al. ..... 327/292
5,939,913 A * 8/1999 Tomita ..... 327/158
5,987,619 A * 11/1999 Hamamoto et al. ..... 713/401
5,990,714 A * 11/1999 Takahashi ..... 327/149
6,128,248 A 10/2000 Idei et al.
6,134,182 A * 10/2000 Pilo et al. ..... 365/194
6,269,051 B1 * 7/2001 Funaba et al. ..... 365/233
6,333,875 B1 * 12/2001 Shinozaki et al. ..... 365/194
6,351,166 B2 * 2/2002 Hashimoto ..... 327/158
6,366,507 B1 * 4/2002 Akioka et al. ..... 365/194
6,525,585 B1 * 2/2003 Iida et al. ..... 327/279

FOREIGN PATENT DOCUMENTS

JP 10-112182 12/1996
JP 10-283060 4/1997
JP 11-127062 10/1997
JP 11-127063 10/1997

OTHER PUBLICATIONS

JPO Notice of Reason of Refusal dated Oct. 26, 2007, in Japanese with English translation.

* cited by examiner

*Primary Examiner*—Tan T. Nguyen
(74) *Attorney, Agent, or Firm*—Reed Smith LLP; Stanley P. Fisher, Esq.; Juan Carlos A. Marquez, Esq.

(57) ABSTRACT

[Control on the speed of operation of a delay loop from the output of a variable delay circuit to a delay control input thereof is performed. For example, frequency-dividing circuits are respectively placed at the input and output of the variable delay circuit. A signal obtained by frequency-dividing a signal outputted from the variable delay circuit is supplied to one input of a phase comparator through a dummy delay circuit, and a signal obtained by frequency-dividing the input of the variable delay circuit is supplied to the other input of the phase comparator. Phase control is performed according to the result of comparison between the phases of both signals.] *Control on the speed of operation of a delay loop from the output of a variable delay circuit to a delay control input thereof is performed. For example, frequency-dividing circuits are respectively placed at the input and output of the variable delay circuit. A signal obtained by frequency-dividing a signal outputted from the variable delay circuit is supplied to one input of a phase comparator through a dummy delay circuit, and a signal obtained by frequency-dividing the input of the variable delay circuit is supplied to the other input of the phase comparator. Phase control is performed according to the result of comparison between the phases of both signals.*

15 Claims, 25 Drawing Sheets

SEMICONDUCTOR DEVICE AND TIMING CONTROL CIRCUIT

Matter enclosed in heavy brackets [ ] appears in the original patent but forms no part of this reissue specification; matter printed in italics indicates the additions made by reissue.

This application *is a Reissue Application of prior application Ser. No. 09/640,670, filed on Aug. 18, 2000, now U.S. Pat. No. 6,269,051, which* is a Divisional Application under 37 CFR 1.53(b) of prior application Ser. No. 09/563,160, filed on May 1, 2000, now U.S. Pat. No. 6,212,127.

BACKGROUND OF THE INVENTION

The present invention relates to a timing control circuit for changing a delay of a signal employed in an electronic circuit to thereby carry out timing control, and to a semiconductor device having such a timing control circuit. The present invention also relates to a technique effective for application to a clock synchronous memory such as a synchronous DRAM (Dynamic Random Access Memory), a synchronous SDRAM (Static Random Access Memory).

A clock access time (corresponding to the time required for an LSI to output a data signal in response to a clock signal) of a clock synchronous LSI (Large-Scale Integrated circuit) is rate-controlled by, for example, an operation delay developed in an input clock buffer, a wiring delay of a clock signal from the clock buffer to an output data buffer, and an output operation delay of a data signal outputted from the output data buffer, etc. For example, a delay time corresponding to the sum td (=td1+td2+td3) of a delay time td1 developed in the input clock buffer, a delay time td2 developed in wire or interconnection, and a delay time td3 developed in the output data buffer (corresponding to a data register and an output buffer) is produced until a clock signal for defining output timing of the output data buffer is inputted to an external clock terminal and data is outputted from the output data buffer.

The delay time td1 developed in the input clock buffer, the delay time td2 developed in the long wire and the delay time td3 developed in the data register and output buffer respectively varied due to a variation in process and changes in source voltage and temperature. Thus, the sum td of the delay times greatly varied.

Therefore, when a clock to be used is made fast and a cycle time is shortened, a time domain in which, for example, data outputted to the outside of LSI from the output data buffer can be received at the data receiving site where the data is received, becomes narrow, thus making it difficult to design a system.

It is thus considered that a timing control circuit is applied to solve the above problem. This aims to arrange the phase of a clock signal propagated through LSI by means of the timing control circuit in order to synchronize the clock signal received by LSI with timing provided to output data.

When the timing control circuit is placed immediately after an input clock buffer, for example, a clock signal produced by the input clock buffer is delayed td1 with respect to a clock signal at an external clock terminal. The timing control circuit produces a delay of m×tck−(td1+td2+td3). Here, tck indicates a clock cycle time, m is an integer greater than 1 and is determined so as to meet or satisfy m×tck−(td1+td2+td3)>0. In doing so, a clock signal produced from the timing control circuit is delayed m×tck−(td2+td3) with respect to the clock signal inputted to the external clock terminal. As a result, an output data signal at an output data terminal is delayed m×tck, i.e., m clock cycles with respect to the clock signal inputted to the external clock terminal. However, this is equivalent to the fact that the output data signal is in synchronism with the clock signal inputted to the external clock terminal. Thus, the output data signal can be synchronized with the external clock signal received by LSI through the use of the timing control circuit. Even if changes in process, source voltage and temperature occur, and the delay time td1 developed in the input clock buffer, the delay time td2 developed in the long wire and the delay time td3 developed in the data register and output buffer change, the timing control circuit develops the delay of m×tck−(td1+td2+td3) with given accuracy and synchronizes the timing provided to perform data output with the clock signal. Therefore, a variation in timing for the data output can be reduced within the above accuracy.

A DLL (Delay-Locked Loop) circuit is known as the timing control circuit. The DLL circuit is comprised principally of a variable delay circuit, a phase comparator, a delay control circuit, and a dummy delay circuit for reproducing a delay tdrep developed in a specific circuit in a chip. The function of the DLL circuit is to output an internal clock signal which is delayed m×tck−tdrep with respect to an external clock signal. Here, m is an integer greater than 1 and is determined so as to meet m×tck−tdrep>0.

IEEE Journal of Solid-state Circuits, Vol. 33, No. 11, C. H. Kim et al. issued by Institute of Electrical & Electronic Engineers of US (IEEE), November in 1998, entitled "A 64-Mbit, 640-Mbyte/s Bidirectional Data Strobed, Double-Data-Rate SDRAM with a 40-mw DLL for a 256-Mbyte Memory System" (pp.1703-1709) is known as a first reference in which the DLL circuit has been described. The DLL circuit described in the reference comprises a variable delay circuit, a pad routing delay for receiving a clock signal outputted from the variable delay circuit, a phase comparator for comparing the phase of an output produced from the pad routing delay and that of a clock signal inputted to the variable delay circuit, and a delay control circuit for performing delay control of the variable delay circuit based on the result of phase comparison by the phase comparator. The interior of the variable delay circuit takes a multistage configuration of differential type buffers and inverters. Loads each comprised of voltage-controlled capacitance are provided at their corresponding outputs of respective differential stages. The voltage-controlled capacitance is controlled to change a delay of a signal, i.e., its phase. In the DLL circuit, the clock signal is set to the variable delay circuit and outputted as an internal clock signal after the elapse of a predetermined delay time. At this time, the delay time developed in the variable delay circuit is controlled by the delay control circuit. This control is performed in the following manner. First of all, the input clock signal is transmitted even to the phase comparator together with the variable delay circuit. After the clock signal has passed through the variable delay circuit, it passes through the pad routing delay and enters the phase comparator. The phase comparator compares the phase of the post-one cycle clock signal and that of the clock signal, which has passed through the variable delay circuit and pad routing delay. When the phase of the clock signal having passed through the variable delay circuit and pad routing delay lags that of the post-one cycle clock signal, the delay control circuit having received the result of comparison shortens the delay time developed in the variable delay circuit by one delay step or increment. When the phase of the clock signal leads that of the post-one cycle clock signal in reverse, the delay control circuit lengthens the delay time developed in the variable delay circuit by one delay step, thereby controlling the delay time of the variable delay time. Owing to the execution of the above control for a sufficient time interval, the timing for the clock signal having passed through the variable delay circuit and the pad routing delay can be matched with that for the clock signal, whereby an internal clock signal delayed m×tck−tdrep (where m=1) with respect to the input clock signal can be obtained.

A basic configuration similar to the above, which is related to the DLL circuit, has been described even in Japanese Patent Application Laid-Open No. Hei 8-147967.

1997 IEEE International Solid-State Circuits Conference Digest of Technical Papers, Atsushi Hatakeyama et al. issued by Institute of Electrical & Electronic Engineers of US (IEEE), February in 1997, entitled "A 256 Mb SDRAM Using a Register-Controlled Digital DLL" (pp.72–73) is known as a second reference in which DLL has been described. A timing control technique described in the second reference aims to divide the frequency of an externally input clock signal by a frequency-dividing circuit and supply the divided clock signal to a DLL circuit, and provide a second variable delay circuit identical to a variable delay circuit lying within the DLL circuit, supply the pre-division clock signal to the second variable delay circuit and delay-control the second variable delay circuit by a delay control circuit in a manner similar to the variable delay circuit lying within the DLL circuit, thereby to obtain an internal clock signal delayed m×tck−tdrep with respect to the input clock signal. Since the operating speed of the DLL circuit is made slow by the frequency-dividing circuit, the present technique is low in power consumption as compared with the technique described in the first reference as to this point. A description related to the invention in which the operating speed of a DLL circuit is rendered slow by a frequency-dividing circuit in the same manner as described above, has been disclosed even in Japanese Patent Application Laid-Open No. Hei 10-269773 (corresponding to U.S. Pat. No. 5,955,904).

A description related to the invention in which the number of variable delay circuits remains unchanged, and only the input of a phase comparator is divided by a frequency-dividing circuit to thereby make slow a phase comparison operating speed, has been disclosed in each of Japanese Patent Application Laid-Open Nos. Hei 10-209857 and 11-17529. Further, such a DLL circuit that a phase comparing operation is stopped after its lock-in, has been described in Japanese Patent Application Laid-Open No. Hei 11-17530. Japanese Patent Application Laid-Open No. Hei 11-15555 is known as another reference in which a DLL circuit has been described.

Further, a semiconductor integrated circuit provided with a circuit considered to be a DLL circuit in Japanese Patent Application Laid-Open No. Hei 6-350440 (corresponding to U.S. Pat. No. 5,572,557) has a variable delay circuit controlled based on the result of comparison by a phase comparator. Frequency-dividing circuits are provided at the input and output of the variable delay circuit. An output produced from the frequency-dividing circuit connected to the output of the variable delay circuit is outputted outside the semiconductor integrated circuit. This output signal passes through a fixed delay buffer and each mounted wire provided over a clock distribution buffer mounted or implemented on a printed circuit board together with the semiconductor integrated circuit so as to be fed back to one input of the phase comparator. The output of the frequency-dividing circuit on the input side of the variable delay circuit is coupled to the other input of the phase comparator. A clock signal is supplied to the variable delay circuit from the clock distribution buffer. In the technique described therein, however, each wire on the printed circuit board, which is placed outside a semiconductor chip, is interposed in a feedback path extending from the variable delay circuit to a fixed delay circuit of the clock distribution buffer. Therefore, when the frequency of a signal is high, the transmission of the signal cannot be performed correctly. Thus, the frequency-dividing circuits are considered to be provided in order to allow phase lock control by a reduction in the frequency of the signal on such a path. Japanese Patent Application Laid-Open No. Hei 6-350440 suggests even a configuration equivalent to a DLL circuit provided with a frequency-dividing circuit only on the output side of a variable delay circuit. In the present configuration, the frequency-dividing circuit is provided only within a range required to lower the frequency of a signal over a mounted board. An inventive idea that frequency-dividing circuits are provided to achieve low power consumption and they are placed at both the input and output of a variable delay circuit to provide one variable delay circuit, is nil.

Further, an idea that all the elements of structure employed in a clock reproducing circuit are formed over one semiconductor chip, has not yet been disclosed.

SUMMARY OF THE INVENTION

Since the DLL circuits described in the first reference and Japanese Patent Application Laid-Open No. Hei 8-147967 (corresponding to U.S. Pat. No. 5,629,897) are activated based on the frequency of the clock signal over their entirety, they are large in power consumption. The technique described in the second reference or the like wherein the divided clock signal is supplied to the delay loop, can resolve such a problem.

However, since the number of stages of delay circuits is equal to the number of delay steps or increments, the number of the stages increases as each delay step becomes fine and the variable range of the delay time becomes broad, whereby the variable delay circuit will increase in circuit area. An additional problem arises in that since the two variable delay circuits are used in the technique described in the second reference, the circuit area increases correspondingly. Further, since the two variable delay circuits are used, the accuracy of timing control is reduced when a difference arises between characteristics of the two due to manufacturing variations.

Further, the techniques described in Japanese Patent Applications Laid-Open Nos. Hei 10-209857 and 11-17529 each of which utilizes the divided clock signal only for part of the delay loop without increasing the variable delay circuit in number, can limit an increase in chip area respectively. However, each of the techniques is inferior in low power consumption since the dummy delay circuit and the like must be activated at the frequency similar to the externally input clock signal. That is, a reduction in power to be used up or consumed by the dummy delay circuit has been not achieved.

It has been revealed by the present inventors that any of the above-described techniques each using the frequency-divided signal is accompanied by a problem that when the phase comparison is carried out using the divided signal, the number of operating cycles necessary for lock-in of DLL increases. That is, now consider where signals A and B each indicative of timing on the rising edge exist and the cycles of these are identical to each other and sufficiently long as compared with the difference in phase between the two signals. When it is determined at this time whether the phase of the signal B leads or lags that of the signal A, the signal A is inputted to a clock input of a flip-flop and the signal B is inputted to a data input thereof. The present flip-flop is used as a phase comparator, which outputs a signal (phase comparison signal) indicative of the result of phase comparison from its data output on the rise timing of the signal A. If the data output is now "L (low level or logical value 0)", then the signal B is indicative of being still held in a pre-rise state at a time in which the signal A rises. That is, it can be judged or determined that the phase of the signal B lags that of the signal A. If the data output is "H (high level or logical value 1) in reverse, then the signal B is indicative of being already held in a post-rise state at the rise time of the signal A. That is, it can be determined that the phase of the signal B leads that of the signal A.

However, a problem arises in that since the rise time of the signal A corresponds to a pre-one cycle state, i.e., pre-rising state of the signal B when the signals A and B are short in cycle and the phase of the signal B is delayed a half cycle or more with respect to the phase of the signal A, it is misjudged that the data output of the flip-flop results in "H" and the phase of the signal B leads that of the signal A. There is also a sense that phase comparison is done using a frequency-divided clock signal broad in pulse width in order to avoid such a problem.

When the phase comparison is performed using the divided clock signal in DLL of the type described in the second reference, for example, the maximum difference in phase between signals to be compared results in tdrep+tdmax−m×tck. Here, tdrep indicates a delay time developed in the dummy delay circuit, and tdmax indicates the maximum delay time developed in the two variable delay circuits. Since the phase comparison is misjudged as described above when the difference in phase between the signals to be compared is larger than the half cycle of the signal, the maximum difference in phase between the compared signals is required to be set smaller than the half cycle of the signal. That is, when a divided-by-n clock signal is used for phase comparison, a condition for avoiding a misjudgment of the phase comparison is given as follows (see equation 1). n is a natural number.

$$Tdrep+tdmax-m\times tck<n\times tck/2 \quad \text{(equation 1)}$$

In a synchronous memory, for example, a delay time corresponding to the sum td1+td2 of a delay time td1 developed in an input clock buffer and a delay time td2 developed in a long wire is developed until a clock signal reaches an output data buffer from an external clock terminal. With the speeding up of a clock for a CPU (Central Processing Unit) employed in a computer system, there has recently been a demand for achievement of the speeding up of an interface portion with other various electronic circuits. Even a clock employed in the synchronous memory needs a high frequency domain like 100 to 200 MHz or higher. As described above, the function of the DLL circuit is to output an internal clock signal delayed m×tck−(td1+td2+td3) with respect to an external clock signal. The variable delay circuit in the DLL circuit needs to create a delay time of m×tckmax−(td1+td2+td3). Here, tckmax indicates the maximum clock cycle time. Further, m is an integer greater than 1 and is determined so as to satisfy m×tck−(td1×td2+td3)>0. When the frequency of the clock becomes high and tck<td1+td2+td3, m results in an integer greater than or equal to 2. When the clock frequency ranges from 100 MHz to 200 MHz, tck results in 10 to 5 nanoseconds. If m=2 in the DLL circuit activated in such a clock frequency range, then the maximum tdmax of a delay time to be created by the variable delay circuit reaches m×tck, i.e., 20 nanoseconds at the time that tck=10 nanoseconds. If tdrep=td1+td2+td3=5 nanoseconds, then the condition that the phase comparison is not misjudged at a clock frequency of 200 MHz, results in 5 (nanoseconds)+20 (nanoseconds)−2×5 (nanoseconds) <n×5 (nanoseconds)/2 from the above description (equation 1). Thus, the required number of frequency divisions n results in n>6. The number of the frequency divisions needs to a large one as the clock frequency increases.

It has been revealed by the present inventors that as is apparent from this point of view, a problem arises in that since it is necessary to perform the phase comparison according to a signal larger in the number of frequency divisions when the clock frequency in high, for the purpose of avoiding a misjudgment even if the phase comparison is done using the divided clock signal in the DLL circuit, a timing interval for controlling the delay time of the variable delay circuit becomes long and a lock-in cycle of the DLL circuit increases, thus causing a reduction in follow-up performance of the internal clock incident to a change in chip-in environment. If such a problem is left as it is, then the synchronous LSI using the DLL circuit brings about a situation in which as the lock-in cycle of the DLL circuit increases, the number of clock cycles necessary for its recovery from a standby state thereof increases, thus causing an impediment to an improvement in performance of a system with an improvement in clock frequency.

An object of the present invention is to provide a timing control circuit capable of effecting low power consumption on a circuit (including a dummy delay circuit) on a delay loop while a small area is being held as it is without increasing a variable delay circuit in number, and a semiconductor device having such a timing control circuit.

Another object of the present invention is to provide a timing control circuit capable of implementing low power consumption while a small area is being held as it is without increasing a variable delay circuit in number, and shortening a lock-in cycle, and a semiconductor device having such a timing control circuit.

A further object of the present invention is to provide a timing control circuit capable of performing clock phase control with high accuracy without a misjudgment on phase, and a semiconductor device having such a timing control circuit.

A still further object of the present invention is to provide a timing control circuit capable of reducing an interval for phase comparing timing without a fear of a misjudgment and shortening a time interval necessary for lock-in, and a semiconductor device having such a timing control circuit.

The above, other objects and novel features of the present invention will become apparent form the description of the present application and the accompanying drawings.

Summaries of typical ones of the inventions disclosed in the present application will be described in brief as follows:

[1] A semiconductor device according to the invention of the present application, in which attention has been focused on low power consumption and a reduction in area, performs control on an operating speed of a delay loop from the output of a variable delay circuit to a delay control input thereof. For example, frequency-dividing circuits are placed at the input and output of the variable delay circuit. A signal obtained by frequency-dividing a signal outputted from the variable delay circuit is supplied to one input of a phase comparator through a dummy delay circuit, and a signal obtained by frequency-dividing the input of the variable delay circuit is supplied to the other input of the phase comparator. Phase control is performed according to the result of comparison between the phases of both signals.

Described more specifically, a semiconductor integrated device comprises a semiconductor chip including a clock input circuit which inputs an external clock signal, a timing control circuit which inputs a first internal clock signal outputted from the clock input circuit to thereby output a second internal clock signal, and an internal circuit which inputs the second internal clock signal outputted from the timing control circuit. The timing control circuit includes a variable delay circuit which inputs the first internal clock signal to thereby output the second internal clock signal, a dummy delay circuit which reproduces an operation delay time of a predetermined circuit on the semiconductor chip and gives it to the second internal clock signal, a phase comparator which compares the phase of the first internal clock signal outputted from the clock input circuit and the phase of a signal outputted from the dummy delay circuit, a delay control circuit which controls a delay time of the variable delay circuit based on the result of comparison by the phase comparator, and speed control means which allows the dummy delay circuit, the phase comparator and the delay control circuit to operate at a frequency lower than that of the first internal clock signal.

According to the semiconductor integrated circuit, since the phase comparator, the delay control circuit and the dummy delay circuit are activated based on the frequency of the divided clock, power consumption is reduced. The variable delay circuits, which have been provided two in the prior art, can be set to one. It is also possible to reduce power consumption while an increase in circuit area is being controlled.

[2] A semiconductor integrated circuit according to the invention of the present application, in which attention has been focused on step signalization of a phase comparison signal in terms of the prevention of both a phase comparison determination malfunction and an increase in lock-in cycle, adopts a timing signal generator which generates a phase comparing timing signal having a step waveform. Further, the semiconductor integrated circuit adopts means which erases or resets a phase comparing timing signal transmitted to a delay loop after a phase comparing operation.

Described more specifically, a semiconductor device comprises a semiconductor chip including a clock input circuit which inputs an external clock signal, a timing control circuit which inputs a first internal clock signal outputted from the clock input circuit to thereby output a second internal clock signal, and an internal circuit which inputs the second internal clock signal outputted from the timing control circuit. The timing control circuit includes a variable delay circuit which inputs the first internal clock signal to thereby output the second internal clock signal, a delay circuit which delays an input signal with a signal propagation delay time equivalent to the variable delay circuit, a dummy delay circuit which reproduces an operation delay time of a predetermined circuit on the semiconductor chip and adds the operation delay time to a signal outputted from the delay circuit, a phase determining circuit which determines the phase of a signal outputted from the dummy delay circuit, based on phase determining timing, a delay control circuit which controls a delay time of the variable delay circuit, based on the result of determination by the phase determining circuit, and a timing signal generator which, for every plural cycles of the first internal clock signal outputted from the clock input circuit, supplies a phase determining level signal to the delay circuit and supplies phase determining timing for the phase determining level signal, which is fed back to the phase determining circuit, to the phase determining circuit.

A reset control circuit is further provided which sets the outputs of the delay circuit and the dummy delay circuit to an initial level respectively after the phase determining timing.

The delay circuit may be comprised of another variable delay circuit which has the same circuit as the variable delay circuit and is subjected to the same control as the control on the variable delay circuit by the delay control circuit. That is, the variable delay circuits are placed side by side.

In order to reduce a circuit scale of the delay circuit, the delay circuit may comprise a shift register in which shift control terminals are successively coupled to a delay signal path of the variable delay circuit.

The timing signal generator generates a phase determining level signal (first phase comparing timing signal) and a phase determining timing signal (second phase comparing timing signal) as phase comparing timing signals every plural cycles of a first clock signal supplied to a variable delay circuit. The second phase comparing timing signal is delayed m clock cycles with respect to the first phase comparing timing signal. The first phase comparing timing signal is transmitted to the variable delay circuit which constitutes a delay loop, whereas the second phase comparing timing signal is transmitted to a phase comparator. When a phase comparing operation is completed, a phase comparison control circuit next outputs a timing signal request signal for making a request to the timing signal generator for the generation of an additional phase comparing timing signal, for example. The variable delay circuit and dummy delay circuit constituting the delay loop, and the timing signal generator erase the phase comparing timing signal which remains within the delay loop. The timing signal generator additionally generates first and second phase comparing timing signals.

Thus, the timing control circuit according to the present invention utilizes the timing signal having the step waveform, which is different from the divided clock signal upon phase comparison, erases the phase comparing timing signal remaining within the delay loop along with the completion of the phase comparing operation, and immediately starts the next phase comparison. It is therefore possible to shorten the interval for timing provided to perform phase comparison to the minimum without any misjudgment. Accordingly, the timing control circuit can shorten the intervals for the timing provided to perform phase comparison and the timing provided to control the delay time of the variable delay circuit and is capable of reducing a lock-in cycle.

[3] The divided clock signal may be introduced in the delay loop in the configuration of the step signalization in the delay loop.

That is, a semiconductor device comprises a semiconductor chip including a clock input circuit which inputs an external clock signal, a timing control circuit which inputs a first internal clock signal outputted from the clock input circuit to thereby output a second internal clock signal, and an internal circuit which inputs the second internal clock signal outputted from the timing control circuit. The timing control circuit has a first variable delay circuit which inputs the first internal clock signal to thereby output the second internal clock signal, a second variable delay circuit having the same circuit configuration as the first variable delay circuit, a dummy delay circuit which reproduces an operation delay time of a predetermined circuit on the semiconductor chip and gives it to a signal outputted from the second variable delay circuit, a phase determining circuit which determines the phase of a signal outputted from the dummy delay circuit, based on phase determining timing, a delay control circuit which controls delay times of the first and second variable delay circuits to the same, based on the result of determination by the phase determining circuit, a frequency-dividing circuit which outputs the first internal clock signal outputted from the clock input circuit as it is or divides it and outputs the same therefrom, and a timing signal generator which, for every plural cycles of the clock signal outputted from the frequency-dividing circuit, supplies a phase determining level signal to the second variable delay circuit and supplies phase determining timing for the phase determining level signal, which is fed back to the phase determining circuit, to the phase determining circuit. Dividing the clock signal by the frequency-dividing circuit after lock-in makes it possible to promptly complete a lock-in operation and contribute to low power consumption after the lock-in.

When the frequency-divided signal is used, the timing control circuit may adopt a follow-up circuit like a shift register as a delay circuit. The timing control circuit considered from this point of view comprises a variable delay circuit which inputs the first internal clock signal to thereby output the second internal clock signal, a delay circuit having a shift register configuration in which shift control terminals are successively coupled to a delay signal path of the variable delay circuit and an input signal is delayed with a signal propagation delay time equivalent to the variable delay circuit, a dummy delay circuit which reproduces an operation delay time of a predetermined circuit on the semiconductor chip and adds the operation delay time to a signal outputted from the delay circuit, a phase determining circuit which determines the phase of a signal outputted from the dummy delay circuit, based on phase determining timing, a delay control circuit which feedback-controls a delay time of the variable delay circuit, based on the result of determination by the phase determining circuit, a frequency-dividing circuit which outputs the first internal clock signal outputted from the clock input circuit as it is or divides the first internal clock signal and outputs the same therefrom, and a timing signal generator which, for every plural cycles of the clock signal outputted from the frequency-dividing circuit, supplies a phase determining level signal to the delay circuit and supplies the phase determining timing for the phase determining level signal, which is fed back to the phase determining circuit, to the phase determining circuit. The frequency-dividing circuit performs frequency division after lock-in. Thus, this makes it possible to immediately complete a lock-in operation and contribute to low power consumption after the lock-in.

After the phase determining timing, the outputs of the delay circuits and the dummy delay circuit may be reset to an initial level respectively.

[4] In a semiconductor integrated circuit to which the configuration of step signalization in the delay loop is applied, when the internal circuit is an output circuit which performs an external output operation in synchronism with a change in the second internal clock signal, the dummy delay circuit is a delay circuit which reproduces a time interval corresponding to the sum of an operation delay time of the clock input circuit, an operation delay time of the output circuit, a delay time developed in a wire extending from the clock input circuit to the timing control circuit, and a delay time developed in a wire extending from the timing control circuit to the output circuit.

Such a semiconductor device implements, for example, a clock synchronous memory. For example, the clock synchronous memory further includes a processing circuit which is connected to the output circuit and processes data to be outputted from the output circuit. The processing circuit has a memory cell array and a selection circuit which selects a memory cell from the memory cell array. The output circuit corresponds to an output data latch circuit which latches information stored in the memory cell selected from the memory cell array, and a data output buffer connected to the output data latch circuit. The output timing signal is a latch control signal for the output data latch circuit.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

<<Semiconductor Device>>

Figure 3:
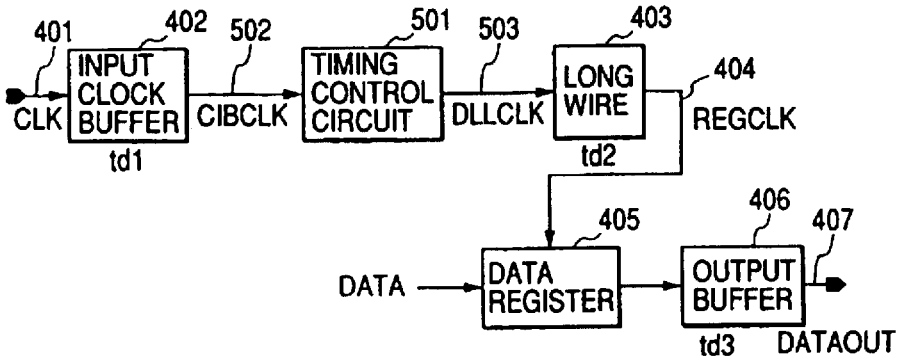
FIG. 3 is a block diagram showing one example of a semiconductor device according to the present invention on the whole.

One example of a semiconductor device according to the present invention is shown in FIG. 3 on the whole. A clock signal CLK inputted to an external clock terminal 401 is inputted to a data register 405 through an input clock buffer 402, a timing control circuit 501 and a long interconnection or wire 403. A data signal is inputted from the data register 405 to an output buffer 406 and output data DATAOUT is outputted from an output data terminal 407. The external clock terminal 401 is a terminal for receiving the clock signal CLK accepted by the semiconductor device (also described as LSI).

Figure 4:
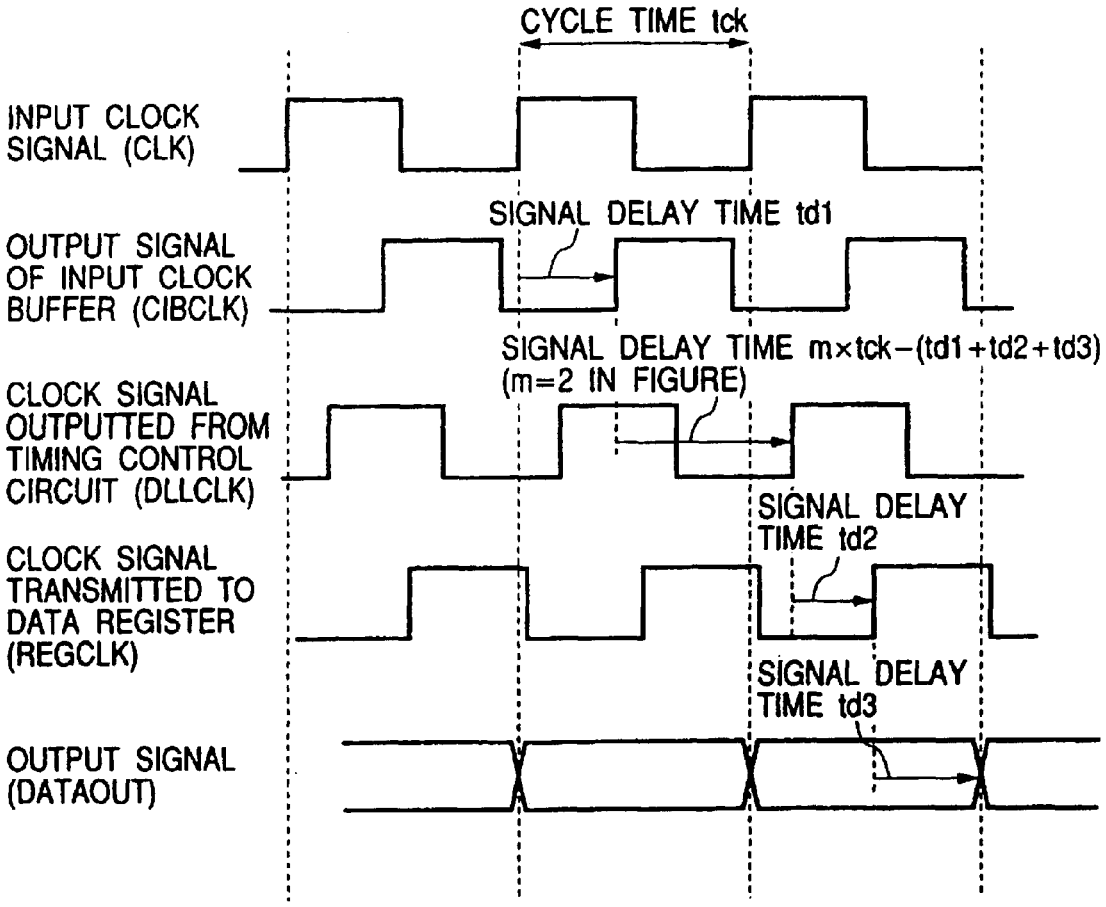
FIG. 4 is a timing chart depicting the relationship of phase between a clock signal and a data signal employed in the semiconductor device shown in FIG. 3.

FIG. 4 shows the relationship of phase between the clock signal and the data signal. A clock signal CIBCLK produced from the input clock buffer 402 is delayed td1 with respect to the clock signal CLK inputted to the external clock terminal 401. Next, the timing control circuit 501 produces a delay of m×tck−(td1+td2+td3). In the equation, tck indicates a clock cycle time. m indicates an integer greater than 1 and is determined so as to meet or satisfy m×tck−(td1+td2+td3)>0, td1 indicates an operation delay time developed in the input clock buffer, td2 indicates a wiring delay time developed in the long wire 403, and td3 indicates an operation delay time developed in the data register 405 and output buffer 406. At this time, a clock signal DLLCLK produced from the timing control circuit 501 is delayed m×tck−(td2+td3) with respect to the clock signal CLK inputted to the external clock terminal 401. As a result, the output data signal at the output data terminal DATAOUT is delayed m×tck, i.e., m clock cycles with respect to the clock signal CLK inputted to the external clock terminal 401. This is equivalent to the fact that the output data signal is in synchronism with the clock signal CLK inputted to the external clock terminal 401. Thus, the output data signal DATAOUT can be synchronized with the external clock signal CLK received by LSI through the use of the timing control circuit 501. Even if changes in process, source voltage and temperature occur, and the delay time td1 developed in the input clock buffer 402, the delay time td2 developed in the long wire 403 and the delay time td3 developed in the data register 405 and output buffer 406 change, the timing control circuit 501 develops the delay of m×tck−(td1+td2+td3) with given accuracy and synchronizes the timing provided to perform data output with the clock signal. Therefore, a variation in timing for the data output can be reduced within the above accuracy.

<<Delay Loop Frequency-division Type Timing Control Circuit>>

Figure 1:
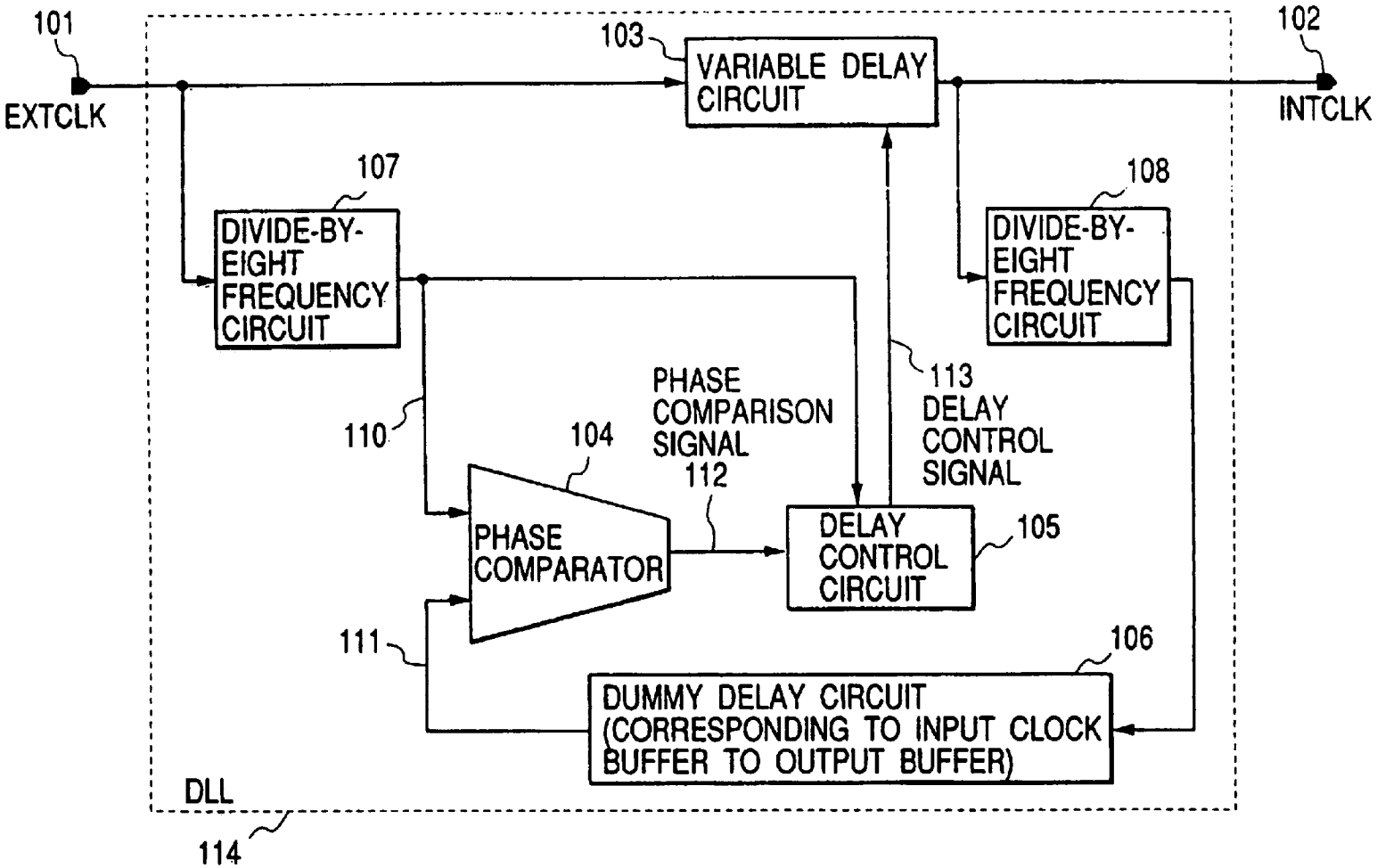
FIG. 1 is a block diagram showing one example of a feedback loop division type DDL circuit used as one example of a timing control circuit according to the present invention.
Figure 2:
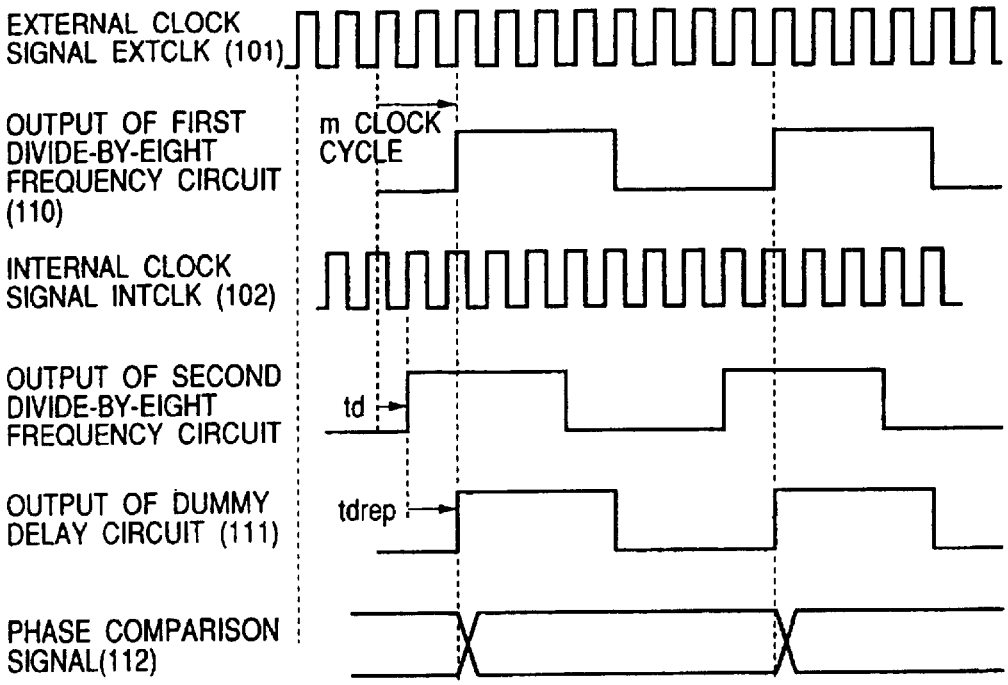
FIG. 2 is a timing chart illustrating phase lock operating timings provided by the DLL circuit of FIG. 1 by way of example.

One example of a feedback loop dividing type DDL circuit 114 is illustrated in FIG. 1 as the timing control circuit 501. Phase lock operating timings provided by the circuit shown in FIG. 1 are illustrated in FIG. 2 by way example.

The timing control circuit shown in FIG. 1 corresponds to the DLL circuit 114, which comprises an external clock input terminal 101, an internal clock output terminal 102, a variable delay circuit (first delay circuit) 103, a phase comparator 104, a delay control circuit 105, a dummy delay circuit (second delay circuit) 106 for reproducing a delay time tdrep developed in an input clock buffer, a long wire and an output data buffer, a divide-by-eight frequency circuit (first frequency-dividing circuit) 107 for dividing an external clock signal by eight, and a divide-by-eight frequency circuit (second frequency-dividing circuit) 108 for dividing an internal clock signal by eight. Here, the external clock input terminal 101 means an external clock input terminal of the timing control circuit 501 (DLL circuit 114). Thus, it should be understood that the external clock signal EXTCLK (first clock) of the timing control circuit 501 (DLL circuit 114) corresponds to the clock signal CIBCLK shown in FIG. 3. Further, a clock signal INTCLK (second clock) outputted from the clock terminal 102 corresponds to DLLCLK shown in FIG. 3.

In the circuit shown in FIG. 1, the external clock signal EXTCLK is first inputted to the external clock input terminal 101. Next, the external clock signal EXTCLK is inputted to the divide-by-eight frequency circuit 107 where it is divided by eight, which in turn is defined as a divided-by-eight clock signal 110 (third clock). Let's now assume that the output signal of the divide-by-eight frequency circuit 107 is delayed by m clock cycles of the input signal. Here, m is an integer greater than 1 and is determined so as to satisfy m×tck−tdrep>0. However, tck indicates a clock cycle time. The external clock signal is outputted as the internal clock signal from the internal clock output signal terminal 102 through the variable delay circuit 103 and inputted to the divide-by-eight frequency circuit 108 where it is divided by eight, which in turn is outputted therefrom (fourth clock). Next, this signal passes through the dummy delay circuit 106 for reproducing the delay time tdrep developed in the input clock buffer 402, the long wire 403 and the output register 405 and output buffer 406, thus resulting in a second divided-by-eight clock signal (fifth clock) 111, followed by inputting to the phase comparator 104. Next, the phase comparator 104 compares the phase of the first divided-by-eight clock signal 110 and that of the second divided-by-eight clock signal 111. The result of comparison by the phase comparator 104 is outputted to the delay control circuit 105 as a phase comparison signal 112. The delay control circuit 105 outputs a delay control signal 113 to control a delay time developed in the variable delay circuit 103 in such a manner that when the second divided-by-eight clock signal 111 lags the first divided-by-eight clock signal 110, the delay time developed in the variable delay circuit 103 is shortened by one delay step or increment and when the second divided-by-eight clock signal 111 leads the first divided-by-eight clock signal 110 in reverse, the delay time developed in the variable delay circuit 103 is lengthened by one delay step. Owing to the execution of the above control for a sufficient time interval, timing for the second divided-by-eight clock signal 111 can be matched with that for the first divided-by-eight clock signal 110 and hence the internal clock signal delayed by m×tck−tdrep with respect to the external clock signal can be obtained.

Figure 5:
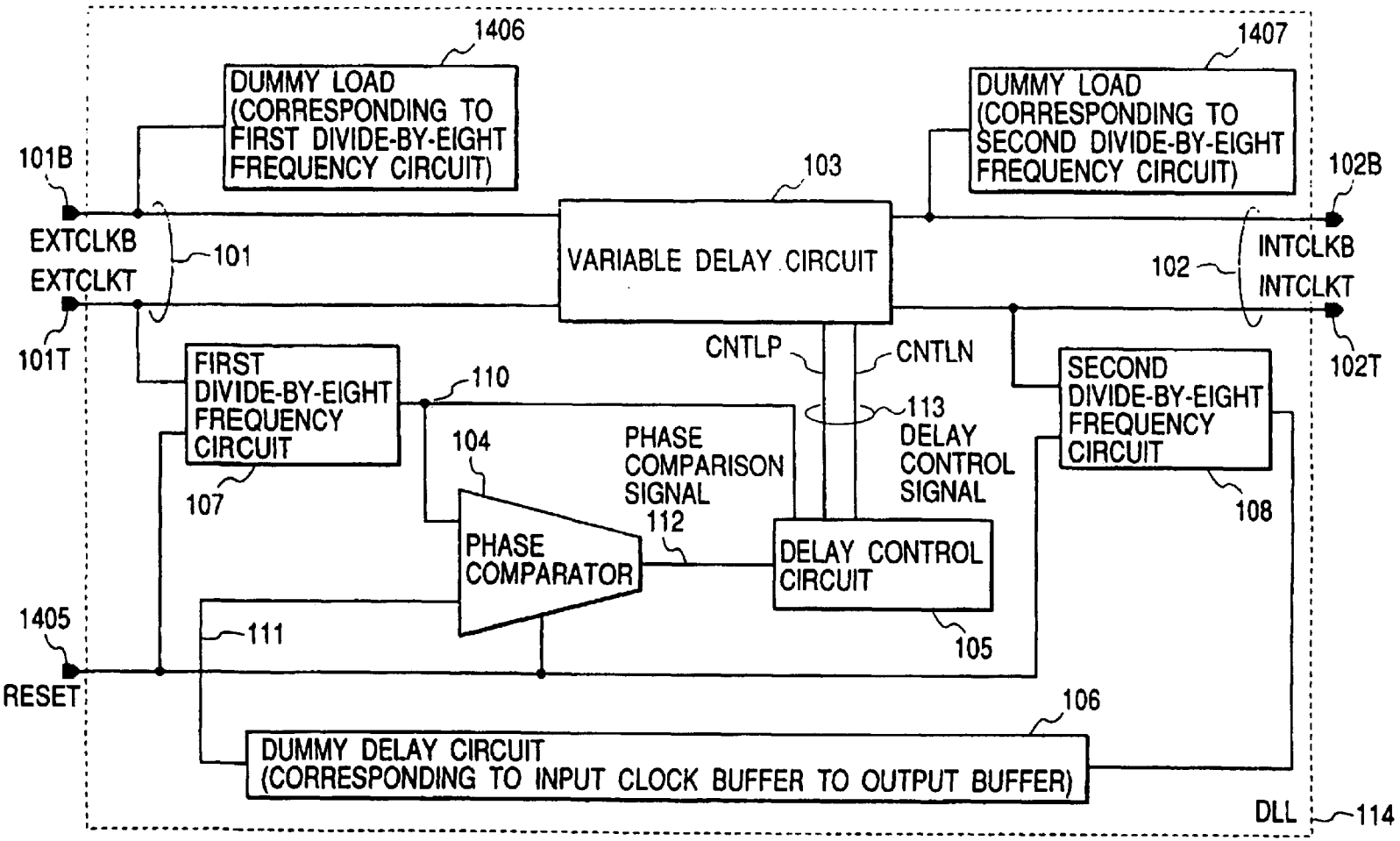
FIG. 5 is a block diagram showing a further detailed example of the DLL circuit shown in FIG. 1.

A further detailed example of the DLL circuit 114 shown in FIG. 1 is shown in FIG. 5. In FIG. 5, an external clock input terminal 101 takes a differential configuration of a non-inversion terminal 101T and an inversion terminal 101B. The first external clock input terminal 101T is supplied with a non-inversion clock EXTCLKT and the second external clock input terminal 101B is supplied with an inversion clock EXTCLKB. Further, an internal clock output terminal 102 also takes a differential configuration of a non-inversion terminal 102T and an inversion terminal 102B. A non-inversion clock INTCLKT is outputted from the first internal clock output terminal 102T, and an inversion clock INTCLKB is outputted from the second internal clock output terminal 102B. A delay control signal 113 inputted to a variable delay circuit 103 comprises a signal CNTLP for providing instructions for allowing a delay to lead by one step and a signal CNTLN for providing instructions for allowing the delay to lag one step by one step. Further, a dummy load 1406 of a divide-by-eight frequency circuit 107 is used to equalize a load applied to one input signal line of the variable delay circuit 103 on the signal EXTCLKB side and a load applied to the other input signal line thereof on the signal EXTCLKT side to each other. A dummy load 1407 of a divide-by-eight frequency circuit 108 is used to equalize a load applied to one output signal line of the variable delay circuit 103 on the signal INTCLKB side and a load applied to the other output signal line thereof on the signal INTCLKT side to each other. Further, a reset signal RESET inputted from a reset signal terminal 1405 initializes the divide-by-eight frequency circuit 107, the divide-by-eight frequency circuit 108 and a phase comparator 104.

Figure 6:
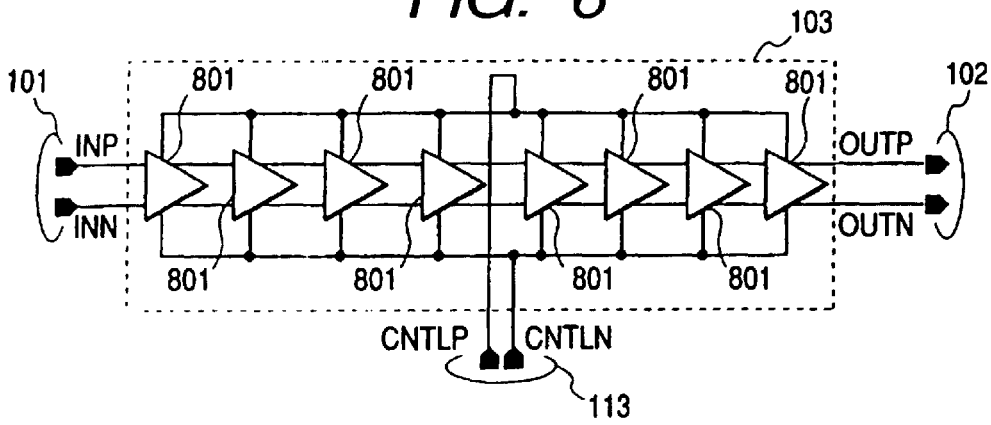
FIG. 6 is logic circuit diagram illustrating one example of a variable delay circuit.
Figure 7:
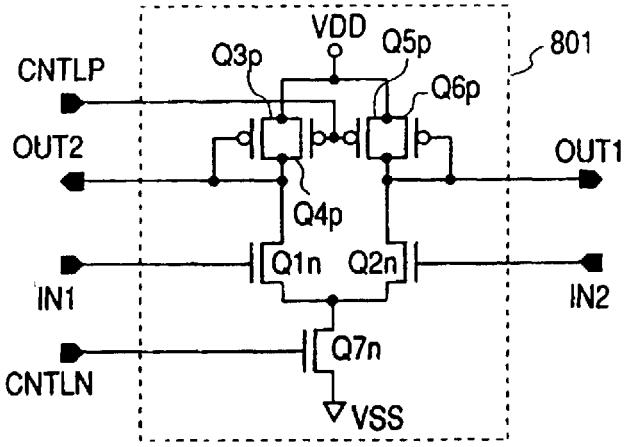
FIG. 7 is a circuit diagram illustrating a circuit configuration of one delay stage employed in the variable delay circuitry by way example.

One example of the variable delay circuit is shown in FIG. 6. A circuit configuration of one delay stage is illustrated in FIG. 7 by way of example. The variable delay circuit 103 is a circuit for delaying an input signal by a predetermined time according to a delay control signal 113 and outputting it therefrom. According to FIG. 6, the variable delay circuit 103 has a configuration in which differential delay stages 801 are connected in series in multistage form. A clock signal input terminal 101 and a clock signal output terminal 102 take differential configurations respectively. In the delay stage 801, a ground voltage VSS employed in the circuit and a source voltage VDD employed in the circuit are used as operating sources, and p channel load transistors Q3p through Q6p are electrically connected to n channel differential input MOS transistors Q1n and Q2n. Thus, the delay stage 801 is activated by the turning on of an n channel current source transistor Q7n. A signal CNTLN inputted from the delay control signal input terminal 113 switch-controls the MOS transistor Q7n, and a signal CNTLP switch-controls the load MOS transistors Q4p and Q5p. An output signal OUT1 is used as a voltage applied to the drain of the MOS transistor Q2n, and an output signal OUT2 is used as a voltage applied to the drain of the MOS transistor Q1n. The MOS Q3p and Q6p respectively have diode connection configurations in which the gates thereof are coupled to their own drains.

The operation of the variable delay circuit 103 will be described. Differential signals INP and INN are first inputted. The signals INP and INN pass through the differential delay stages 801 over the plural stages and are outputted as signals OUTP and OUTN from the clock signal output terminal 102 with given delay times. The delay times of the respective differential delay stages 801 respectively result in time constants based on resistances of the load MOS transistors and parasitic capacitance of an output unit. Since each differential delay stage 801 changes in output resistance when the voltage of the delay control signal CNTLP is now changed, the time constant, i.e., delay time based on the output resistance of each differential delay stage 801 and the parasitic capacitance of the output unit can be controlled by changing the voltage of the delay control signal CNTLP. Incidentally, as will be described in the subsequent section of bias circuit, the signal CNTLN is used to change a current flowing through the NMOS current source transistor Q7n, based on its voltage, and control or restrain a variation in output voltage amplitude of each differential delay stage with respect to a variation in process and a variation in source voltage.

Figure 8:
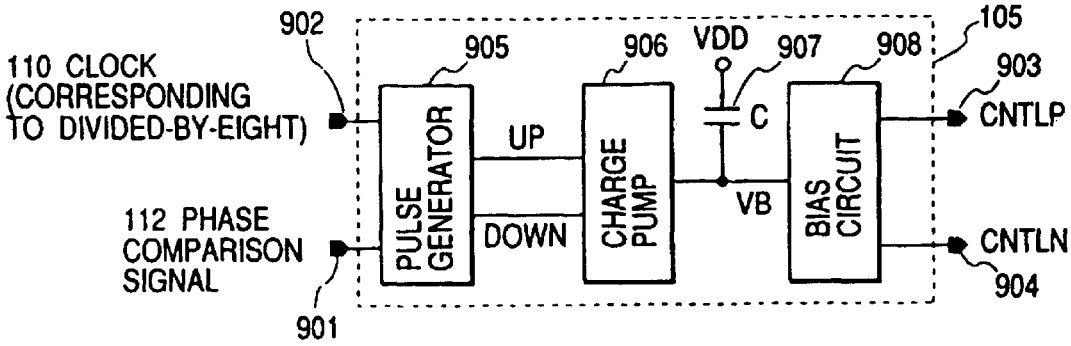
FIG. 8 is a block diagram showing one example of a delay control circuit.

One example of the delay control circuit is illustrated in FIG. 8 by way of example. The delay control circuit 105 is a circuit for outputting a delay control signal 113, based on a phase comparison signal 901 in such a manner that when the phase of an internal clock signal leads that of an external clock signal, the delay time of the variable delay circuit 103 is lengthened and when the phase of the internal clock signal lags that of the external clock signal, the delay time of the variable delay circuit 103 is shortened. The delay control signal 113 results in bias signals defined as a signal CNTLN for controlling the MOS transistor Q7n of each differential delay stage 801 in the variable delay circuit 103, and a signal CNTLP for controlling the load MOS transistors Q4p and Q5p. According to the configuration shown in FIG. 8, the delay control circuit 105 comprises a phase comparison signal input terminal 901, a divided-by-eight clock input terminal 902, a CNTLP signal output terminal 903, a CNTLN signal output terminal 904, a pulse generator 905, a charge pump circuit 906, a charge capacitor 907 and a bias circuit 908.

Figure 9:
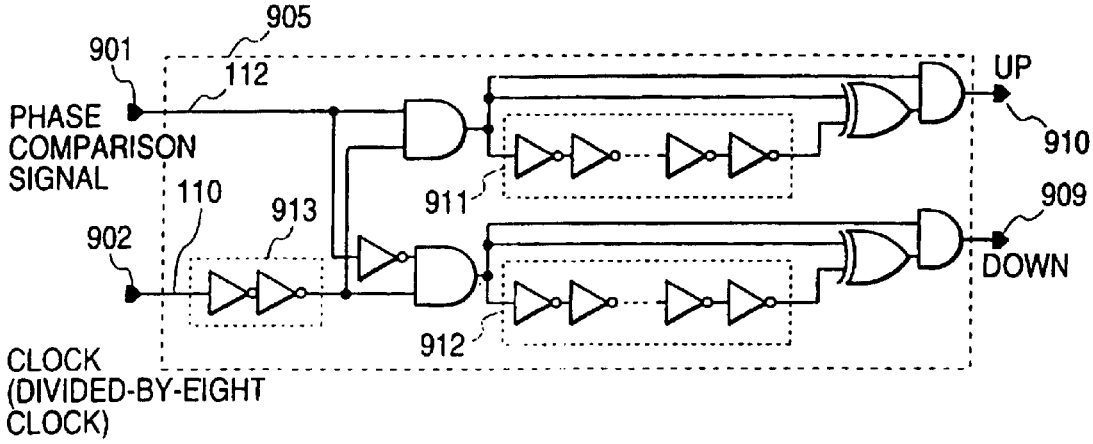
FIG. 9 is a logic circuit diagram depicting one example of a pulse generator 906 included in the delay control circuit.

One example of the pulse generator 905 is illustrated in FIG. 9. A phase comparison signal 112 is inputted to the pulse generator 905 from the phase comparison signal terminal 901, and a divided-by-eight clock signal 110 is inputted thereto from the divided-by-eight clock terminal 902. If the phase comparison signal 112 is an "H" level indicative of the fact that the phase of the internal clock signal leads, then the pulse generator 905 outputs a pulse signal synchronized with the divided-by-eight clock signal 110 to an UP signal terminal 910. If the phase comparison signal 112 is an "L" level indicative of the fact that the phase of the internal clock signal lags, then the pulse generator 905 outputs a pulse signal synchronized with the divided-by-eight clock signal 110 to a DOWN signal terminal 909. Incidentally, inverter stages 911 and 912 each comprised of a plurality of stages of inverters connected in series are respectively delay circuits. The pulse width of each pulse signal referred to above is made equal to a delay time of each delay circuit. Further, an inverter stage 913 used as the delay circuit is used to delay the divided-by-eight clock signal 110 with respect to the phase comparison signal 112 and protect against hazards developed in the UP signal terminal 910 and DOWN signal terminal 909.

Figure 10:
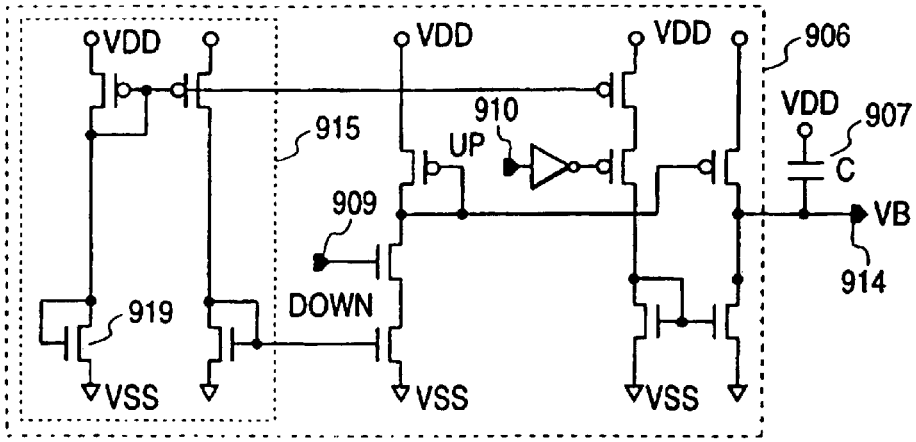
FIG. 10 is a logic circuit diagram illustrating one example of a charge pump circuit 906 included in the delay control circuit.

One example of the charge pump circuit 906 is illustrated in FIG. 10. A pulse signal is inputted to an UP signal terminal 910 or a DOWN signal terminal 909 of the charge pump circuit 906. When the pulse signal is inputted to the UP signal terminal 910 of the charge pump circuit 906, a charge current, i.e., a positive electric charge is injected into a negative electrode of the charge capacitor 907 for a given finite period determined according to the pulse width of the pulse signal, and correspondingly the voltage applied to a VB signal terminal 914 rises. When the pulse signal is inputted to the DOWN signal terminal 909, a charge current, i.e., a positive electric charge is extracted from the negative electrode of the charge capacitor 907 for a given finite period determined according to its pulse width, and correspondingly the voltage applied to the VB signal terminal 914 is lowered. Incidentally, a circuit designated at numeral 915 in the drawing is a current mirror current source, which generates a current identical in amount to a current flowing through each diode-coupled n channel MOS transistor 919 as a charge current.

Figure 11:
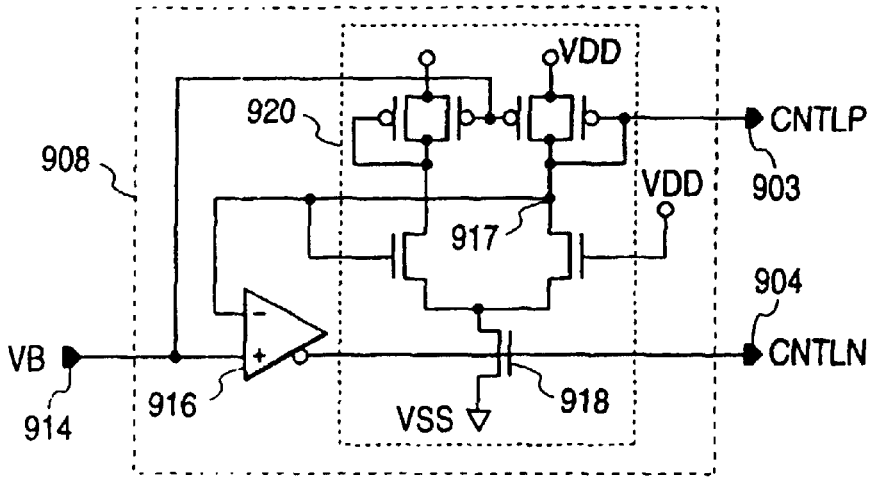
FIG. 11 is a circuit diagram showing one example of a bias circuit 908 included in the delay control circuit.

One example of the bias circuit 908 is shown in FIG. 11. The bias circuit 908 generates a signal CNTLN for controlling the MOS transistor Q7n of each differential delay stage 801 in the variable delay circuit 103 and a signal CNTLP for controlling the MOS transistors Q4p and Q5p from the voltage applied to the VB signal terminal 914. Delay times of the respective differential delay stages constituting the variable delay circuit 103 respectively result in time constants based on on resistances of the MOS transistors Q4p and Q5p and parasitic capacitance of an output unit. Since each differential delay stage changes in output resistance when the voltage of the phase comparison signal input terminal CNTLP is changed, the time constant, i.e., delay time based on the output resistance of each differential delay stage and the parasitic capacitance of the output unit can be controlled by changing the voltage of the signal CNTLP at the delay control signal terminal. That is, when the voltage of the signal CNTLP is reduced, the mutual conductance (gm) of each P channel MOS transistor increases and the output resistance (l/gd) is lowered. Since the time constant corresponds to the product of the output resistance and the parasitic capacitance of the output unit, it is reduced at this time and the delay time becomes short. On the other hand, when the voltage of the signal CNTLP is increased, the mutual conductance of the P channel MOS transistor Q decreases and the output resistance increases. At this time the time constant increases and the delay time becomes long.

Thus, when the phase of the internal clock signal lag, the voltage applied to the VB signal terminal 914 is lowered and the voltage of the signal CNTLP at the bias signal terminal 903 of each differential delay stage 801 in the variable delay circuit 103 is controlled so that the time constant based on the product of the output resistance of each differential delay stage 801 in the variable delay circuit 103 and the parasitic capacitance of the output unit is reduced to shorten the delay time. When the phase of the internal clock signal leads, the voltage of the signal CNTLP at the bias signal terminal 903 of each differential delay stage 801 in the variable delay circuit 103 is increased, and the time constant based on the product of the output resistance of each differential delay stage 801 in the variable delay circuit 103 and the parasitic capacitance of the output unit is made great, thereby controlling the delay time so as to become long. The bias circuit 908 has the same differential delay stage 920 as the differential delay stage 801. One input terminal of the differential delay stage 920 is connected to a source VDD high in voltage. Thus, a node 917 in the differential delay stage 920 corresponds to the output node of the differential delay node 801, and the voltage applied to the node 917 becomes equal to a low limit voltage of an output signal voltage. Owing to the operation of an op amplifier 916, such a current as to equalize the voltage at the node 917 and the voltage at the VB signal terminal 914 to each other flows through a MOS transistor 918 of the differential delay stage 920. A voltage outputted from the op amplifier 916 is outputted from the output terminal 904 as the signal CNTLN. Further, the voltage at the node 917, i.e., the same voltage as that for the VB signal inputted to the terminal 914 is outputted from the output terminal 903 as the signal CNTLP of the differential delay stage 920. In other words, the bias circuit 908 provides the voltage at the output terminal 904 corresponding to the signal CNTLN of the differential delay stage 801 in the variable delay circuit 103 so that the voltage of the signal VB at the terminal 914 reaches the low limit of the output voltage of the differential delay stage 801 in the variable delay circuit 103.

As described above, the circuit shown in FIG. 8 outputs the delay control signal 113 therefrom based on the phase comparison signal 901 in such a manner that when the phase of the internal clock signal leads that of the external clock signal, the delay time developed in the variable delay circuit 103 is lengthened and when the phase of the internal clock signal lags that of the external clock signal, the delay time developed in the variable delay circuit 103 is shortened.

Figure 12:
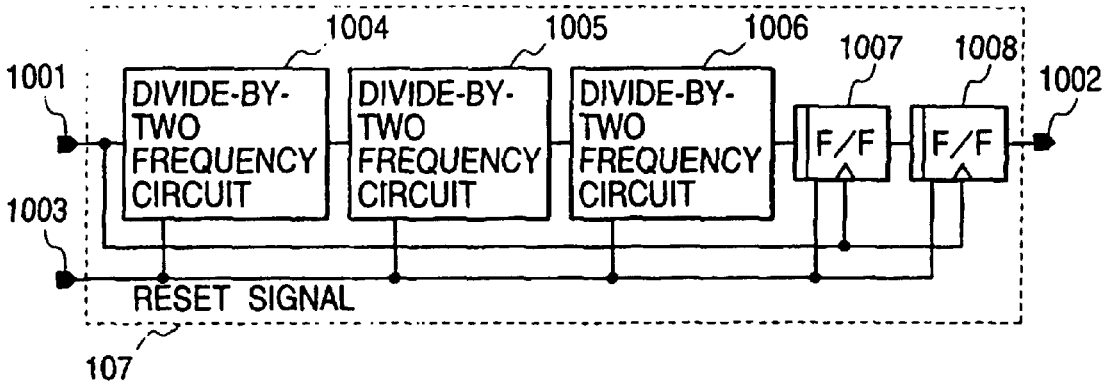
FIG. 12 is a block diagram depicting one example of a divide-by-eight frequency circuit 107.

One example of the divide-by-eight frequency circuit 107 is shown in FIG. 12. The divide-by-eight frequency circuit 107 comprises an input terminal 1001 for a clock signal, an input terminal 1003 for a reset signal RESET, a terminal 1002 for an output signal, three divide-by-two frequency circuits 1004, 1005 and 1006 connected in series, and two flip-flops 1007 and 1008 connected in series.

The operation of the divide-by-eight frequency circuit 107 will be described. The reset signal RESET is inputted to the input terminal 1003 for initialization. Thus, the first flip-flop 1007, the second flip-flop 1008 and the first through third divide-by-two frequency circuits 1004 through 1006 are initialized so that the output signal is brought to an "L" level. Now consider where the reset signal RESET is a positive pulse signal. Next, the clock signal is supplied to the clock signal input terminal 1001. The clock signal is inputted to the first divide-by-two frequency circuit 1004. The first divide-by-two frequency circuit 1004 divides the clock signal by two to thereby obtain a divided-by-two clock signal. Further, the second divide-by-two frequency circuit 1005 divides the clock signal by two to thereby obtain a divided-by-four clock signal. Furthermore, the third divide-by-two frequency circuit divides the clock signal by two to thereby produce a divided-by-eight clock signal. Thereafter, the divide-by-eight clock signal passes through the first flip-flop 1007 and the second flip-flop 1008 over two clock cycles and is outputted as an output signal from the output signal terminal 1002. The circuit shown in FIG. 12 is capable of outputting the divided-by-eight clock signal, which is delayed two clock cycles with respect to the input clock signal.

Figure 13:
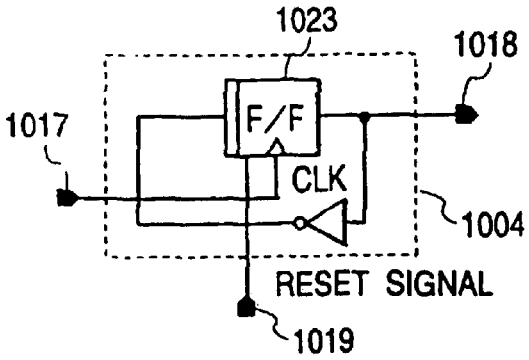
FIG. 13 is a logic circuit diagram showing one example of a divide-by-two frequency circuit 1004 included in the divide-by-eight frequency circuit.

One example of the divide-by-two frequency circuit 1004 is shown in FIG. 13. A flip-flop (F/F) 1023 is a D latch, which inverts the output at a terminal 1018 in synchronism with a change in the rising edge of a signal supplied from a terminal 1017. Other divide-by-two frequency circuits 1005 and 1006 also respectively have the configuration shown in FIG. 13.

Figure 14:
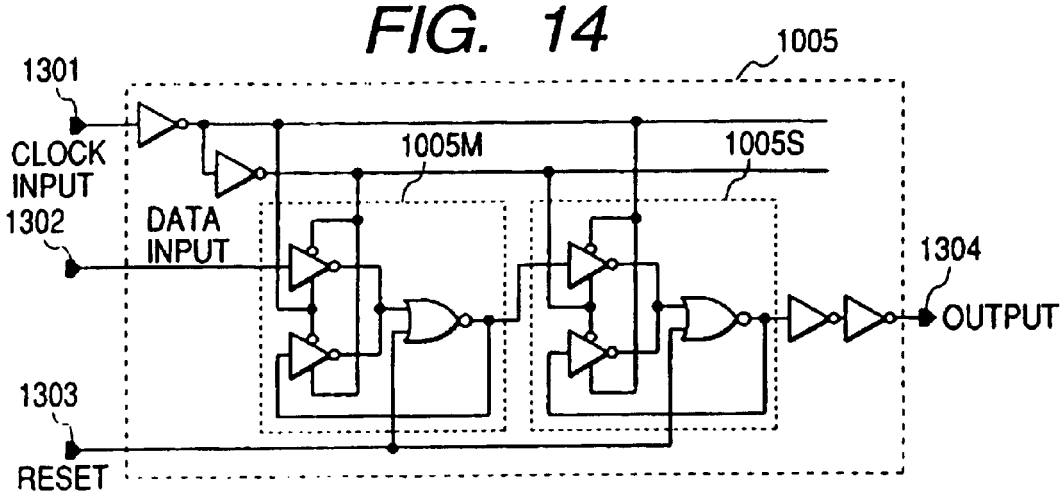
FIG. 14 is a logic circuit diagram illustrating one example of a flip-flop circuit 1023.

One example of the flip-flop 1023 shown in FIG. 13 is shown in FIG. 14. The flip-flop 1023 has a master stage 1005M and a slave stage 1005S.

Figure 15:
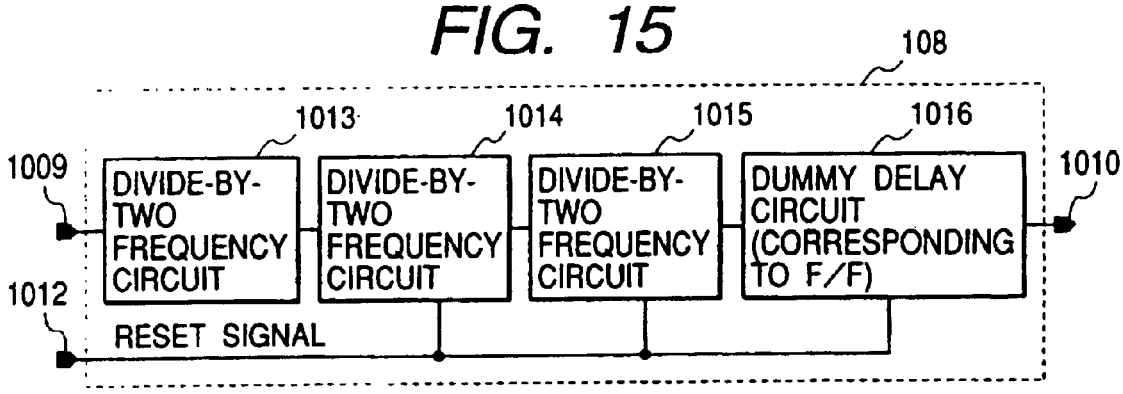
FIG. 15 is a block diagram depicting one example of a divide-by-eight frequency circuit 108.

One example of the divide-by-eight frequency circuit 108 is illustrated in FIG. 15. The divide-by-eight frequency circuit 108 comprises an input terminal 1009 for a clock signal IN8b, an input terminal 1012 for a reset signal RESET, a terminal 1010 for an output signal, three divide-by-two frequency circuits 1013, 1014 and 1015 arranged in series, and a dummy delay circuit 1016. The dummy delay circuit 1016 is a circuit for reproducing a delay time of the flip-flop 1008. The first through third divide-by-two frequency circuits 1013, 1014 and 1015 respectively have the same circuit configuration as the divide-by-two frequency circuit 1004 shown in FIG. 13.

Figure 16:
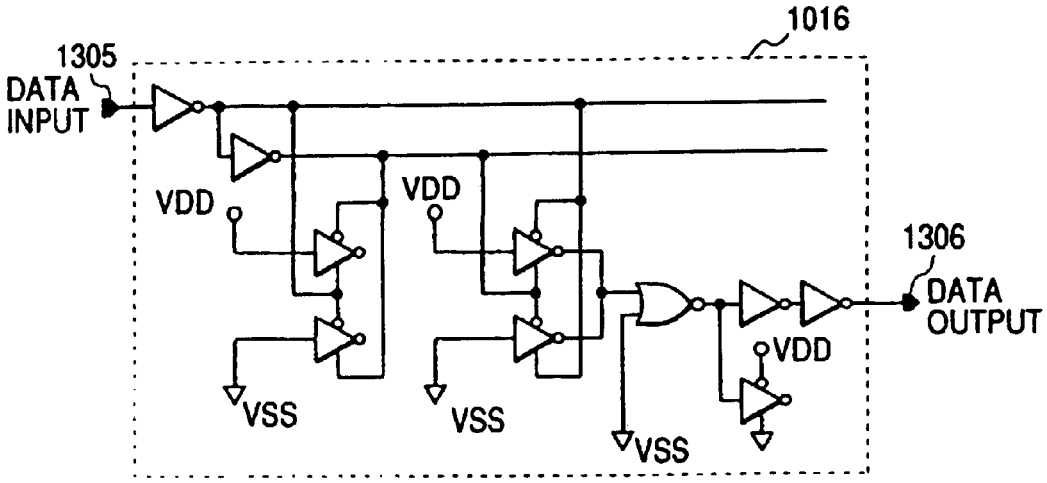
FIG. 16 is a logic circuit diagram showing one example of a dummy delay circuit 1016 for reproducing a delay time of a flip-flop circuit 1008.

One example of the dummy delay circuit 1016 for reproducing the delay time of the flip-flop 1008 is shown in FIG. 16. The circuit shown in the same drawing is one obtained by extracting a path extending from a clock signal input terminal 1301 of the flip-flop 1023 to an output signal terminal 1304 thereof while a load is being held as it is. The circuit reproduces the delay time of the flip-flop 1008.

The operation of the divide-by-eight frequency circuit 108 shown in FIG. 15 will be described. The reset signal RESET is inputted to the reset signal input terminal 1012 for initialization. Thus, the first through third divide-by-two frequency circuits 1013 through 1015 are initialized so that the output signal is brought to an "L" level. Let's now assume that the reset signal RESET is a positive pulse signal. Next, the clock signal is inputted to the clock signal input terminal 1009. In doing so, the input clock signal is divided by eight in the first through third divide-by-two frequency circuits 1013 through 1015 in a manner similar to the circuit shown in FIG. 12. Thereafter, the divided-by-eight clock signal passes through the dummy delay circuit 1016 for reproducing the delay time of the flip-flop 1008, so that a clock signal delayed by the delay time of the flip-flop 1008 is obtained, which in turn is outputted from the terminal 1010 as the output signal. Since the clock signal delayed by the delay time of the flip-flop 1008 is divided by eight by the same three divide-by-two frequency circuits as the circuits shown in FIG. 12, the delay time developed by the circuit shown in FIG. 15 becomes identical to the delay time developed by the circuit shown in FIG. 12, i.e., the divide-by-eight frequency circuit 107. As described above, the circuit shown in FIG. 15 outputs the divided-by-eight clock signal therefrom and hence the delay time thereof becomes identical to that developed in the divide-by-eight frequency circuit 107.

Figure 17:
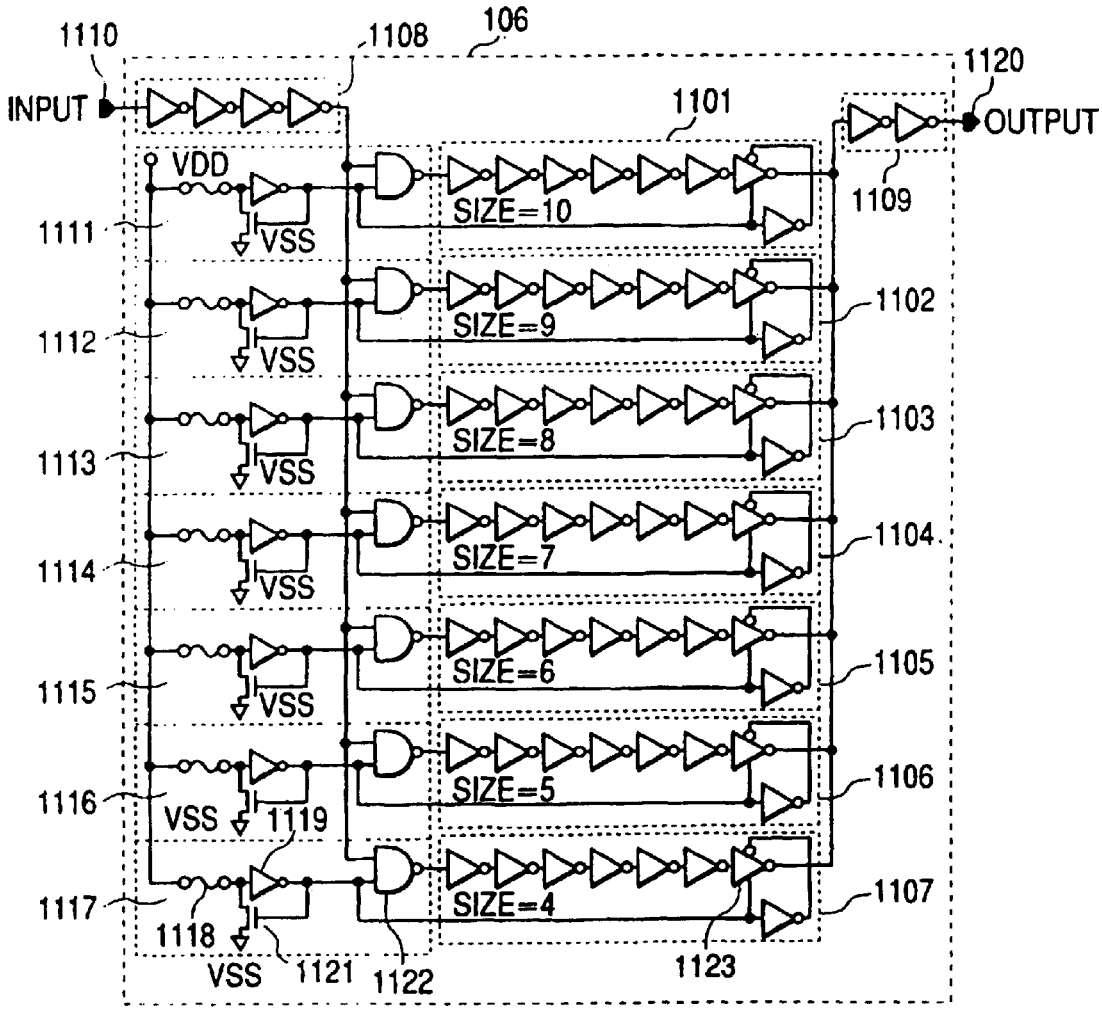
FIG. 17 is a logic circuit diagram illustrating one example of a dummy delay circuit 106.

One example of the dummy delay circuit 106 is illustrated in FIG. 17. The function of the dummy delay circuit 106 aims to reproduce the delay time tdrep developed in the input clock buffer, long wire and output data buffer. According to FIG. 17, the dummy delay circuit 106 is comprised principally of an input signal terminal 1110 for a signal, a terminal 1120 for an output signal, first through seventh delay circuits 1101 through 1107, first through seventh fuse circuits 1111 through 1117 corresponding to the first through seventh delay circuits 1101 through 1107, an eighth delay circuit 1108, and a buffer 1109.

The first through seventh delay circuits 1101 through 1107 are used to correct variations in delay time due to a variation in chip's process. A signal path employed in the present circuit passes from the input signal terminal 1110 to the eighth delay circuit 1108 and reaches the output signal terminal 1120 through the buffer 109. However, each of the first through seventh delay circuits 1101 through 1107 can be selected as a path formed between the eighth delay circuit 1108 and the buffer 1109. While the first through seventh delay circuits 1101 through 1107 are respectively comprised of series-stages of inverters. However, they are different from one another in constants of MOS circuits constituting the respective circuits (MOS transistor size) and different in delay time from one another. However, even if any of the first through seventh delay circuits 1101 through 1107 is selected, the delay time of the present circuit is designed to approach the delay time tdrep developed in the input clock buffer, long wire and output data buffer. Further, the difference in delay time between the respective adjacent first through seventh delay circuits 1101 through 1107 is kept small sufficiently. Therefore, such first through seventh delay circuits 1101 through 1107 that the delay time of the present circuit most approximates the delay time tdrep developed in the input clock buffer, long wire and output data buffer after the fabrication of a chip, are selected through the use of the first through seventh fuse circuits 111 through 1117 respectively. For example, the selection of the seventh delay circuit 1107 will be explained. Now consider where any fuses lying within the first through seventh fuse circuits 1111 through 1117 are not cut off or blown. Since, at this time, the inputs of inverters of the first through seventh fuse circuits 1111 through 1117 are an "H" level respectively, the outputs thereof are "L" in level. Thus, NAND circuits (NAND gates) 1122 in the first through seventh fuse circuits 1111 through 1117 and clocked inverters 1123 located in final stages of the first through seventh delay circuits 1101 through 1107 are respectively kept in a high output impedance state (off state). Thus, the input of the buffer 1109 is undefined. Next, the fuse 1118 lying within the seventh fuse circuit 1117 is cut off or blown. In doing so, the voltage inputted to the inverter 1119 provided within the seventh fuse circuit 1117 is reduced by leakage current flowing through a MOS transistor 1121 provided within the seventh fuse circuit 1117 so that the output voltage of the inverter 1119 is inverted to thereby reach an "H" level. Thus, the NAND circuit 1122 provided within the seventh fuse circuit 1117 and the final-stage clocked inverter 1123 provided within the seventh delay circuit 1107 are capable of output operation, so that the seventh delay circuit 1107 becomes effective as a signal path. Since the delay time of the circuit shown in FIG. 17 can be adjusted so as to approximate the delay time tdrep developed in the input clock buffer, long wire and output data buffer in the chip after the fabrication of the chip as described above, the present example is most suitable as for the dummy delay circuit 106 for reproducing the delay time tdrep developed in the input clock buffer, long wire and output data buffer.

Figure 18:
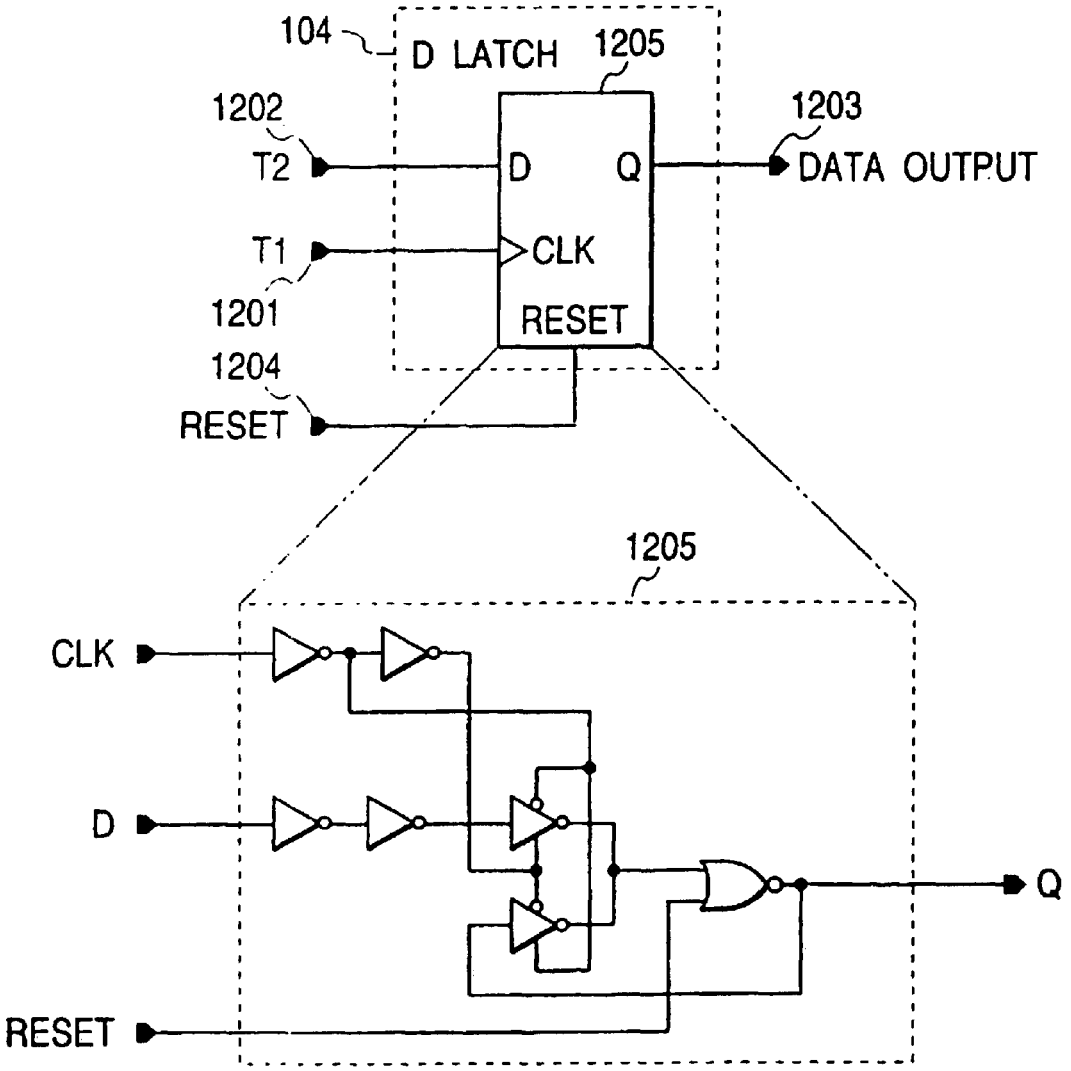
FIG. 18 is a logic circuit diagram depicting one example of a phase comparator 104.

One example of the phase comparator 104 is illustrated in FIG. 18. The function of the phase comparator 104 is to compare input two timing signals, output an "H" level if rise timing of the second timing signal leads that of the first timing signal, and output an "L" level if the rise timing thereof lags that of the first timing signal. According to FIG. 18, the phase comparator 104 comprises a terminal 1201 for inputting or receiving a first timing signal (T1), a terminal 1202 for inputting or receiving a second timing signal (T2), a terminal 1204 for inputting or receiving a reset signal RESET, an output terminal 1203, and a D latch 1205. Now, the terminal 1201 for receiving the first timing signal (T1) is electrically connected to its corresponding CLK signal input terminal of the D latch 1205. The terminal 1202 for receiving the second timing signal (T2) is electrically connected to its corresponding D signal input terminal of the D latch 1205. Further, the reset signal RESET input terminal 1204 is electrically connected to its corresponding RESET signal input terminal of the D latch 1205, whereas the output terminal 1203 is electrically connected to its corresponding Q signal output terminal of the D latch 1205.

The reset signal RESET is inputted to the phase comparator 104 shown in FIG. 18 to initialize the D latch 1205 prior to its operation. Thus, the Q output of the D latch 1205 is initially set to an "L" level. Next, the first and second timing signals T1 and T2 are inputted to the phase comparator 104. Here, the first timing signal (T1) is inputted to the CLK signal input terminal of the D latch 1205. Further, the second timing signal (T2) is inputted to the D signal input terminal of the D latch 1205. If the level of a D input signal is "H" with rise timing of a CLK input signal, then the D latch 1205 brings a Q output signal to an "H" level. Reversibly if the level of the D input signal is "L", then the D latch 1205 brings the Q output signal to an "L" level. Incidentally, the level of the Q output signal is maintained until the rise timing of the next CLK input signal. Therefore, if the rise timing of the second timing signal (T2) leads that of the first timing signal (T1), then the D signal has already risen when the CLK signal of the D latch 1205 has risen. Therefore, the D signal is brought to an "H" level and hence the H" level is outputted as a Q signal. Further, if the rise timing of the second timing signal (T2) lags that of the first timing signal (T1), then the D signal has not yet risen when the CLK signal of the D latch 1205 has risen. Therefore, the D signal is brought to an "L" level and hence the "L" level is outputted as a Q signal. As described above, the circuit shown in FIG. 18 compares the input two timing signals (T1 and T2) and performs phase comparison in such a form that if the rise timing of the second signal (T2) leads that of the first timing signal (T1), then the circuit outputs an "H" level therefrom, and if the rise timing of the second signal (T2) lags that of the first timing signal (T1), then the circuit outputs an "L" level therefrom.

According to the timing control circuit 114 constructed as described above, since the frequency-dividing circuit 108 is provided midway between the variable delay circuit and the dummy delay circuit, and the dummy delay circuit 106 is activated by each divided clock without increasing the variable delay circuit in number, low power can be implemented in a small area.

Figure 19:
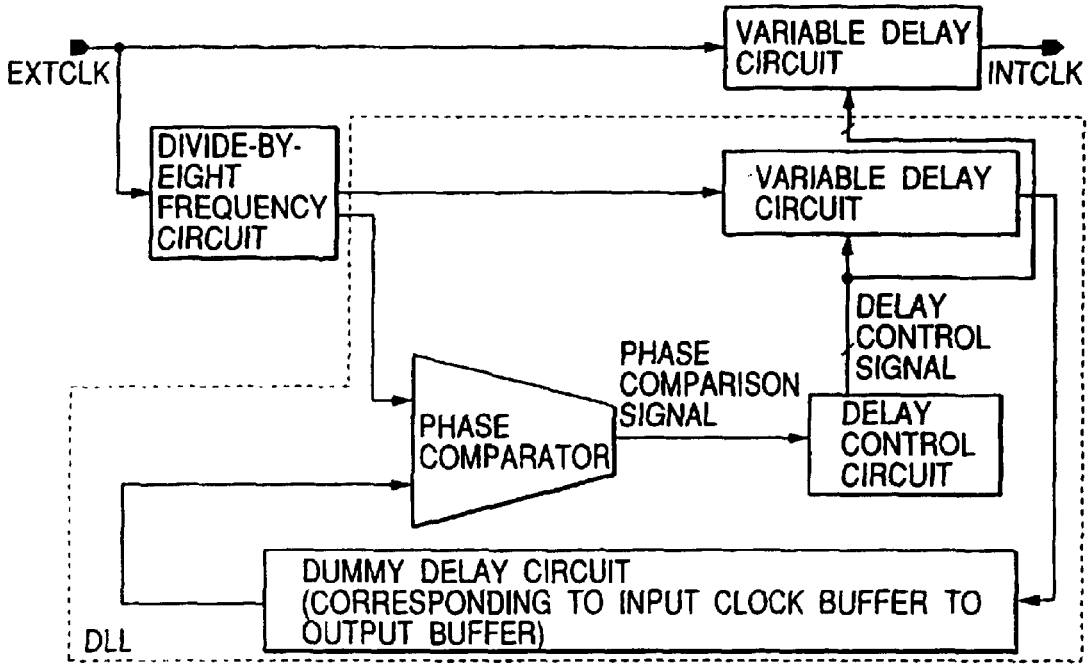
FIG. 19 is a block diagram of a timing control circuit, which is shown as a comparative example in which two variable delay circuits are used.
Figure 20:
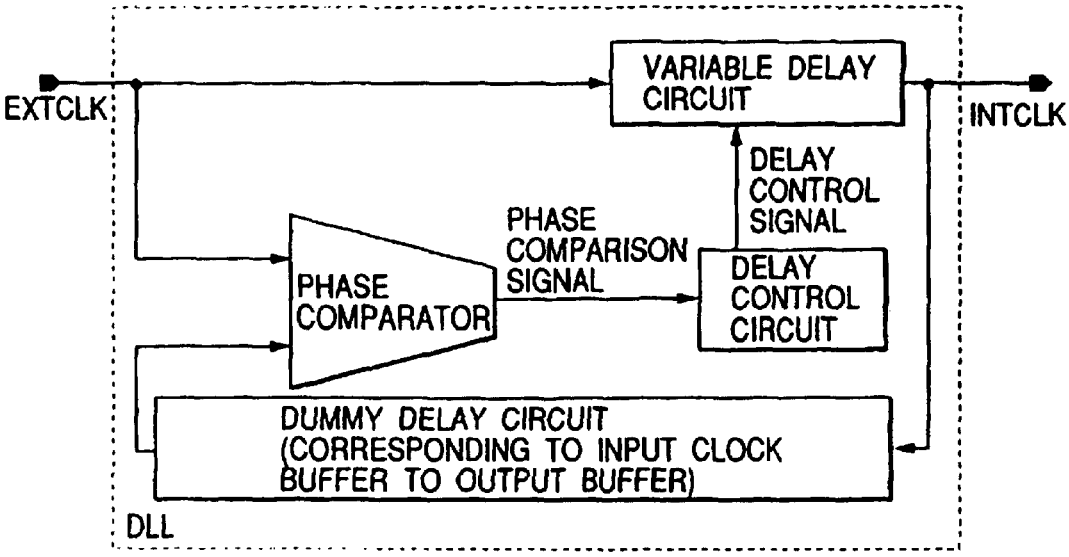
FIG. 20 is a block diagram of a timing control circuit, which is shown as a comparative example in which no speed control is done in a delay loop.

The above-described area reducing effect will be verified in further details. When a delay increment or step is defined as 100 ps and the maximum delay time is defined as 20 ns in each variable delay circuit of a timing control circuit using such two variable delay circuits as illustrated in FIG. 19 by way of example, the number of delay stages needs 200. If the area of one delay stage is now estimated assuming that one delay stage is supposed to have areas corresponding to five inverters, the 100ΣWL=19.2 um^2. Symbol ^2 means the square. Thus, the area of each variable delay circuit corresponds to 200 delay stages and reaches even 100ΣWL=384000 um=0.38 mm^2. Assuming that the area other than that of each variable delay circuit is defined as 0.15 mm^2 as for a DLL circuit, the area of the timing control circuit results in 2×0.38+0.15=0.91 mm^2 in the case of the configuration of the timing control circuit shown in FIG. 19. In the case of the timing control circuit shown in FIG. 1, the area thereof reaches 1×0.38+0.15=0.53 mm^2, whereby it can be reduced to about 60%. If the division ratio of each frequency-dividing circuit is defined as n, then power consumption can be estimated to be equivalent to or less than or equal to that for the configuration of FIG. 19 or to be 1/n of that for the configuration of FIG. 20.

<<Phase Comparison Signal Step-signalizing Timing Control Circuit>>

Figure 21:
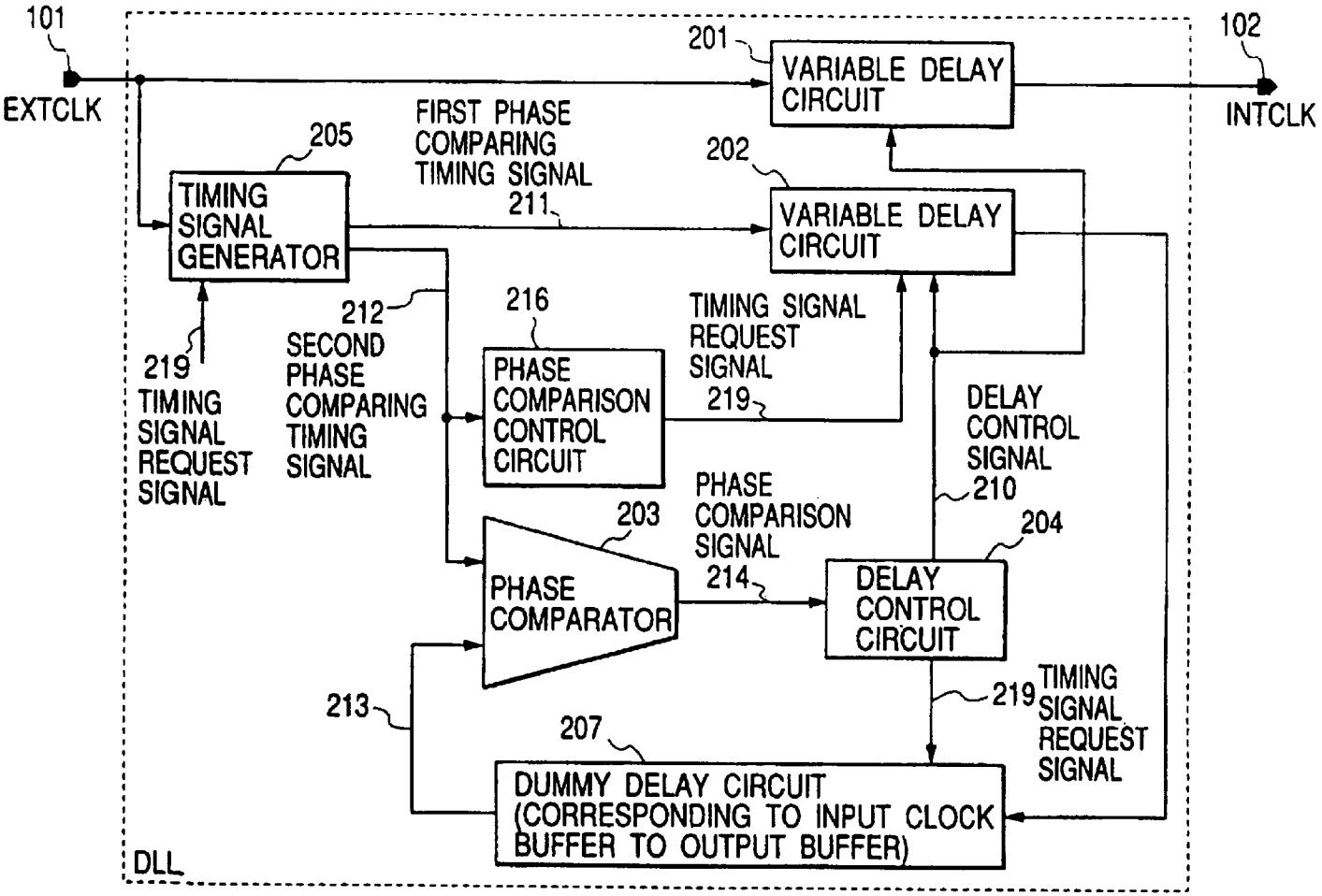
FIG. 21 is a block diagram showing one example of a timing control circuit in which a phase comparison signal is represented in the form of a step signal.

One example of a timing control circuit for bringing a phase comparison signal into step signal form is shown in FIG. 21 as a timing control circuit 501.

The timing control circuit shown in FIG. 21 has a second variable delay circuit 202 having a circuit configuration identical to that of a first variable delay circuit 201 in addition to the first variable delay circuit 201 for receiving a clock signal EXTCLK (first internal clock signal) supplied from a terminal 101 and outputting a clock signal INTCLK (second internal clock signal) from a terminal. A dummy delay circuit 207 for reproducing a signal (first signal) outputted from the second variable delay circuit 202 and adding a predetermined delay time to the output signal is provided. A phase comparator (phase determination circuit) 203 for determining the phase of a signal outputted from the dummy delay circuit 207 on the basis of phase determining timing is provided. A delay control circuit 204 feedback-controls delay times of the first variable delay circuit 201 and the second variable delay circuit 202 without discrimination, based on the result of determination by the phase comparator 203. A timing signal generator 205 is provided which every a plurality of cycles of the clock signal EXTCLK, supplies a phase determining level signal (first phase comparing timing signal) 211 to the variable delay circuit 202 and supplies a second phase comparing timing signal 212 (third clock) for providing phase determining timing for the phase determining level signal fed back to the phase determination circuit 203 to the phase comparator 203. A phase comparison control circuit (reset control circuit) 216 resets the outputs of the delay circuit and dummy delay circuit to their corresponding initial levels respectively after the phase determining timing. This reset is done according to a timing signal request signal 219 (fourth clock).

The clock signal EXTCLK is inputted from the clock terminal 101. Further, the clock signal is sent to the first variable delay circuit 201 and additionally transmitted even to the timing signal generator 205. The timing signal generator 205 generates the first phase comparing timing signal 211 and the second phase comparing timing signal 212. Let's now consider where the first phase comparing timing signal 211 and the second phase comparing timing signal 212 are respectively signals having step waveforms, each of which indicates timing on one rising or falling edge, and the second phase comparing timing signal 212 is delayed m clock cycles with respect to the first phase comparing timing signal 211. Next, the first phase comparing timing signal 211 is sent to the second variable delay signal 202 and the second phase comparing timing signal 212 is sent to the phase comparator 203. The delay time of the first phase comparing timing signal 211 sent to the second variable delay circuit 202 is controlled based on a delay control signal 210 outputted from the delay control circuit 204 in a manner similar to the delay time developed in the first variable delay circuit 201. The first phase comparing timing signal 211 passes through the second variable delay circuit 202 and thereafter passes through the dummy delay circuit 207 so as to enter the phase comparator 203. Next, the phase comparator 203 compares timing for the second phase comparing timing signal 212 and that for a phase comparing timing signal 213 (second signal) obtained by allowing the first phase comparing timing signal 211 to pass through the second variable delay circuit 202 and the dummy delay circuit 207. The result of comparison by the phase comparator 203 is outputted to the delay control circuit 204 as a phase comparison signal 214. The delay control circuit 204 outputs a delay control signal 210 in such a manner that when the phase comparing timing signal 213 obtained by allowing the first phase comparing timing signal 211 to pass through the second variable delay circuit 202 and the dummy delay circuit 207 lags the second phase comparing timing signal 212, it shortens the delay times developed in the first and second variable delay circuits 201 and 202 and when the phase comparing timing signal 213 leads the second phase comparing timing signal 212 in reverse, it lengthens the delay times developed therein, thereby controlling the delay times of the first and second variable delay circuits 201 and 202.

In response to the second phase comparing timing signal 212, the phase comparison control circuit 216 outputs a timing signal request signal 219 for making a request to the timing signal generator 205 for the generation of new first and second phase comparing timing signals 211 and 212. Next, when the variable delay circuit 202 and the dummy delay circuit 207, which form a delay loop, obtain the timing signal request signals 219 respectively, they reset their outputs to an "L" level and thereby erase the internally-remaining phase comparing timing signals. When the timing signal generator 205 obtains the timing signal request signal 219, it generates new first and second phase comparing timing signals 211 and 212 in synchronism with the rising edge of the next external clock.

Owing to the repetition of the above phase comparison control over m+1 clock cycles, the timing for the phase comparing timing signal 213 obtained by allowing the first phase comparing timing signal to pass through the second variable delay circuit 202 and the dummy delay circuit 207 can be matched with that for the second phase comparing timing signal 212, whereby the internal clock signal INTCLK delayed m×tck−tdrep with respect to the clock signal EXTCLK inputted to the terminal 101 can be obtained at the terminal 102. Incidentally, the timing signal request signal 219 will be defined as a signal having a positive pulse waveform.

Figure 22:
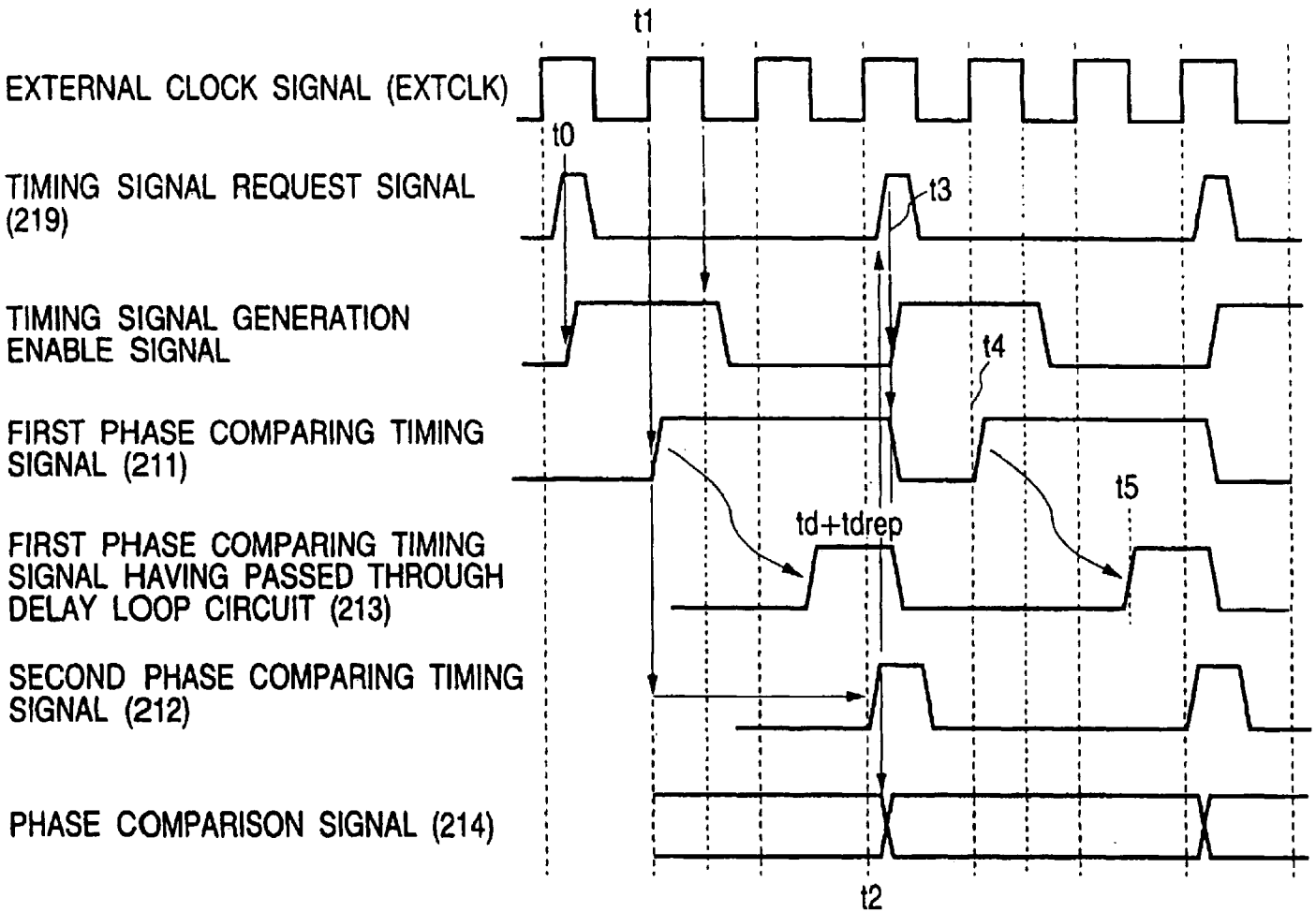
FIG. 22 is a timing chart illustrating phase lock operating timings provided by the timing control circuit of FIG. 21 by way example.

Phase lock operating timings provided by the timing control circuit shown in FIG. 21 are illustrated in FIG. 22 by way of example. A timing signal generation enable signal shown in FIG. 22 is an internal signal of the timing signal generator 205, which is in synchronism with the timing signal request signal 219. When the timing signal request signal 219 is generated at a time t0, the timing signal generator 205 changes the first phase comparing timing signal 211 to a high level in synchronism with the rising edge of the clock signal EXTCLK immediately following its generation (time t1). The first phase comparing timing signal 211 propagates through the variable delay circuit 202 and the dummy delay circuit 207 and reaches the phase comparator 203 as the signal 213. At this time, the timing signal generator 205 pulse-changes the second phase comparing timing signal 212 for a predetermined period since the two cycles of the clock signal EXTCLK have elapsed from a change in the first phase comparing timing signal 211 (time t2). The phase comparator 203 latches the level of the second phase comparing timing signal 212 for a period during which the second phase comparing timing signal 212 is high in level, and outputs it as the phase comparison signal 214. The second phase comparing timing signal 212 is supplied even to the phase comparison control circuit 216, which in turn asserts the timing signal request signal 219 in synchronism with the high level of the second phase comparing timing signal 212. The timing signal request signal 219 is supplied even to the variable delay circuit 202 and the dummy delay circuit 207 as well as to the timing signal generator 205 and hence the outputs of their circuits 202 and 207 are respectively reset to "L" (time t3). Accordingly, the first phase comparing timing signal 211 next rises (time t4) and the corresponding signal 213 can be maintained at "L" until the first phase comparing timing signal 211 is propagated as the signal 213. As in the case where the clock signals are compared in phase, such misdecisions or misjudgments that the excessively early phase is determined to be late in reverse and the excessively late phase is determined to be early in reverse, can be prevented from occurring.

The circuit described in FIG. 18 by way of example can be employed for the phase comparator 216 shown in FIG. 21.

Figure 23:
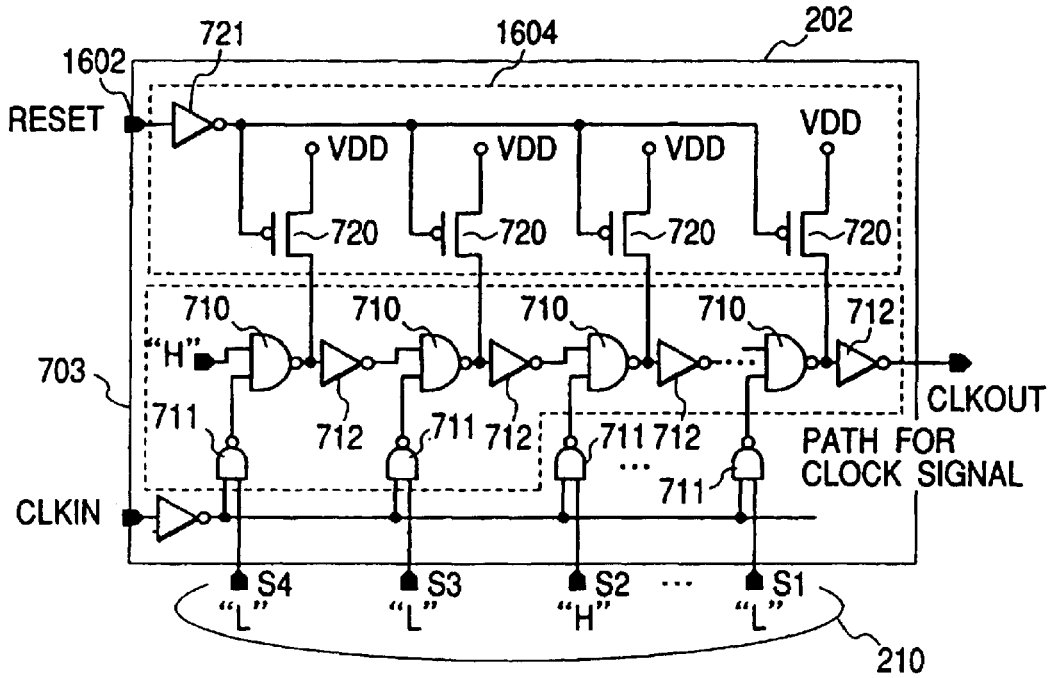
FIG. 23 is a logic circuit diagram showing one example of a variable delay circuit 202 with a reset function.

One example of a variable delay circuit 202 with a reset function is illustrated in FIG. 23. The function of the variable delay circuit 202 is to output an input signal with a delay of a predetermined time according to delay control signals 210 and erase the internally-remaining phase comparing timing signal in response to a timing signal request signal 219.

The variable delay circuit 202 is comprised of a variable delay stage 703 to which a reset circuit 1604 is added. The variable delay stage 703 comprises delay stages connected in series in multistage form, each of which is comprised of two two-input NAND gates 710 and 711 and an inverter 712. One of the signals (S1 through S4) represented in a plurality of bits is set to "H" so as to allow a clock signal CLKIN to pass through with the delay stage receiving the corresponding signal of "H" as a base point. Thus, the control of the delay stages for allowing the signal CLKIN to pass through makes it possible to change the delay of the signal, i.e., the phase thereof.

The reset circuit 1604 is a circuit for resetting an output CLKOUT to an "L" level and thereby erasing the internally-remaining phase comparing timing signal. The reset circuit 1604 has p channel switch MOS transistors 720 between the outputs of the NAND gates 710 of the respective delay stages and source terminals VDD and are configured such that the gates of the MOS transistors 720 are controlled based on an inverted signal of a reset signal RESET. When all the MOS transistors 720 are turned on, the inputs of the inverters 712 in all the delay stages are respectively brought to "H" of the source voltage VDD. Thus, when a timing signal request signal 219 having a positive pulse waveform is inputted to the reset terminal 1602 as the reset signal, the gates of the MOS transistors 720 are brought to "L" through the inverter 721 and hence the outputs of all the delay stages are reset to "L".

One identical to the variable delay circuit 202 may be used as the variable delay circuit 201. However, since no resetting is required, the reset signal input terminal 1602 may be pulled down to a ground voltage VSS so as to be fixed to the "L" level.

Although not shown in the drawing in particular, the delay control circuit 204 shown in FIG. 21 can comprise a pulse generator like the pulse generator 905 described in FIG. 9, which produces or forms UP and DOWN signals in response to a phase comparison signal 214, an up-down counter for performing up and down counts in response to the UP and DOWN signals outputted from the pulse generator, and a decoder for decoding the output of the up-down counter to thereby form the signals 210 (S1 through S4). The decoder decodes the count of the up-down counter and sets any of the signals S1 through S4 to "H".

Figure 24:
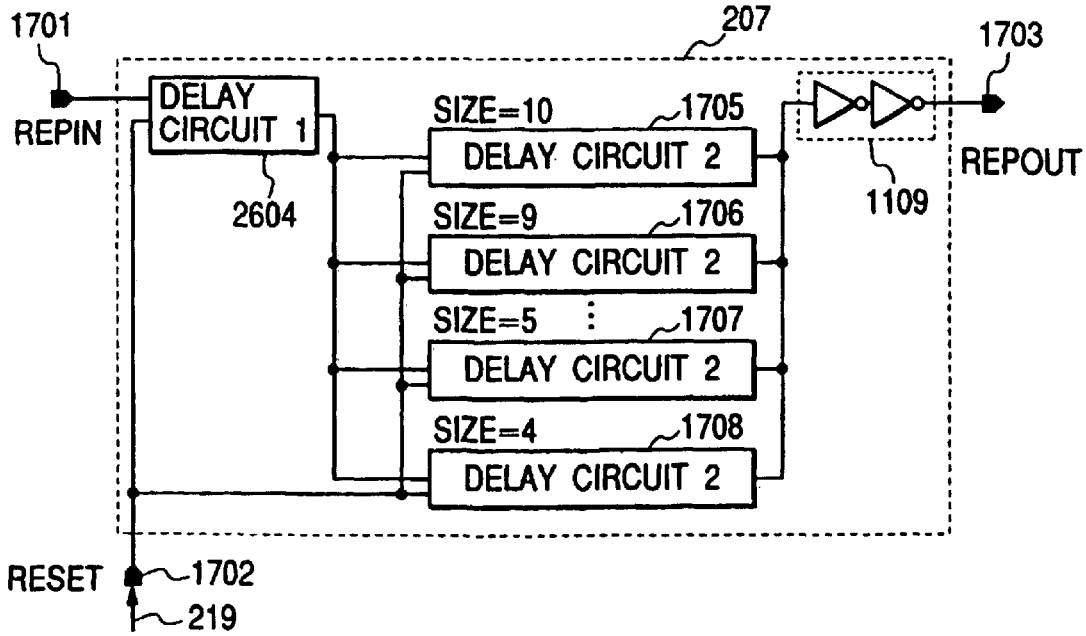
FIG. 24 is a logic circuit diagram depicting one example of a dummy delay circuit 207.
Figure 25:
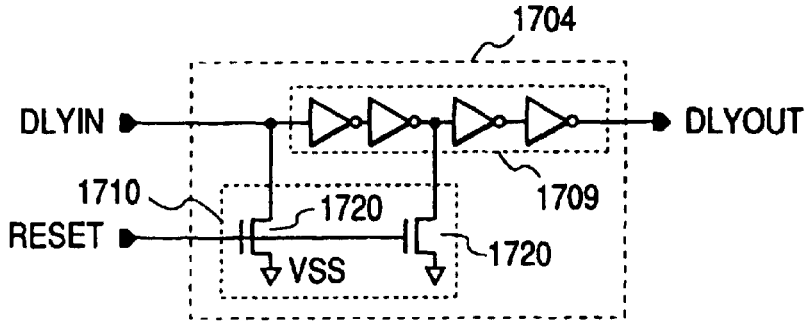
FIG. 25 is a logic circuit diagram showing a specific example of a delay circuit 1704.
Figure 26:
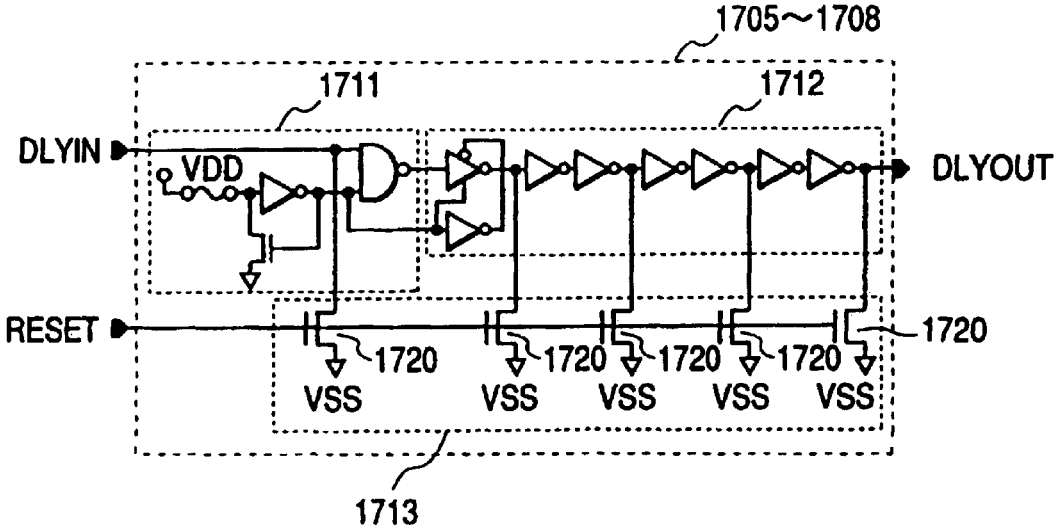
FIG. 26 is a logic circuit diagram illustrating specific examples of delay circuits 1705 through 1708.

One example of the dummy delay circuit 207 is shown in FIG. 24. The dummy delay circuit 207 provides the function of reproducing a delay time tdrep developed in an input clock buffer, a long wire and an output data buffer and erasing the internally-remaining phase comparing timing signal in response to a timing signal request signal 219. The dummy delay circuit 207 shown in FIG. 24 is similar to the dummy delay circuit 106 shown in FIG. 17 in a basic circuit configuration and has a plurality of delay circuits 1705 through 1708, a delay circuit 2604 provided in common at a stage preceding the delay circuits 1705 through 1708, and a delay circuit 1109 provided in common at a stage posterior to the delay circuits 1705 through 1708. A specific example of the delay circuit 1704 is shown in FIG. 25, and a specific example of each of the delay circuits 1705 through 1708 is shown in FIG. 26. The delay circuits shown in FIGS. 25 and 26 are different from the delay circuits in the dummy delay circuit 106 shown in FIG. 17 in that n channel reset MOS transistors 1720 electrically connected to a ground voltage VSS in each circuit are added to odd-numbered inputs in series-connected inverters constituting these delay circuits.

That is, a reset switch circuit comprised of MOS transistors 1720 is formed within the delay circuit 1704 of the dummy delay circuit 207 of FIG. 24 corresponding to the delay circuit 1108 of the dummy delay circuit 106 shown in FIG. 11 as shown in FIG. 25 by way of example. As shown in FIG. 26 by way of example, a switch 1713 comprised of the MOS transistors 1720 is provided within the delay circuit 1705 of the dummy delay circuit 207 of FIG. 24 corresponding to each of the fuse circuit 111 and delay circuit 1101 of the dummy delay circuit 106 shown in FIG. 17. The drain electrodes of the MOS transistors 1720 are electrically connected to their corresponding input terminals of odd-numbered inverters in the delay circuit, and the source electrodes thereof are electrically connected to the circuit's ground voltage VSS. In response to a positive pulse signal of a timing signal request signal 219 inputted from a reset signal input terminal 1702, the corresponding delay circuit is turned on during a period of a pulse width thereof, whereby the odd-numbered inputs in the delay circuit are respectively brought to an "L" level. Thus, each timing signal, which remains inside the circuit shown in FIG. 24, is erased, i.e., initialized.

Figure 27:
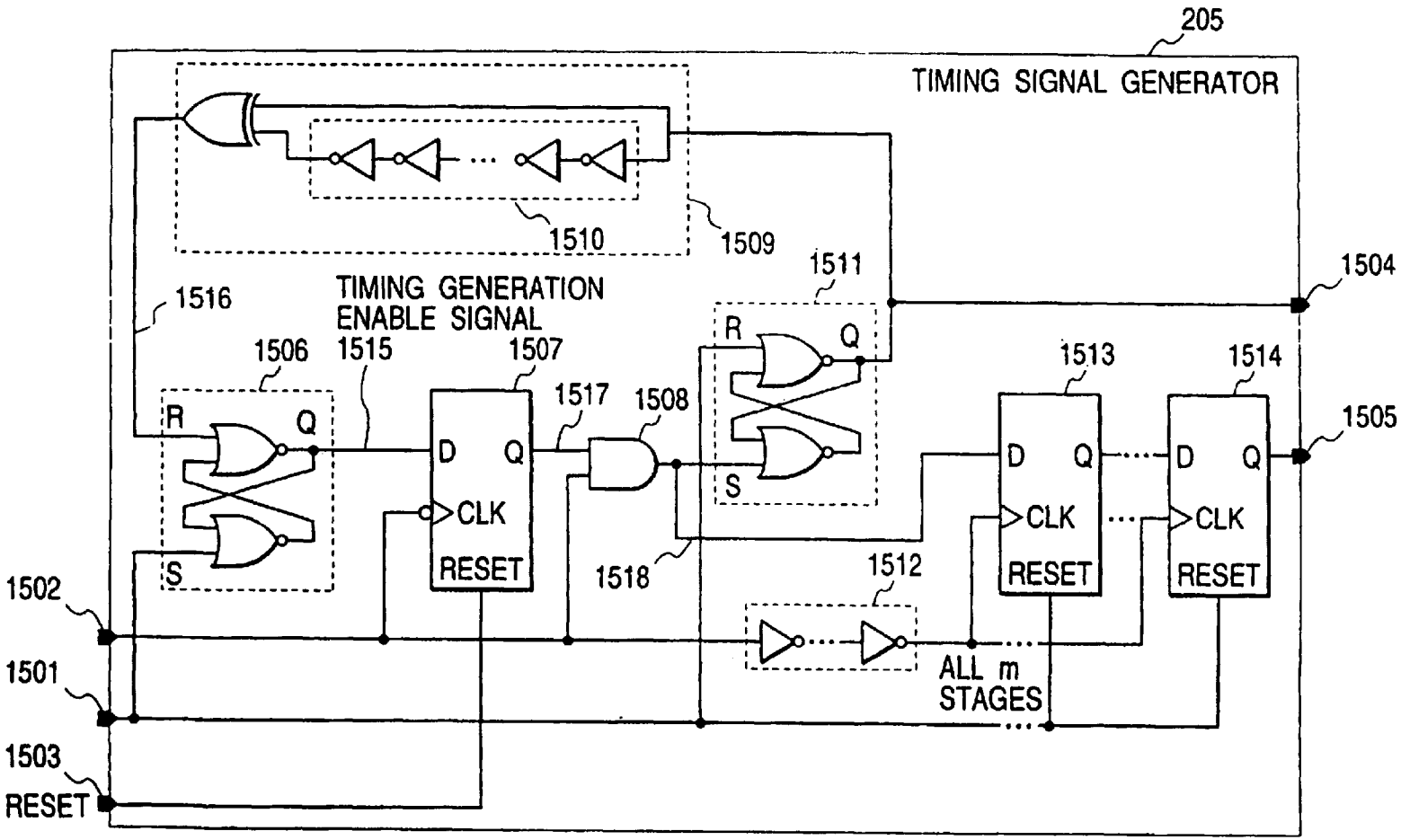
FIG. 27 is a logic circuit diagram depicting a detailed example of a timing signal generator 205.

A detailed example of the timing signal generator 205 is shown in FIG. 27. The timing signal generator 205 generates a first phase comparing timing signal 211 and a second phase comparing timing signal 212 in response to a timing signal request signal 219. Here, the first and second phase comparing timing signals 211 and 212 are respectively signals represented in the form of step waveforms, each of which is indicative of timing on one rising edge or falling edge. The second phase comparing timing signal 212 needs to be delayed m clock cycles with respect to the first phase comparing timing signal 211. Here, m indicates an integer greater than 1.

Referring to FIG. 27, the timing signal generator 205 comprises a terminal 1501 for inputting or receiving the timing signal request signal 219, a terminal 1502 for receiving or inputting a clock signal, a terminal 1503 for receiving or inputting a reset signal for the circuit, a terminal 1504 for outputting the first phase comparing timing signal 211, a terminal 1505 for outputting the second phase comparing timing signal 212, a first RS latch 1506 comprised of NOR gates, a D flip-flop 1507 for producing an output on the falling edge of the clock, an AND gate 1508, a pulse generator 1509, a second RS latch 1511, a delay circuit 1512, and m-stage D flip-flops 1513 and 1514.

Figure 28:
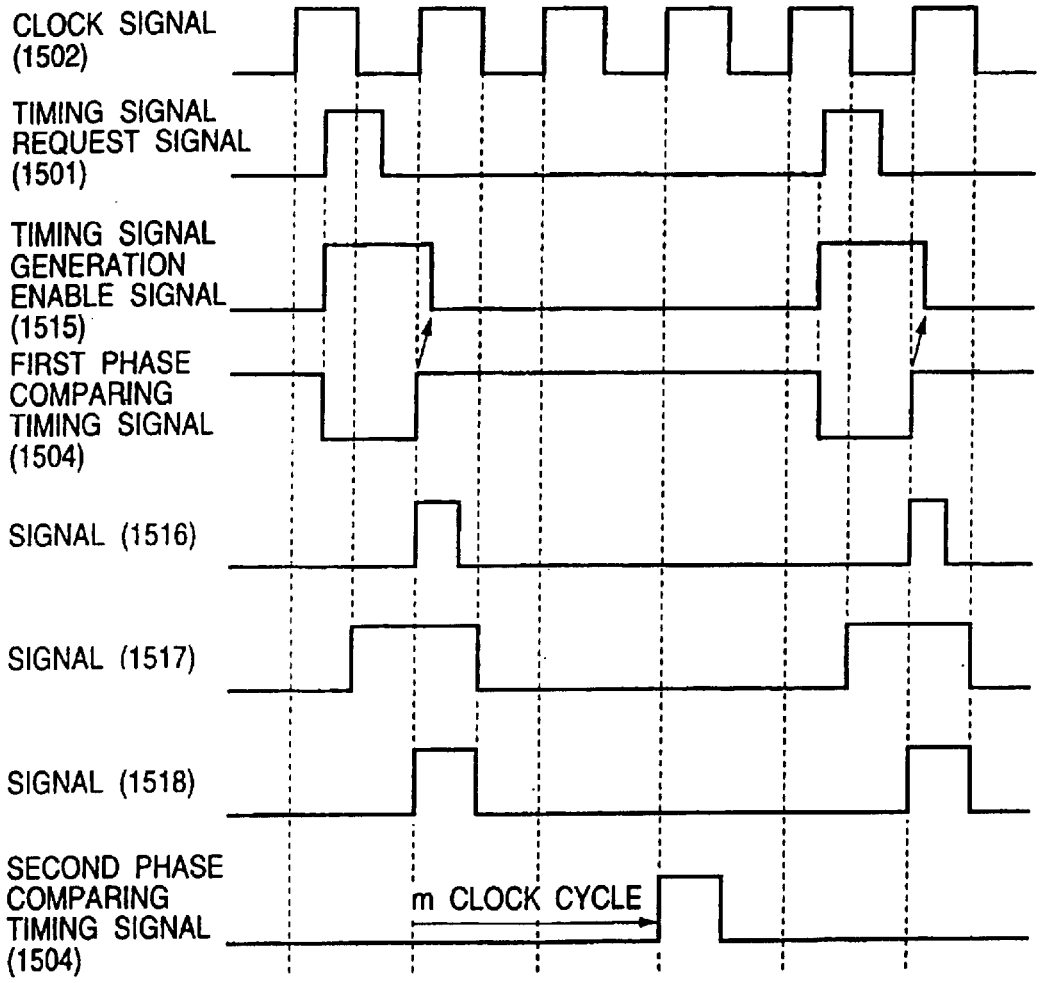
FIG. 28 is a timing chart showing operating timings provided by the timing signal generator 205 by way example.

Operating timings of the timing signal generator 205 are illustrated in FIG. 28 by way of example. The operation of the timing signal generator 205 will be explained with reference to it.

Prior to the operation of the timing signal generator 205, a reset signal having a positive pulse waveform is supplied to the reset signal input terminal 1503. Thus, the D flip-flop 1507 is initialized. Next, a timing signal request signal 219 having a positive pulse waveform is supplied to the terminal 1501. In doing so, the second RS latch 1511 and m-stage D flip-flops 1513 and 1514 are initialized so that the outputs of the respective stages are brought to an "L" level respectively. At this time, the first RS latch 1506 is set so that a signal 1515 outputted therefrom is brought to an "H" level. On the other hand, a clock signal is supplied to the terminal 1502. The D flip-flop 1507 outputs the output data of the first RS latch 1506 with the fall timing of the clock. The present signal 1515 is a timing signal generation enable signal for permitting the generation of a timing signal. The signal 1515 is inputted to the AND circuit 1508. Next, the AND gate 1509 outputs an "H" level on the rise timing of the clock when the timing signal generation enable signal 1515 is "H" in level, and outputs an "L" level on the rise timing thereof when the timing signal generation enable signal 1515 is "L" in level. In doing so, an "H" level appears at the output of the second RS latch 1511 when the timing signal generation enable signal 1515 is "H" in level and hence a rise step waveform is outputted from the second RS latch 1511. This step waveform appears at the terminal 1504, which is used as a first phase comparing timing signal. At this time, the first phase comparing timing signal is inputted even to the pulse generator 1509, which generates a pulse signal having a pulse width determined according to a delay time developed in a delay circuit 1510 provided within the pulse generator 1509. This pulse signal is inputted to a reset terminal R of the first RS latch 1506 to thereby bring the timing signal generation enable signal to an "L" level on the fall timing of the next clock.

Incidentally, the first phase comparing timing signal 211 having the step waveform, which has been outputted from the second RS latch 1511, passes through the delay circuit 1512, followed by inputting to the m-stage D flip-flops 1513 and 1514, which in turn appears at the terminal 1505 after the elapse of m clock cycles. This results in the second phase comparing timing signal 212. Incidentally, the delay of the delay circuit 1512 is done to prevent a hazard from occurring in the output of the D flip-flop 1513 when a signal change timing at the input unit of the D flip-flop 1513 and the rise timing of the clock signal approach each other. This aims to separate the signal change timing at the input unit of the D flip-flop 1513 from the rise timing of the clock signal.

Figure 29:
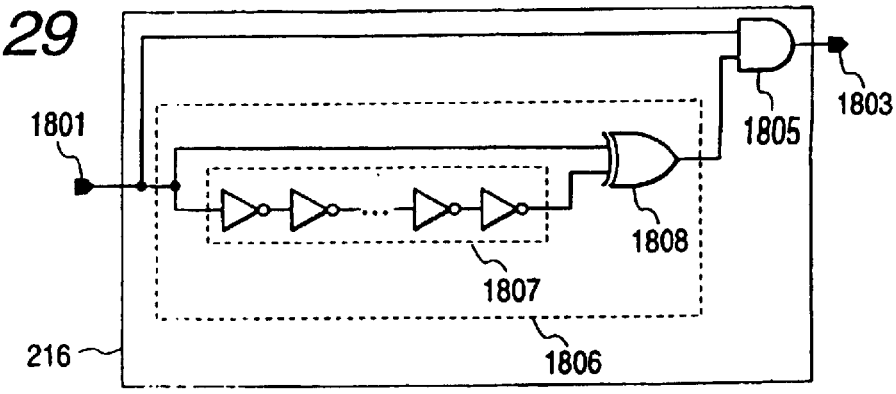
FIG. 29 is a logic circuit diagram depicting a phase comparison control circuit 216 as an illustrative example.

One example of the phase comparison control circuit 216 is shown in FIG. 29. The phase comparison control circuit 216 generates a timing signal request signal 219, based on the second phase comparing timing signal 212.

Referring to FIG. 29, the phase comparison control circuit 216 comprises a terminal 1801 for inputting or receiving the second phase comparing timing signal 212, a terminal 1803 for outputting the timing signal request signal 219, an AND gate 1805, and a pulse generator 1806. Here, the pulse generator 1806 is made up of a delay circuit 1807 and an exclusive OR (EXOR) gate 1808 and generates a positive pulse signal with respect to a change in input signal. Further, the delay circuit 1807 is comprised of multistage type even-number stage connections of inverters and outputs the input signal with a delay of a predetermined time.

The operation of the phase comparison control circuit 216 will next be described. When a second phase comparing timing signal 212 having a rise step waveform is first inputted to the terminal 1801, the signal enters the pulse generator 1806 from which a signal having a positive pulse waveform is outputted. Incidentally, the pulse generator 1806 outputs a signal having a positive pulse waveform even when a fall step waveform is outputted to the terminal 1801. Next, the positive pulse signal outputted from the pulse generator 1806 is inputted to one input terminal of the AND gate 1805. At this time, the other input terminal of the AND gate 1805 is supplied with the second phase comparing timing signal 212. Thus, the signal having the positive pulse waveform is outputted to the terminal 1803 only when the second phase comparing timing signal 212 is represented as the rise step waveform. Further, the pulse signal outputted from the pulse generator 1806, which appears when the second phase comparing timing signal 212 is of the fall step waveform, is cut off by the AND gate 1805 and thereby not outputted therefrom. That is, when the second phase comparing timing signal 212 having the rise step waveform is inputted, the signal having the positive pulse waveform is outputted from the terminal 1803. This results in a timing signal request signal 219.

While the timing control circuit shown in FIG. 21, which has been described above, is explained with the DLL circuit as the main, this is not intended for execution of phase comparison at predetermined timing intervals based on frequency-divided clocks as in the prior art. The timing control circuit is provided with a mechanism for monitoring internal states such as the operation of determination by a phase comparator, the attainment of a phase comparing timing signal to the phase comparator. When the completion of a phase comparing operation is detected, it immediately starts to perform the next phase comparison. It is thus possible to reduce intervals for timing provided to perform the phase comparison and timing provided to control a delay time of a variable delay circuit, to the minimum. In other words, lock-in can be completed immediately.

The effect of shortening a lock-in time by the timing control circuit shown in FIG. 21 will be estimated. When a delay time developed within a loop of DLL is defined as m clock cycles (where m: integer of m>1), the time required to perform one phase comparison is given as n clock cycles (where n: natural numbers which satisfy the equation 1) in the configuration of the conventional example 2, whereas the time is taken as m+1 cycles in the configuration shown in FIG. 21. Therefore, the lock-in time results in (m+1)/n times. Assuming that, for example, m=2 and the clock frequency is given as 200 MHz as described in the section of the conventional problems, n>6 according to the equation 1 and hence the lock-in time can be estimated to be reduced to ½ with respect to the conventional example 2.

<<Speed Control on Delay Loop and Step Signalization of Phase Comparison Signal>>

Figure 30:
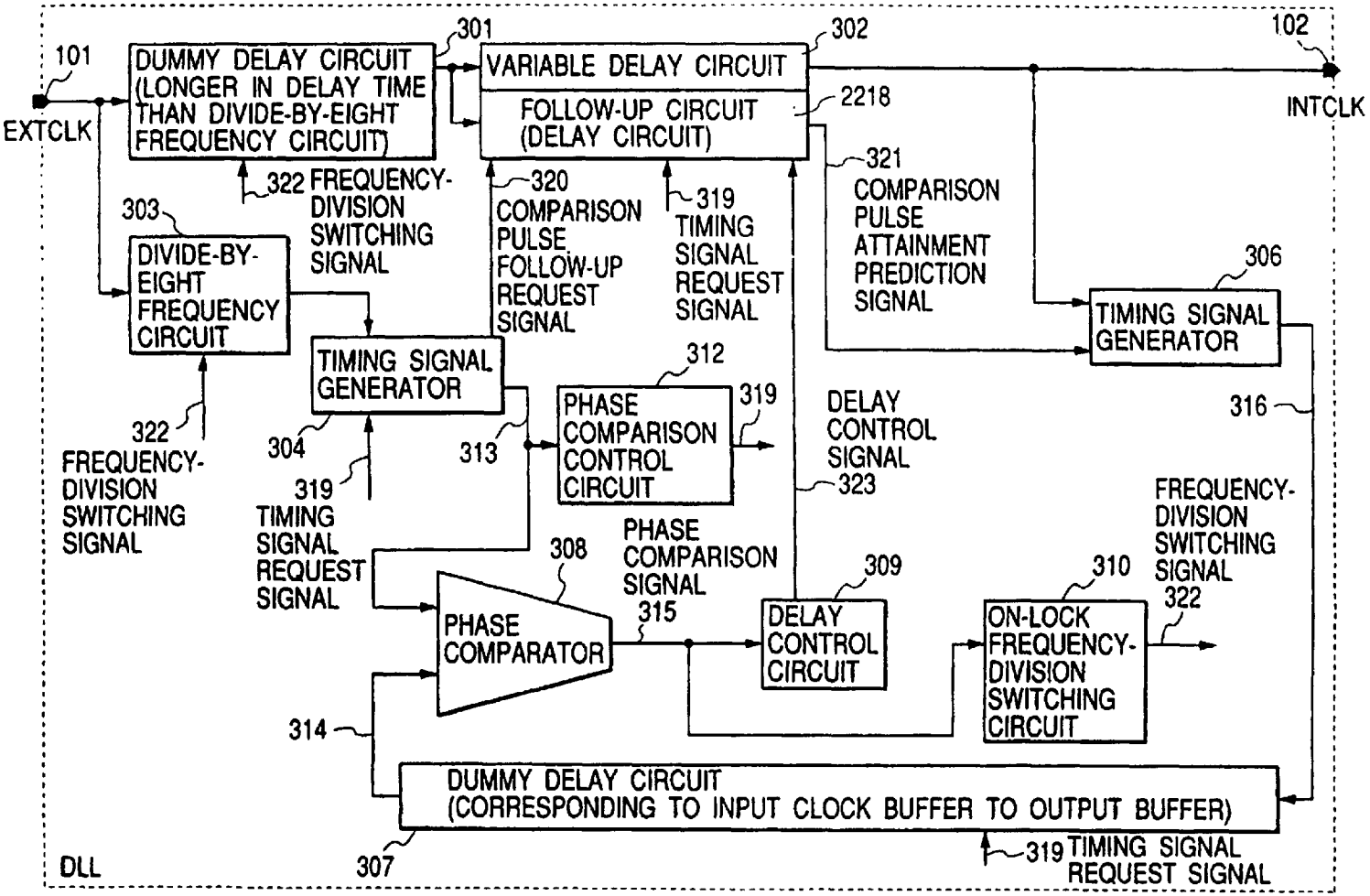
FIG. 30 is a block diagram showing by way of example, a timing control circuit wherein a phase comparison signal is brought to a step signal and speed control in a delay loop is made possible.

One example of a timing control circuit, which brings a phase comparison signal into step signalization and permits speed control on a delay loop, is illustrated in FIG. 30 as a timing control circuit 501.

The timing control circuit shown in FIG. 30 comprises an external clock input terminal 101, an internal clock output terminal 102, a variable delay circuit 302, a follow-up circuit 2218, a divide-by-eight frequency circuit 303 for dividing an external clock signal by eight, a dummy delay circuit 301 having a delay time longer than a delay time developed in the divide-by-eight frequency circuit 303, a timing signal generator 304, a timing signal generator 306, a dummy delay circuit 307 for reproducing a delay time tdrep developed in an input clock buffer, a long wire and an output data buffer of a chip, a phase comparator 308, a delay control circuit 309, a phase comparison control circuit 312 for controlling the generation of a timing signal, and an on-lock frequency-division switching circuit 310 for determining lock-in and rendering a frequency divider effective after the lock-in.

The variable delay circuit 302 receives or inputs a signal outputted from the dummy delay circuit 301 and outputs a clock signal to the terminal 102. The follow-up circuit 2218 is a delay circuit having a shift register configuration in which shift control terminals are successively coupled to a delay signal path of the variable delay circuit 302 and the input signal is delayed with a signal propagation delay time equivalent to that of the variable delay circuit 302. The dummy delay circuit 307 gives a predetermined delay time to a signal outputted from the timing signal generator 306 so that it is reproduced. The phase of a signal outputted from the dummy delay circuit 307 is compared with that of a signal 313 with a phase determining timing given by the signal 313 by the phase comparator 308. The delay control circuit 309 feedback-controls the delay time of the variable delay circuit 302 based on the result of determination by the phase comparator 308. The divide-by-eight frequency circuit 303 outputs the clock signal supplied from the terminal 101 as it is or frequency-divides it and outputs it therefrom. Every plural cycles of the clock signal outputted from the divide-by-eight frequency circuit 303, the timing control circuit 304 supplies a comparison pulse follow-up request signal 320 defined as a phase determining level signal to the delay circuit 2218 and supplies phase determining timing with respect to the phase determining level signal fed back to the phase comparator 308 to the phase comparator 308 through the signal 313. The phase comparison control circuit 312 functions as a reset control circuit for bringing the outputs of the follow-up circuit 2218 and the dummy delay circuit 307 or the like to an initial level respectively after the phase determining timing.

The divide-by-eight frequency circuit 303 outputs the clock signal supplied from the terminal 101 as it is before a lock-in state is detected from the result of phase determination by the phase comparator 308. After the attainment to the lock-in state has been detected from the result of phase comparison, the divide-by-eight frequency circuit 303 selects and outputs the divided signal. Correspondingly, the timing signal generator 306 selects the output signal of the variable delay circuit 302 before the lock-in state is detected from the result of phase determination by the phase comparator 308, and selects the output of the follow-up circuit 2218 after the lock-in state has been detected from the result of phase comparison.

Figure 31:
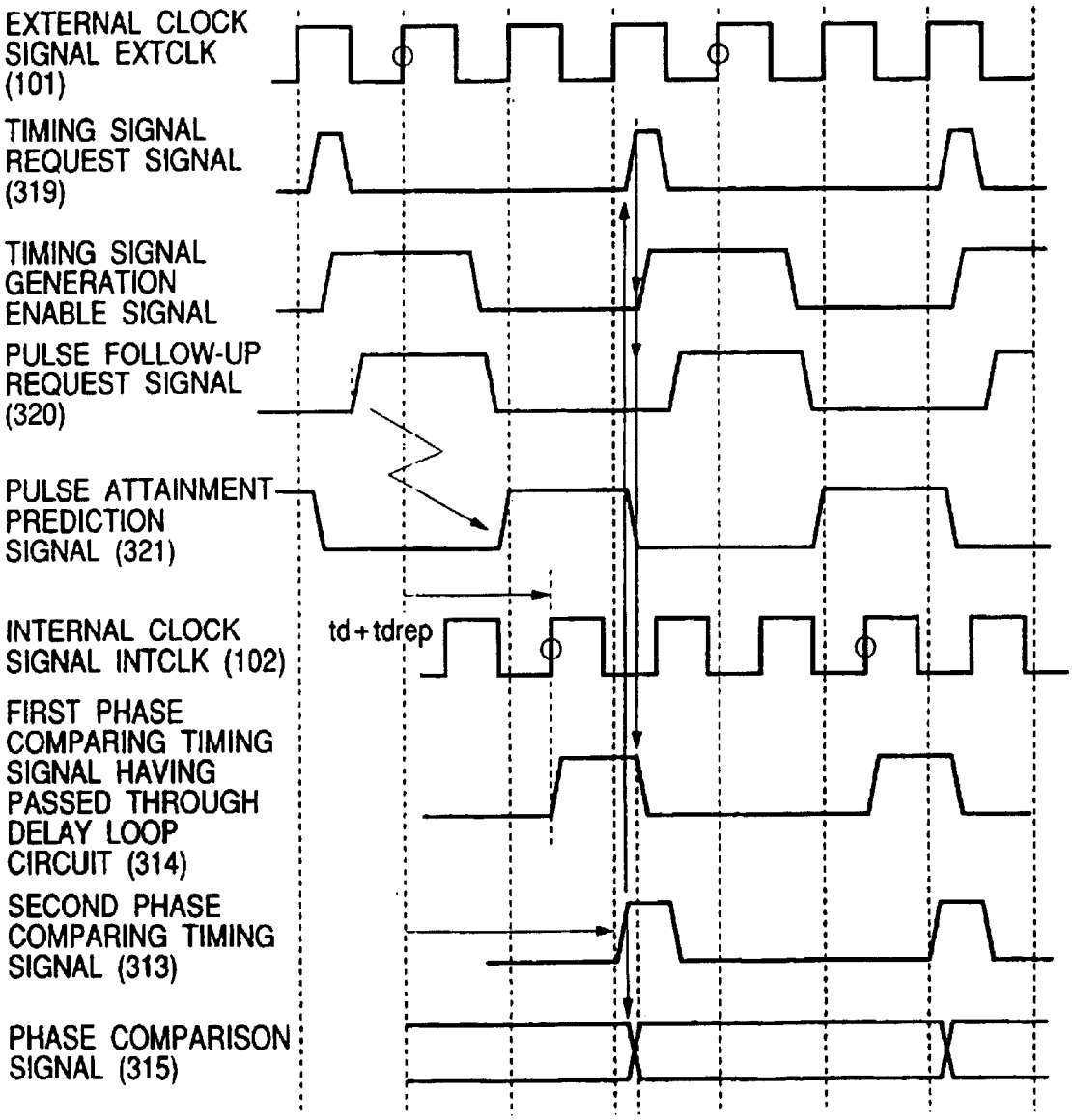
FIG. 31 is a timing chart illustrating operating timings of the timing control circuit of FIG. 30 by way example.

Operating timings of the timing control circuit shown in FIG. 30 are illustrated in FIG. 31 by way of example. The operation of the timing control circuit shown in FIG. 30 will be described with reference to FIG. 31.

The operation of the timing control circuit shown in FIG. 30 is divided into two of a first operation from an initial state thereof to lock-in thereof and a second operation subsequent to its lock-in.

During the first operation up to the lock-in, the divide-by-eight frequency circuit 303 causes an external clock signal EXTCLK (first clock) supplied from the terminal 101 to pass therethrough as it is. During the second operation subsequent to the lock, the divide-by-eight frequency circuit 303 divides the external clock signal by eight. Switching between these is done based on a frequency-division switching signal 322 outputted from the on-lock frequency-division switching circuit 310.

Prior to the operation, a reset signal is first inputted to bring the outputs of each flip-flop and a latch in the circuit to an "L" level. This is a positive pulse signal. Next, the external clock signal is inputted to the external circuit input terminal 101 during the first operation. The clock signal is sent to the dummy delay circuit 301 and the divide-by-eight frequency circuit 303. During the first operation, the divide-by-eight frequency circuit 303 outputs the input clock signal as it is.

Next, the signal outputted from the divide-by-eight frequency circuit 303 is inputted to the timing signal generator 304. If the timing signal generator 304 receives a timing signal request signal 319 in advance at this time, then the timing signal generator 304 outputs a comparison pulse follow-up request signal 320 for making a request to the follow-up circuit 2218 for the follow-up of a clock pulse corresponding to timing used for phase comparison, to the follow-up circuit 2218, and outputs a first phase comparing timing signal 313 to the phase comparator 308.

Now consider where the first phase comparing timing signal 313 is a signal given in a step waveform, which is indicative of timing by one rise waveform and which is delayed m clock cycles with respect to the output signal of the divide-by-eight frequency circuit 303. Further, the timing signal request signal 319 is a positive pulse signal. Now, one sent to the dummy delay circuit 301, of the external clock signal is outputted to the variable delay circuit 302 and the follow-up circuit 2218 after the delay thereof by the dummy delay circuit 301. The dummy delay circuit 301 and the variable delay circuit 302 constitutes a first delay circuit. This is intended to input the clock signal to the variable delay circuit 302 after the comparison pulse follow-up request signal 320 has reached the follow-up circuit 2218. Next, the delayed clock signal is inputted to the variable delay circuit 302 and outputted after the elapse of a delay time controlled by a delay control signal 323, which in turn is outputted from the internal clock output signal terminal 102 as an internal clock signal INTCLK (second clock).

At this time, the timing signal generator 306 is supplied with the output of the variable delay circuit 302 and a comparison pulse attainment prediction signal 321 outputted from the follow-up circuit 2218. The comparison pulse attainment prediction signal 321 is a positive step signal, which is inputted prior to within one clock cycle in which a clock pulse corresponding to timing used for phase comparison reaches the timing signal generator 306. That is, a clock pulse, which is to first arrive since the reception of the comparison pulse attainment prediction signal 321, results in a clock pulse corresponding to the timing used for phase comparison. Incidentally, the comparison pulse attainment prediction signal 321 is reset by the timing signal request signal 319. Next, the internal clock signal enters the timing signal generator 306. If the comparison pulse attainment prediction signal 321 is already inputted to the timing signal generator 306, then the timing signal generator 306 outputs a second phase comparing timing signal 316.

Here, the second phase comparing timing signal (first signal) 316 is a signal having a positive step waveform, which indicates timing by one rise waveform. The second phase comparing timing signal 316 passes through the dummy delay circuit (second delay circuit) 307 so as to enter the phase comparator 308. Next, the phase comparator 308 compares the timing for the first phase comparing timing signal 313 and that for a timing signal (second signal) 314 obtained by allowing the second phase comparing timing signal 316 to pass through a dummy delay circuit 1307. The result of comparison by the phase comparator 308 is outputted to the delay control circuit 309 as a phase comparison signal 315. The delay control circuit 309 outputs a delay control signal 323 in such a manner that when the timing signal 314 lags the first phase comparing timing signal (third clock) 313, the delay control circuit 309 shortens the delay time developed in the variable delay circuit 302, and when the timing signal 314 leads the first phase comparing timing signal 313 in reverse, it lengthens the delay time developed in the variable delay circuit 302, thereby controlling the delay time developed in the variable delay circuit 302.

Next, the phase comparison control circuit 312 outputs a timing signal request signal (fourth clock) 319 for making a request to the timing signal generator 304 for the generation of a new first phase comparing timing signal 313. Next, the timing signal generator 304 generates a new first phase comparing timing signal 313 when its obtains the timing signal request signal 319.

Owing to the implementation of the above control for a sufficient time, the timing for the timing signal 314 obtained by allowing the second phase comparing timing signal 316 to pass through a dummy delay circuit 1307 can be matched with that for the first phase comparing timing signal 313. Thus, an internal clock signal delayed m×tck−tdrep with respect to the external clock signal inputted to the terminal 101 can be obtained at the terminal 102. Incidentally, each of the phase comparison completion signal 317 and a delay signal attainment signal 318 is defined as a signal having a rise step waveform. Further, the timing signal request signal 319 is defined as a signal having a positive pulse waveform.

The second operation subsequent to the lock-in will next be explained. Prior to the second operation, the on-lock frequency-division switching circuit 310 first determines based on a time-sequential change in the phase comparison signal 315 whether the timing control circuit has locked in. If it is determined that it has locked in, then the on-lock frequency-division switching circuit 310 outputs a frequency-division switching signal 322. When the divide-by-eight frequency circuit 303 receives the frequency-division switching signal 322 therein, it changes the output thereof to a divided-by-eight clock signal. This results in a shift to the second operation. During the second operation, the divide-by-eight frequency circuit 303 is rendered effective, so that the parts other than the dummy delay circuit 301 and variable delay circuit 302 through which the clock signal passes, are activated according to the divided-by-eight clock.

Incidentally, the parts other than the variable delay circuit 201 can be activated based on the divided-by-eight clock subsequently to the lock-in in a manner similar to the above even in the case of the timing control circuit described with reference to FIG. 21. A frequency-division ratio selectable frequency-dividing circuit is placed at a stage prior to the timing signal generator 219 shown in FIG. 21. Further, the frequency-dividing circuit may perform division-by-eight or the like after the lock-in so as to make slow the operating speed of a delay loop.

Figure 32:
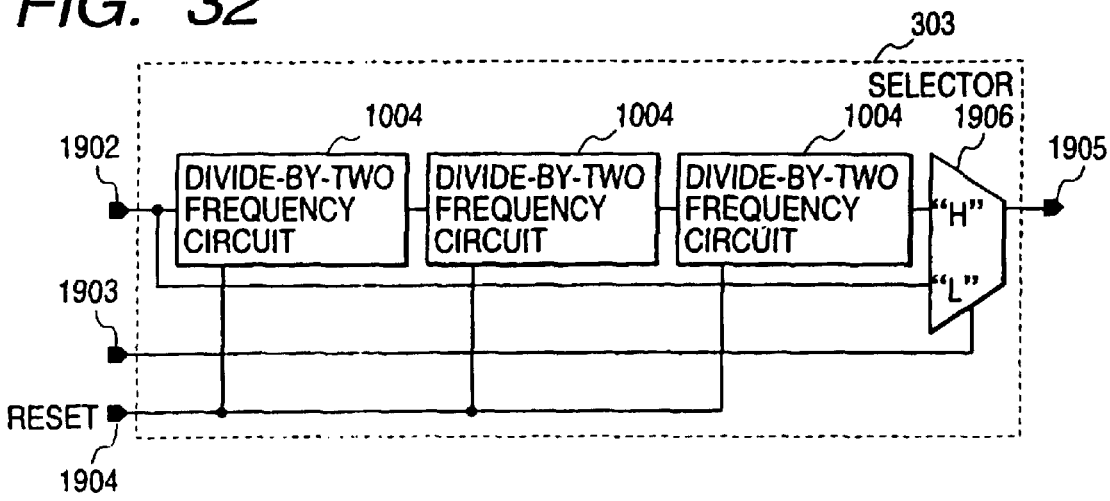
FIG. 32 is a logic circuit diagram showing a divide-by-eight frequency circuit 303 by way of example.
Figure 33:
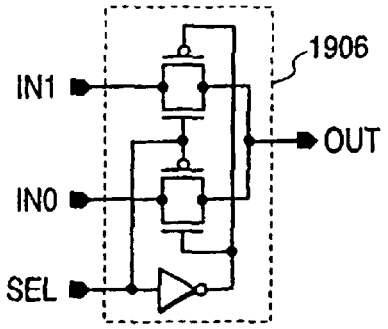
FIG. 33 is a circuit diagram depicting a selector 1906 by way of example.

One example of the divide-by-eight frequency circuit 303 is shown in FIG. 32. The divide-by-eight frequency circuit 303 is capable of perform switching between the output of a divided-by-eight clock signal and the output of an input signal as it is, based on a frequency-division switching signal. The divide-by-eight frequency circuit 303 comprises an input signal terminal 1902, a frequency-division switching signal input terminal 1903, a reset signal input terminal 1904, an output signal terminal 1905, three divide-by-two frequency circuits 1004, and a selector 1906. A specific example of the selector 1906 is shown in FIG. 33. In FIG. 33, a clocked inverter may be used in place of a CMOS transfer gate.

In the divide-by-eight frequency circuit 303, a positive pulse signal is first inputted to the reset signal input terminal 1904, and the outputs of the three divide-by-two frequency circuits 1004 are respectively initialized to an "L" level. Next, a clock signal is inputted to the input signal terminal 1902. On the one hand, the input clock signal passes through the three divide-by-two frequency circuits 1004 to thereby produce a divided-by-eight signal, followed by inputting to a first input terminal IN1 of the selector 1906. On the other hand, the input clock signal enters a second input terminal IN0 of the selector 1906 as it is. If a signal supplied to a selection signal terminal SEL is of an "H" level, then the selector 1906 outputs the signal inputted to the input signal terminal IN1. If the signal supplied to the selection signal terminal SEL is of an "H" level, then the selector 1906 outputs the signal inputted to the input signal terminal IN0. That is, if the signal supplied to the selection signal terminal SEL is of the "H" level, then the divide-by-eight frequency circuit 303 outputs a divided-by-eight clock signal. If the signal supplied to the selection signal terminal SEL is of the "L" level, then the divide-by-eight frequency circuit 303 outputs the input clock signal as it is.

Figure 34:
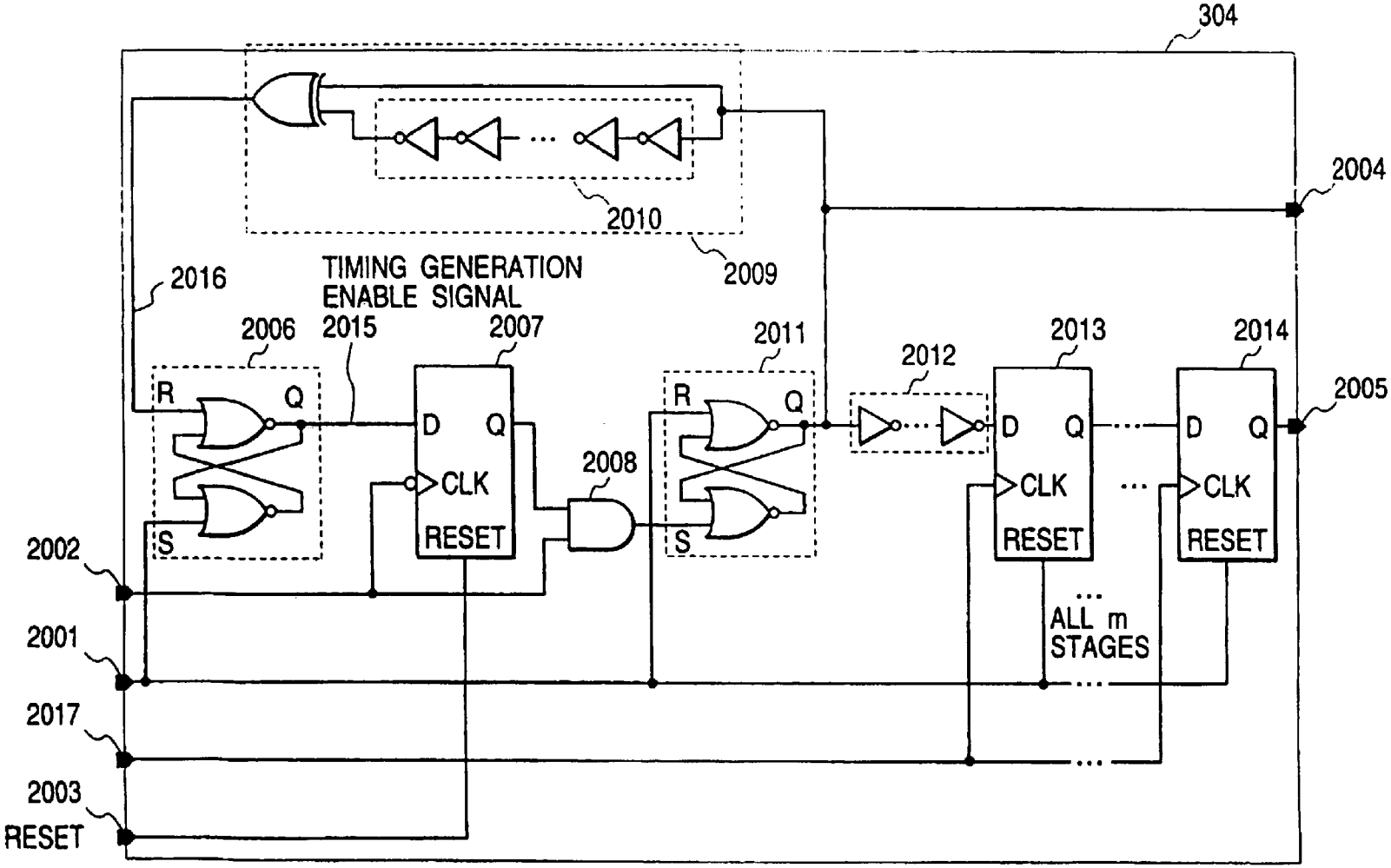
FIG. 34 is a logic circuit diagram illustrating a timing signal generator 304 by way of example.

One example of the timing signal generator 304 is shown in FIG. 34. The timing signal generator 304 generates a first phase comparing timing signal 313 and a comparison pulse follow-up request signal 320 in response to a timing signal request signal 319. Here, the first phase comparing timing signal 313 and comparison pulse follow-up request signal 320 are respectively signals represented in the form of step waveforms, each of which is indicative of timing on one rise waveform. The first phase comparing timing signal 313 needs to be delayed m clock cycles as viewed from the rising edge of the next output signal of the divide-by-eight frequency circuit 303 in response to the timing signal request signal 319. Here, m indicates an integer greater than 1. Further, the comparison pulse follow-up request signal 320 needs to be synchronized with the rising edge of the next output signal of the divide-by-eight frequency circuit 303 in response to the timing signal request signal 319.

In FIG. 34, the timing signal generator 304 comprises a terminal 2001 for inputting or receiving a timing signal request signal, a terminal 2002 for inputting or receiving a clock outputted from the divide-by-eight frequency circuit 303, a terminal 2003 for inputting or receiving a reset signal for the circuit, a terminal 2004 for outputting a comparison pulse follow-up request signal 320, a terminal 2005 for outputting a first phase comparing timing signal, a terminal 2017 for inputting or receiving an external clock, a first RS latch 2006 comprised of NOR gates, a D flip-flop 2007 for producing an output on the falling edge of the clock, an AND gate 2008, a pulse generator 2009, a second RS latch 2011, a delay circuit 2012, and series m-stage D flip-flops 2013 and 2014.

The operation of the timing signal generator 304 will next be explained. Prior to its operation, a reset signal having a positive pulse waveform is first supplied to the reset signal input terminal 2003. Thus, the D flip-flop 2007 is initialized. Next, a timing signal request signal having a positive pulse waveform is supplied to the terminal 2001. In doing so, the second RS latch 2011 and the m-stage D flip-flops 2013 and 2014 are initialized so that the outputs of the respective stages are respectively brought to an "L" level. At this time, the first RS latch 2006 is set so that a signal 2015 outputted therefrom is brought to an "H" level.

The terminal 2002 is supplied with a clock signal outputted from the divide-by-eight frequency circuit 303. The D flip-flop 2007 outputs data outputted from the first RS latch 2006 on the fall timing of the clock. The signal 2015 is a timing generation enable signal for permitting the generation of a timing signal. The signal 2015 is inputted to the AND gate 2008.

Next, when the timing generation enable signal 2015 is of an "H" level on the rise timing of the clock outputted from the divide-by-eight frequency circuit 303, the "H" level is outputted from the AND gate 2008. On the other hand, when the timing generation enable signal 2015 is of an "L" level on the rise timing thereof, the "L" level is outputted from the AND gate 2008. Thus, when the timing generation enable signal 2015 is of the "H" level, the "H" level appears at the output of the second RS latch 2011, so that a rise step waveform is outputted from the second RS latch 2011. The step waveform appears at the terminal 2004 and is used as a comparative pulse follow-up request signal 320. At this time, the comparison pulse follow-up request signal 320 is inputted even to the pulse generator 2009 from which a pulse signal 2016 having a pulse width determined according to a delay time developed in a delay circuit 2010 provided within the pulse generator 2009 is generated. The pulse signal 2016 is fed back so as to be inputted to a reset terminal R of the first RS latch 2006, thereby bringing a timing generation enable signal to an "L" level on the fall timing of the next clock. Incidentally, the timing signal having the step waveform, which is outputted from the second RS latch 2011, passes through the delay circuit 2012, followed by inputting to the m-stage D flip-flops 2013 and 2014. Since clock input terminals of these D flip-flops 2013 and 2014 are supplied with the external clock signal, the timing signal having the step waveform appears at the terminal 2005 after the elapse of m clock cycles from the rise timing of the clock outputted from the divide-by-eight frequency circuit 303. This results in the first phase comparing timing signal 313.

Incidentally, the delay of the delay circuit 2012 is taken to prevent a hazard from occurring in the output of the D flip-flop 2013 when a signal change timing at the input unit of the D flip-flop 2013 and the rise timing of the clock signal approach each other. This aims to separate the signal change timing at the input unit of the D flip-flop 2013 from the rise timing of the clock signal.

Thus, the circuit shown in FIG. 34 receives the timing signal request signal 319 therein to thereby generate the comparison pulse follow-up request signal 320 and the first phase comparing timing signal 313 delayed m clock cycles from the rise timing of the clock outputted from the divide-by-eight frequency circuit 303.

Figure 35:
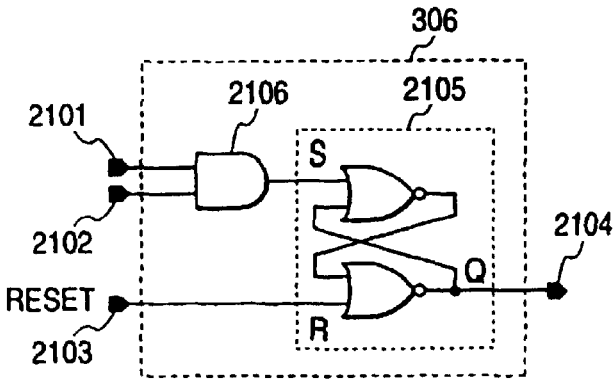
FIG. 35 is a logic circuit diagram showing a timing signal generator 306 by way of example.

One example of the timing signal generator 306 is shown in FIG. 35. The timing signal generator 306 receives a comparison pulse attainment prediction signal 321 outputted from the variable delay circuit 302 and thereafter generates a second phase comparing timing signal having a positive step waveform, which is synchronized with the first or initial rising edge of the output of the variable delay circuit 302.

The timing signal generator 306 comprises a comparison pulse attainment prediction signal input terminal 2101 for inputting or receiving the comparison pulse attainment prediction signal 321, a clock input terminal 2102 for inputting or receiving a clock outputted from the variable delay circuit 302, a reset signal input terminal 2103 for inputting or receiving a reset signal, a phase comparing timing signal output terminal 2104 for outputting a second phase comparing timing signal, an AND gate 2106, and a RS latch 2105.

The operation of the timing signal generator 306 will be explained. Prior to its operation, a reset signal having a positive pulse waveform is first inputted to the terminal 2103 for receiving the reset signal. Thus, the output of the RS latch 2105 is initialized so as to take an "L" level. A timing signal request signal 319 is used as the reset signal. Next, a comparison pulse attainment prediction signal 321 is inputted to the comparison pulse attainment prediction signal input terminal 2101 from the follow-up circuit 2218. Thereafter, when the initial rising edge of a signal outputted from the variable delay circuit 302 appears at the terminal 2102, the RS latch 2105 is set so as to output an "H" level, whereby a second phase comparing timing signal 316 is outputted from the phase comparing timing signal output terminal 2104. This state is held until the next reset signal, i.e., timing signal request signal 319 is given.

When no comparison pulse attainment prediction signal 321 is inputted, the output signal of the variable delay circuit 302 cannot pass through the AND gate 2106, and hence the RS latch 2105 is not set, thereby continuing to output an "L" level.

Thus, the timing signal generator 306 shown in FIG. 35 is capable of generating the second phase comparing timing signal 316 having the positive step waveform in synchronism with the initial rising edge of the output of the variable delay circuit 302 after having received the comparison pulse attainment prediction signal 321 therein.

Figure 36:
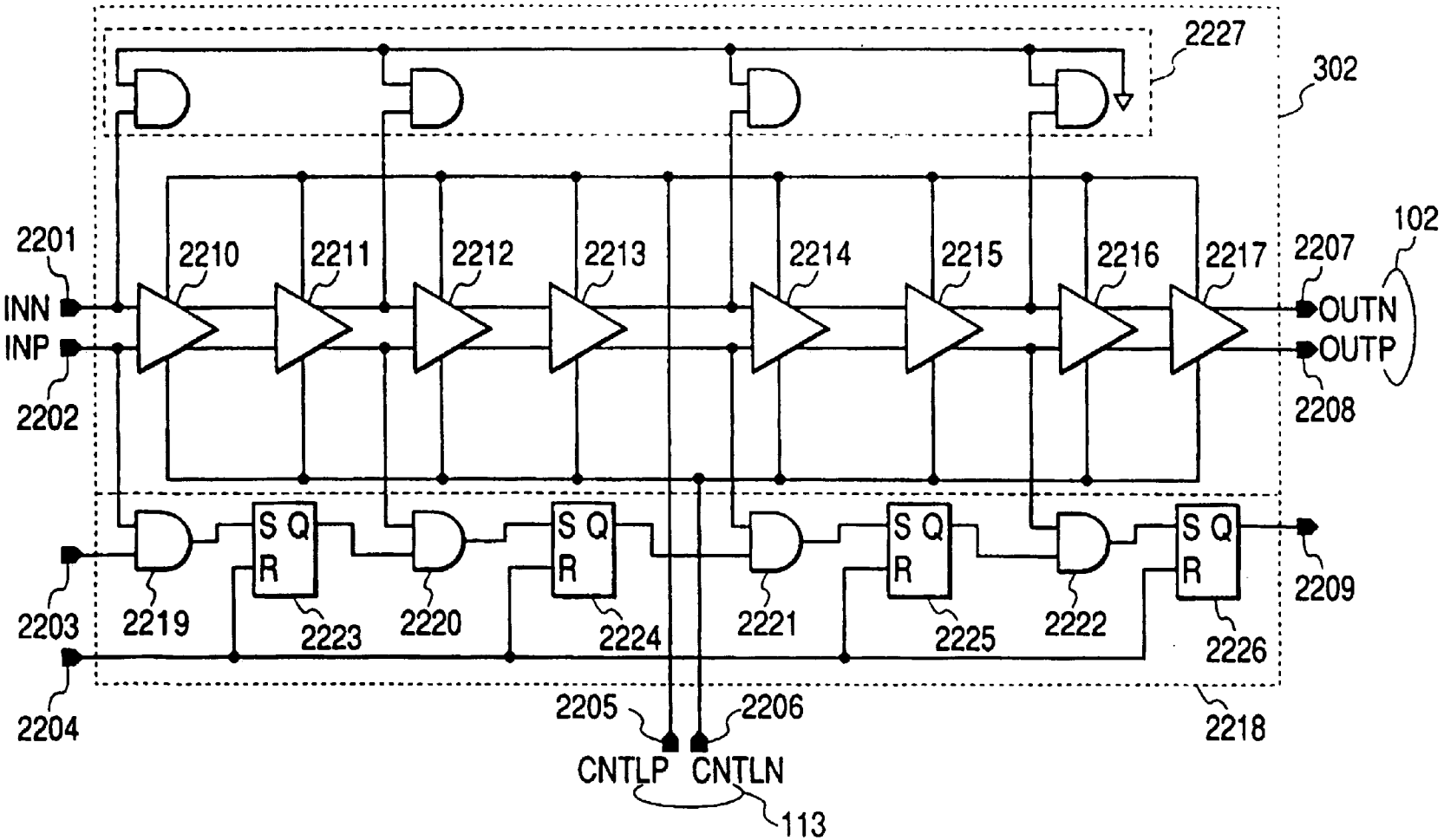
FIG. 36 is a logic circuit diagram depicting a variable delay circuit 302 and a comparison pulse follow-up circuit 2218 by way of example.

One examples of the variable delay circuit 302 and the comparison pulse follow-up circuit 2218 are shown in FIG. 36.

The variable delay circuit 302 outputs an input signal with a delay of a predetermined time according to a delay control signal 323. The comparison pulse follow-up circuit 2218 outputs a comparison pulse attainment prediction signal 321 for notifying the attainment of a clock pulse to the timing signal generator 306 in advance upon outputting the clock pulse corresponding to timing used for phase comparison. Incidentally, the interval between timing provided to output the comparison pulse attainment prediction signal 321 and timing provided to output the clock pulse, which is associated with the timing used for phase comparison, will be set within one clock cycle time.

In FIG. 36, the variable delay circuit 302 comprises a first clock signal input terminal 2202, a second clock signal input terminal 2201, a comparison pulse follow-up request signal input terminal 2203, a comparison pulse follow-up circuit reset signal input terminal 2204, a first delay control signal input terminal 2205, a second delay control signal input terminal 2206, a first clock signal output terminal 2207, a second clock signal output terminal 2208, a comparison pulse attainment prediction signal output terminal 2209, first through eighth eight delay circuit stages 2210 through 2217, and a dummy load 2227. The comparison pulse follow-up circuit 2218 forms a load at one-sided output terminals of the delay circuit stages 2211, 2213 and 2215. In order to maintain balance with this load, the dummy load 2227 is provided at the other-sided output terminals of the delay circuit stages as a load similar to the above.

Incidentally, the variable delay circuit 302 is the same as the variable delay circuit 103 shown in FIG. 1 except for the dummy load 2227. Further, a differential buffer circuit 801 is used for each of the first through eighth delay circuit stages 2210 through 2217. Therefore, the variable delay circuit 302 is identical to the variable delay circuit 103 in generation of the delay time and operation related to its control.

The comparison pulse follow-up circuit 2218 is a circuit for outputting the comparison pulse attainment prediction signal 321 for notifying the attainment of the clock pulse to the timing signal generator 306 beforehand upon outputting the clock pulse corresponding to the phase comparing timing. The comparison pulse follow-up circuit 2218 comprises four AND gates 2219 through 2222 and four RS latches 2223 through 2226.

Prior to the operation of the comparison pulse follow-up circuit 2218, a comparator reset signal having a positive pulse waveform is first inputted to the comparison pulse follow-up circuit reset signal input terminal 2204. This aims to reset the four RS latches 2223 through 2226 in the comparison pulse follow-up circuit 2218. A timing signal request signal 319 may be used for the comparator reset signal. When the timing signal request signal 319 is inputted, a first input signal for the AND gate 2219, which is supplied from the terminal 2203, is next brought to an "H" level. Next, a clock pulse corresponding to timing used for phase comparison is inputted to the first clock signal input terminal 2202 of the variable delay circuit 302. This is supplied as for a second input signal for the AND gate 2219 as a positive pulse. In doing so, the positive pulse appears in an output signal of the AND gate 2219 so that the RS latch 2223 is brought to a set state, thereby outputting a signal of an "H" level. At this time, a first input signal of the AND gate 2220 is brought to an "H" level. Next, when the clock pulse corresponding to the timing used for phase comparison, which is inputted to the variable delay circuit 302, passes through the first delay circuit stage 2210 and the second delay circuit stage 2211, a positive pulse appears at a first output terminal of the second delay circuit stage 2211. This is applied even to a second input of the AND gate 2220. Thus, the positive pulse appear in an output signal of the AND gate 2220, so that the RS latch 2224 is set so as to output a signal of an "H" level. At this time, a first input signal of the AND gate 2221 is brought to the "H" level. When the clock pulse corresponding to the timing used for phase comparison, which is inputted to the variable delay circuit 302, passes through the third delay circuit stage 2212 through the sixth delay circuit stage 2215 continuously, the second RS latch 2224 through the fourth RS latch 2226 are respectively brought to a set state in the same manner as described above, so that a signal of an "H" level appears at the comparison pulse attainment prediction signal output terminal 2209, whereby a positive step signal, i.e., a comparison pulse attainment prediction signal 321 is outputted.

Thereafter, the clock pulse corresponding to the timing used for phase comparison passes through the seventh and eighth delay circuit stages 2216 and 2217, followed by being outputted from the variable delay circuit 302. That is, the interval between the comparison pulse attainment prediction signal 321 and the timing provided to output the clock pulse corresponding to the timing used for phase comparison is equivalent to a time interval reduced by delay times developed in the AND circuit 2222 and RS latch 2226 as counted from a delay time corresponding to the delay circuit stages equal to two stages. Since the delay circuit stage equivalent to one stage delays the rising edge or falling edge of the signal, a delay time greater than or equal to a half clock cycle cannot be created. Accordingly, a delay time greater than or equal to one clock cycle cannot be created in the case of the delay circuit stages equivalent to two stages. It can be thus said that the time interval reduced by the delay times developed in the AND circuit 2222 and RS latch 2226 as counted from the delay time corresponding to the delay circuit stages equal to the two stages, i.e., the interval between the comparison pulse attainment prediction signal 2209 outputted from the terminal 2209 and the timing provided to output the clock pulse corresponding to the timing used for phase comparison is shorter than one clock cycle time.

As is apparent from the above, the variable delay circuit 302 shown in FIG. 36 outputs the input signal with the delay of the predetermined time according to the delay control signal 323. The comparison pulse follow-up circuit 2218 outputs the comparison pulse attainment prediction signal 321 for notifying the attainment of the clock pulse to the timing signal generator 2306 beforehand when the variable delay circuit 302 outputs the clock pulse corresponding to the phase comparing timing. The interval between the comparison pulse attainment prediction signal 321 and the timing provided to output the clock pulse corresponding to the timing used for phase comparison is shorter than one clock cycle time.

Figure 37:
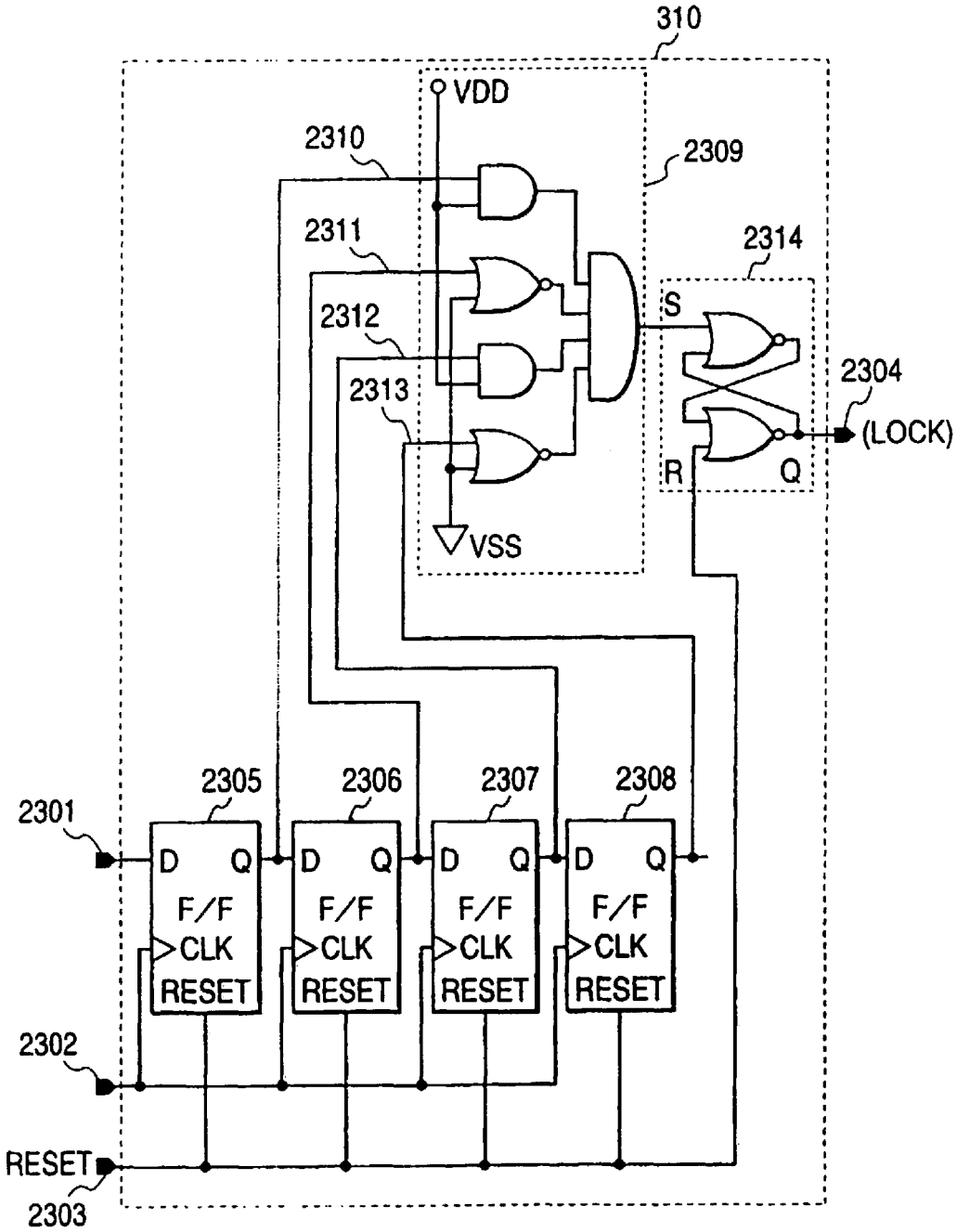
FIG. 37 is a logic circuit diagram showing an on-lock frequency-division switching circuit 310.

One example of the on-lock frequency-division switching circuit 310 is shown in FIG. 37. The on-lock frequency-division switching circuit 310 determines using a phase comparison signal 315 outputted from the phase comparator 308 whether the timing control circuit has locked in. If the timing control circuit is found not to be locked in, then the on-lock frequency-division switching circuit 310 outputs a signal of an "L" level. If it is determined that the timing control circuit has not been locked in, then the on-lock frequency-division switching circuit 310 outputs a signal of an "H" level According to FIG. 37, the on-lock frequency-division switching circuit 310 comprises a phase comparison signal input terminal 2301, a phase comparing timing signal input terminal 2302, a reset signal input terminal 2303, an on-lock frequency-division switching signal output terminal 2304, first through fourth flip-flops 2305 through 2308, a decoder circuit 2309, and a RS latch 2314.

The operation of the on-lock frequency-division switching circuit 310 will be explained. Prior to its operation, a positive pulse signal is first inputted to the reset signal input terminal 2303. This needs to initialize the outputs of the first through fourth flip-flops 2305 through 2308 and RS latch 2314 to an "L" level respectively and is carried out at power-on or upon DLL start-up. Next, a phase comparison signal corresponding to a first phase comparing timing signal 313 is inputted to the phase comparison signal input terminal 2301. Further, the first phase comparing timing signal 313 is inputted to the phase comparing timing signal input terminal 2302. If an internal clock leads an external clock in the phase comparator 308, then the phase comparison signal is given as an "H" level. If the internal clock lags the external clock, then the phase comparison signal is given as an "L" level. These signals are inputted to the first flip-flop 2305 and successively supplied to the second through fourth flip-flops 2306 through 2308 with the rise timing of the phase comparing timing signal 313.

Next, after the timing control circuit has been locked in, the level of the phase comparison signal is set such that "H" and "L" levels appear alternatively as in the case of "H", "L", "H", "L", . . . In doing so, patterns represented in the form of "H", "L", "H" and "L" appear at outputs 2310 through 2313 of the first through fourth flip-flops. The decoder circuit 2309 outputs an "H" level only when the outputs 2310 through 2313 of the first through fourth flip-flops are respectively brought to the patterns represented in the form of "H", "L", "H" and "L". The decoder circuit 2309 outputs an "L" level except for the above. Thus, the decoder circuit 2309 outputs a pulse signal brought to an "H" level only when the outputs 2310 through 2313 of the first through fourth flip-flops are respectively given as the patterns represented in the form of "H", "L", "H" and "L".

Next, the pulse signal is inputted to a set terminal S of the RS latch 2314. The RS latch 2314 is brought to a set state so that the output thereof is brought to an "H" level. Thus, the output state of the RS latch 2314 is maintained until it is reset.

Thus, the on-lock frequency-division switching circuit 310 is capable of making a decision as to lock-in of DLL, inverting the output from "L" to "H" levels after its lock-in and maintaining that level.

Figure 38:
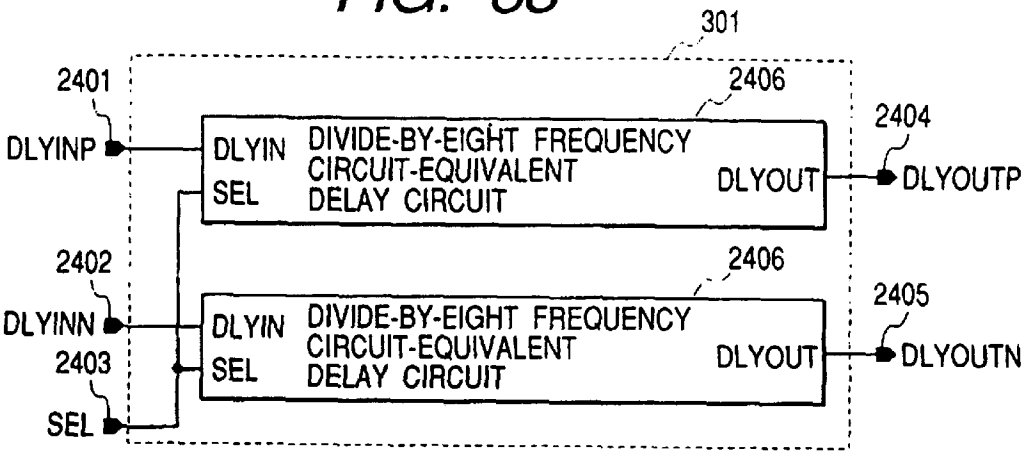
FIG. 38 is a logic circuit diagram illustrating a dummy delay circuit 301 by way of example.

One example of the dummy delay circuit 301 is shown in FIG. 38. The dummy delay circuit 301 is a circuit for generating a delay time longer than that developed in the divide-by-eight frequency circuit 303. The dummy delay circuit 301 comprises delay signal input terminals 2401 and 2402 for differentially inputting or receiving signals to be delayed, a frequency-division switching signal input terminal 2403 for receiving or inputting a frequency-division switching signal, delay signal output terminals 2404 and 2405 for differentially-outputting the delayed signals, and two divide-by-eight frequency circuit-equivalent delay circuits 2406 each having a single-end type input/output.

Figure 39:
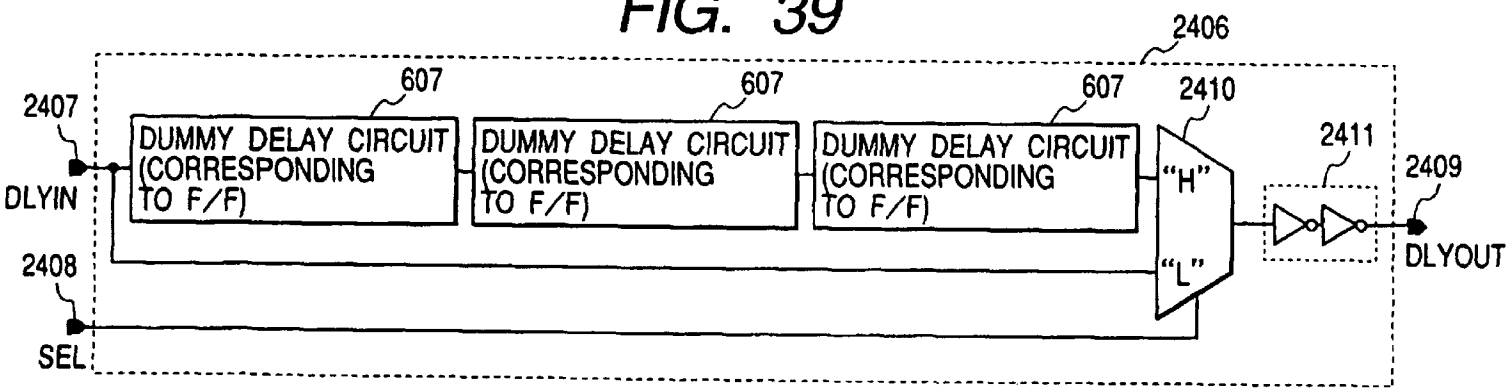
FIG. 39 is a logic circuit diagram depicting a divide-by-eight frequency circuit-equivalent delay circuit 2406.

As illustrated in FIG. 39 by way of example, the divide-by-eight frequency circuit-equivalent delay circuit 2406 is comprised of dummy delay circuits 607 corresponding to three stages connected in series, a selector 2410, and a series two-stage type inverter 2411. The dummy delay circuit 607 is constructed so as to have the same delay time as the flip-flop as described by reference to FIG. 16. The divide-by-eight frequency circuit-equivalent delay circuit 2406 is one obtained by replacing the divide-by-two frequency circuits 604 of the divide-by-eight frequency circuit 301 with the dummy delay circuits 607 each having the same delay time as the flip-flop. Since the reset signal is of course unnecessary, a reset signal input terminal has been omitted.

The selector 2410 may be the same circuit as the selector 106 shown in FIG. 33. Further, the two-stage type inverter 2411 is electrically connected between the selector 2410 and a delay signal output terminal 2409.

The operation of the dummy delay circuit 301 will next be described. When the frequency-division switching signal is "L", the divide-by-eight frequency circuit 303 outputs the input signal through the selector 1906, but the circuit shown in each of FIGS. 38 and 39 outputs the input signal through the selector 2410 and the two-stage type inverter 2411. Thus, in this case, the dummy delay circuit 301 shown in FIG. 38 has a delay time longer than the delay time of the divide-by-eight frequency circuit 303 by a delay time developed in the two-stage type inverter 2411. On the other hand, when the frequency-division switching signal is "H", the input signal passes through the divide-by-two frequency circuits 604 corresponding to three stages so as to be brought to a divided-by-eight signal, which in turn is outputted through the selector 1906 in the divide-by-eight frequency circuit 303. However, the signal inputted to the circuit shown in FIG. 39 passes through the dummy delay circuits 607 corresponding to three stages and is outputted through the selector 2410 and the two-stage type inverter 2411 without being subjected to frequency division. Since each dummy delay circuit 607 has a delay time identical to that of the flip-flop, it has the same delay time as that of each divide-by-two frequency circuit 604. That is, the dummy delay circuits 607 corresponding to three stages have the same delay time as that of the divide-by-eight frequency circuit. Thus, even in this case, the circuit shown in FIG. 38 has a delay time longer than the delay time of the divide-by-eight frequency circuit 303 by the delay time of the two-stage type inverter 2411. Thus, the circuit shown in FIG. 38 has the delay time longer than that of the divide-by-eight frequency circuit 303.

According to the configuration of the timing control circuit shown in FIG. 30 as has been apparent from above, the timing control circuit is provided with a mechanism which makes use of a dedicated timing signal different from a divided clock signal upon phase comparison at the time of lock-in of DLL and monitors the completion of a phase comparing operation. When the completion of the phase comparing operation is detected, it immediately starts to perform the next phase comparison. It is therefore possible to reduce intervals for timing provided to perform the phase comparison and timing provided to control a delay time of a variable delay circuit, to the minimum and shorten a lock-in time interval. Further, it is not necessary to provide the two variable delay circuits as in the prior art. One variable delay circuit and the follow-up circuit 2218 simpler than it in circuit configuration may be used. Furthermore, since a circuit control circuit other than a circuit on a clock line of the timing control circuit, and a dummy delay circuit for reproducing the delay inside a chip may be intermittently activated after the lock-in, a timing control circuit small in area and low in power can be implemented.

<<SDRAM>>

Figure 40:
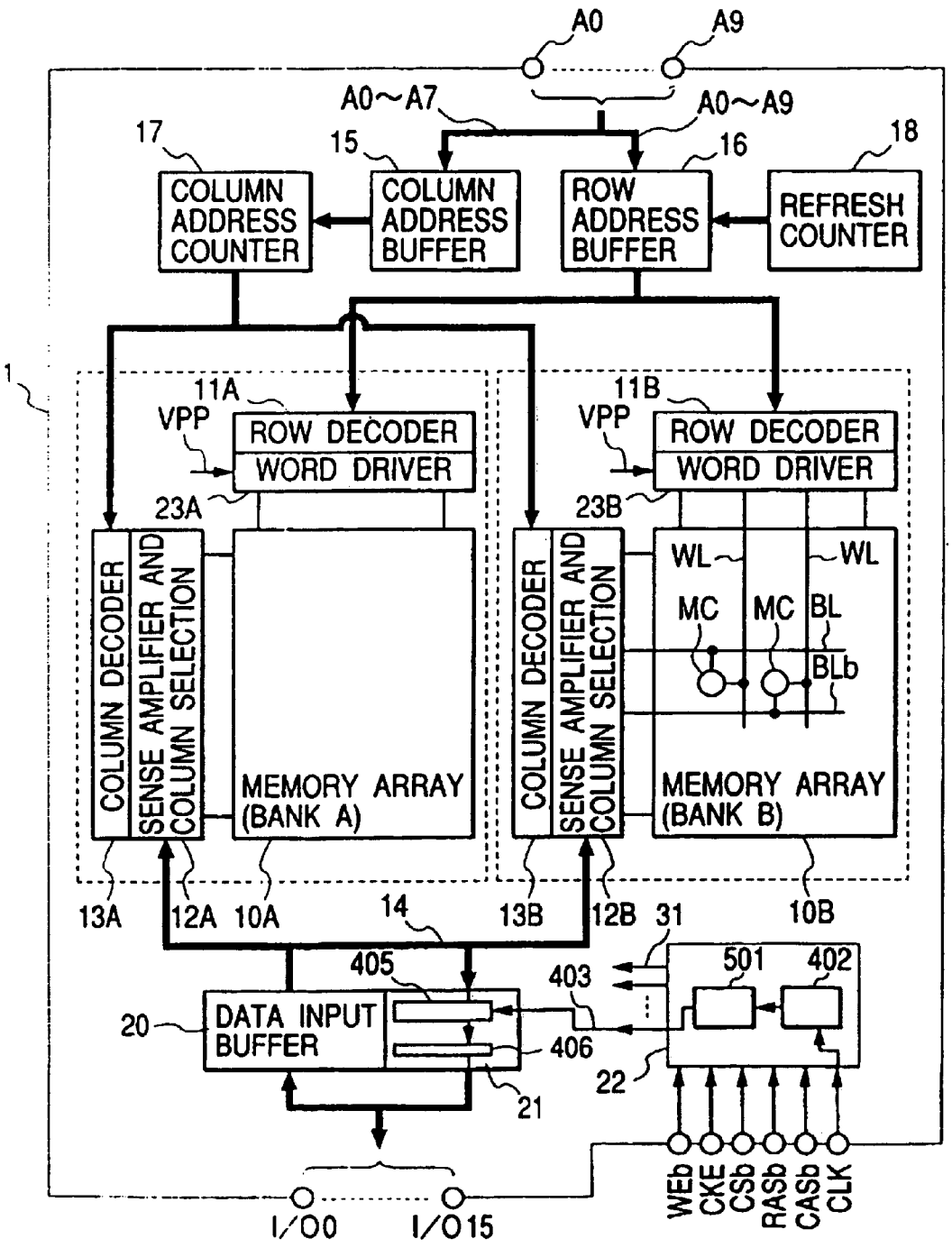
FIG. 40 is a block diagram showing an SDRAM as a specific example of a semiconductor device to which a timing control circuit is applied.

An SDRAM is shown in FIG. 40 as a specific example of a semiconductor device to which the timing control circuit is applied. Although not restricted in particular, the SDRAM shown in the same drawing is formed over one semiconductor substrate like monocrystalline silicon by the known semiconductor integrated circuit manufacturing technology.

An SDRAM1 has a memory array 10A which constitutes a bank A and a memory array 10B which constitutes a bank B. The respective memory arrays 10A and 10B are respectively provided with dynamic memory cells MC arranged in matrix form. According to the drawing, selection terminals of the memory cells MC arranged in the same column are electrically connected to their corresponding word lines WL provided every columns. Further, data input/output terminals of the memory cells arranged in the same row are electrically coupled to their corresponding complementary data lines BL and BLb every rows. While only parts of the word lines and complementary data lines are typically illustrated in the same drawing, they are arranged in large numbers in the form of a matrix.

One of the word lines WL of the memory array 10A, which has been selected according to the result of decoding of a row address signal by a row decoder 11A, is driven so as to take a selection level by a word driver 23A.

The complementary data lines of the memory array 10A are respectively coupled to a sense amplifier and column selection circuit 12A. A sense amplifier in the sense amplifier and column selection circuit 12A is an amplifier circuit for detecting a small voltage difference developed between the respective adjacent complementary data lines according to the reading of data from each memory cell MC. The column switch circuit therein is a switch circuit for separately selecting the complementary data lines and making continuity between the selected one and a complementary common data line 14. The column switch circuit is selectively activated according to the result of decoding of a column address signal by a column decoder 13A. A row decoder 11B, a word driver 23B, a sense amplifier and column selection circuit 12B, and a column decoder 13B are provided in the same manner as above even on the memory array 10B side. The complementary common data line 14 is electrically connected to an output terminal of a data input buffer 20 and an input terminal of a data output buffer 21. An input terminal of the data input buffer 20 and an output terminal of the data output buffer 21 are respectively electrically connected to data input/output terminals I/O0 through I/O15 represented in 16 bits.

Row and column address signals supplied from address input terminals A0 through A9 are respectively captured by a column address buffer 15 and a row address buffer 16 in address multiplex form. The supplied address signals are held by their corresponding buffers. The row address buffer 16 captures a refresh address signal outputted from a refresh counter 18 as row address signals in a refresh operation mode. The output of the column address buffer 15 is supplied as preset data for a column address counter 17. The column address counter 17 outputs the column address signals defined as the preset data or the values obtained by successively incrementing the column address signals to the column decoders 13A and 13B according to operation modes specified by commands or the like to be described later.

Although not restricted in particular, a controller 22 is supplied with external control signals such as a clock signal CLK, a clock enable signal CKE, a chip select signal CSb (whose suffix b means that a signal marked with it indicates a row enable signal or a level inversion signal), a column address strobe signal CASb, a row address strobe signal RASb and a write enable signal Web, etc., and control data inputted from the address input terminals A0 through A9 to thereby form internal timing signals for controlling operation modes of the SDRAM and the operations of the above-described circuit blocks, based on the levels of these signals, timings for changes in the signals, etc. Thus, the controller is provided with control logic used therefor.

The clock signal CLK is defined as a master clock for the SDRAM, and other external input signals are rendered significant in synchronism with the rising edge of the clock signal.

The chip select signal CSb provides instructions for the commencement of a command input cycle according to its low level. When the chip select signal is high in level (held in a chip non-selected state), other inputs do not make sense. However, the state of selection of each memory bank to be described later, and internal operations such as a burst operation, etc. are not affected by a change to the chip non-selected state.

The respective signals such as RASb, CASb and WEb are different in function from the corresponding signals employed in the normal DRAM and are defined as signals significant when command cycles to be described later are defined.

The clock enable signal CKE is a signal for specifying the validity of the next clock signal. When the signal CKE is high in level, the rising edge of the next clock signal CLK is rendered effective or valid. On the other hand, when the signal CKE is low in level, the rising edge thereof is made invalid. When a power-down mode (corresponding even to a data retention mode in the SDRAM) is selected, the clock enable signal CKE is brought to a low level.

Further, although not shown in the drawing, the external control signal for effecting output enable control on the data output buffer 21 in a read mode is also supplied to the controller 22. When the signal is high in level, for example, the data output buffer 21 is brought to a high output impedance state.

The row address signals are defined according to the levels of A0 through A8 in a row address strobe/bank active command cycle to be described later synchronized with the rising edge of the clock signal CLK.

The input supplied from A9 is regarded as a bank select signal in the row address strobe/bank active command cycle. That is, when the input supplied from A9 is low in level, the memory bank A is selected. When the input is high in level, the memory bank B is selected. Although the selection and control of each memory bank are not restricted in particular, they can be carried out by processes such as the activation of the row decoder alone on the selection memory bank side, the entire non-selection of the column switch circuits on the non-selection memory bank side, the connection to the data input buffer 20 and data output buffer 21 on the selection memory bank side alone, etc.

The column address signals are defined according to the levels of A0 through A7 in a read or write command (corresponding to a column address/read command or column address/write command to be described later) synchronized with the rising edge of the clock signal CLK. Each column address defined in this way is defined as a start address for a burst access.

The operation modes of the SDRAM, which are specified according to the commands, may include a mode register set command, a row address strobe/bank active command, a column address/read command, etc.

The mode register set command is a command for setting the mode register 220. The command is specified according to CSb, RASb, CASb and WEb=low level. Data (register set data) to be set are supplied through A0 through A9. Although not restricted in particular, the register set data may include a burst length, CAS latency, a write mode, etc. Although not restricted in particular, 1, 2, 4, 8 and a full page (256) may be mentioned as a settable burst length. Settable CAS latency may include 1, 2 and 3. Further, burst write and signal write may be mentioned as a settable write mode.

The CAS latency is used to specify what cycles of the clock signal CLK should be spent from the falling edge of CASb to the output operation of the data output buffer 21 upon a read operation specified by a column address/read command to be described later. An internal operation time required to perform data reading is required till the determination of data to be read. The CAS latency is used to set the internal operation time according to the used frequency of the clock signal CLK. In other words, when a clock signal CLK high in frequency is used, the CAS latency is set to a relatively large value, whereas when a clock signal CLK low in frequency is used, the CAS latency is set to a relatively small value.

The row address strobe/bank active command is a command for validating the designation of row address strobe and the selection of the corresponding memory bank by A9. This is specified according to CSb and RASb=low level and CASb and WEb=high level. At this time, addresses supplied to A0 through A8 are captured as row address signals, and a signal supplied to A9 is captured as a signal for selecting each memory bank. The operation of capturing such each signal is performed in synchronism with the rising edge of the clock signal CLK as described above. When the corresponding command is specified, for example, a word line for the corresponding memory bank specified by the command is selected and each individual memory cells connected to the corresponding word line are caused to conduct over their corresponding complementary data lines.

The column address/read command is a command required to start a burst read operation. Further, this command is a command for providing instructions for column address strobe. The present command is specified according to CSb and CASb=low level and RASb and WEb=high level. At this time, addresses supplied to A0 through A7 are captured as column address signals. Thus, each captured column address signal is supplied to the column address counter 17 as a burst start address. Upon the burst read operation specified by it, the selection of the corresponding memory bank and its corresponding word line is performed in a row address strobe/bank active command cycle prior to the burst read operation. Memory cells connected to the corresponding word line are successively selected and continuously read according to address signals outputted from the column address counter 17 in synchronism with the clock signal CLK. The number of continuously-read data is set to the number specified by the above burst length. The commencement of reading of data from the output buffer 21 is done while awaiting the number of cycles of the clock signal CLK, which is specified by the CAS latency.

Here, the input clock buffer 402 and timing control circuit 501 like DLL described in FIG. 3 are incorporated in the controller 22. The data output buffer 21 is provided with the data register 405 and output buffer 406. The long wire 403 corresponds to a clock wire or interconnection for connecting the timing control circuit 501 and the data register 405. Incidentally, the output buffer 406 is capable of output operation in an output operation mode. Timing provided to latch data in the data latch 405 is set to substantially the same phase as that of the clock signal CLK. An unillustrated microprocessor or the like for accessing the SDRAM is capable of reading data in synchronism with the clock signal CLK like a system clock signal.

While the invention achieved above by the present inventors has been described specifically by the embodiments, the present invention is not necessarily limited to them. It is needless to say that various changes can be made thereto within the scope not departing from the substance thereof.

For example, the number of frequency divisions by a frequency-dividing circuit is not limited to 8. Four or sixteen or the like may be used as the number thereof. Further, the present invention is not limited to the SDRAM and can be widely applied to clock synchronous semiconductor devices such as an SSRAM, a memory mixed-type system LSI, etc.

Advantageous effects obtained by typical ones of the inventions disclosed in the present application will be described in brief as follows:

It is not necessary to provide two variable delay circuits as in the prior art. At least one frequency divider is provided midway between a variable delay circuit and a dummy delay circuit. Further, the dummy delay circuit is activated by a frequency-divided clock without increasing the variable delay circuit in number. Therefore, a timing control circuit small in area and low in power can be provided.

Further, since intervals for timing used for phase comparison and timing provided to control a delay time of a variable delay circuit are short as compared with the conventional DLL type timing control circuit, it is possible to implement the shortening of a lock-in time and an improvement in follow-up performance of an internal clock.

Furthermore, since a timing control circuit according to the present invention is short in lock-in time, a synchronous LSI short in recovery time as counted from its standby state can be provided if the timing control circuit is applied thereto.

What is claimed is:

1. A clock signal generating circuit comprising:

a first delay circuit which receives a first clock signal and outputs a second clock signal, said second clock being a delayed signal to said first clock signal;

a first circuit which outputs a third clock signal, said third clock signal being a frequency-divided signal to said first clock signal;

a second circuit which outputs a fourth clock signal, said fourth clock signal being a frequency-divided signal to said second clock signal;

a second delay circuit which receives a fourth clock signal and outputs a fifth clock signal, said fifth clock signal being a delayed signal to said fourth clock signal; and a control circuit which compares said third clock signal and said fifth clock signal and controls said first delay circuit so that an output timing of said second clock signal is changed.

2. A clock signal generating circuit according to claim 1, further including a memory array having a plurality of memory cells and an output circuit which receives data read from said memory array, and wherein said output circuit is controlled based on the second clock.

3. A clock signal generating circuit comprising:

a clock forming circuit including, a first delay circuit which receives a first clock having a first cycle and thereby outputs a second clock obtained by delaying the first clock;

a second delay circuit which outputs a second signal obtaining by delaying a first signal in response to the second signal; and a control circuit which determines the state of the second signal at the time that a third clock having a second cycle has changed from a first level to a second level, in response to the third clock and the second signal, and outputs a control signal based on the result of determination to said first delay circuit; and wherein said second delay circuit is set to an initial state in response to a fourth clock having the second cycle and formed on one semiconductor substrate.

4. A clock signal generating circuit according to claim 3, wherein said second delay circuit includes a plurality of inverter circuits, and an input terminal of at least one inverter circuit of said plurality of inverter circuits is set to a predetermined potential in response to the fourth clock.

*5. A semiconductor memory, comprising:*

*a clock forming circuit including a first variable delay circuit which receives a first clock signal and outputs a second clock signal obtained by delaying said first clock signal;*

*a second variable delay circuit which receives a first signal and outputs a second signal obtained by delaying said first signal;*

*a first delay circuit which receives said second signal and outputs a third signal;*

*a control circuit which compares said third signal and a fourth signal and controls said first variable delay circuit in accordance with the compared result; and*

*a signal generator which outputs said first and fourth signals, wherein said second variable delay circuit is able to be reset so that the remaining signal in said second variable delay circuit is erased after said control circuit compares said third signal and said fourth signal.*

*6. A semiconductor memory according to claim 5, wherein a circuit configuration of said first variable delay circuit is identical to that of said second variable delay circuit.*

*7. A semiconductor memory according to claim 5, further comprising an output circuit which performs a data output operation in synchronism with a change in said second clock.*

*8. A semiconductor memory, comprising:*

*a clock forming circuit including,*

*a first variable delay circuit which receives a first clock and outputs a second clock obtained by delaying said first clock;*

*a second variable delay circuit which receives a first signal and outputs a second signal obtained by delaying said first signal;*

*a first delay circuit which receives said second signal and outputs a third signal;*

*a control circuit which compares said third signal and a fourth signal and controls said first variable delay circuits in accordance with the compared result; and*

*a signal generator which outputs said first and fourth signals, wherein said first delay circuit is able to be reset so that the remaining signal in said first delay circuit is erased after said control circuit compares said third signal and said fourth signal.*

*9. A semiconductor memory according to claim 8, wherein a circuit configuration of said first variable delay circuit is identical to that of said second variable delay circuit.*

*10. A semiconductor memory according to claim 8, further comprising an output circuit which performs a data output operation in synchronism with a change in said second clock.*

*11. A semiconductor memory, comprising:*

*a clock forming circuit including, a first variable delay circuit which receives a first clock and outputs a second clock obtained by delaying said first clock;*

*a first delay circuit which receives a first signal and outputs a second signal obtained by delaying said first signal, said first delay circuit having a second variable delay circuit and second delay circuit which are connected in series;*

*a control circuit which compares said second signal and a third signal and controls said first variable delay circuits in accordance with the compared result; and*

*a signal generator which outputs said first and third signals, wherein said second variable delay circuit is able to be reset thereby the remaining signal in said second variable delay circuit is erased after the comparing operation of said control circuit.*

*12. A semiconductor memory according to claim 11, wherein said second delay circuit is able to be reset thereby the remaining signal in said second delay circuit is erased after the comparing operation of said control circuit.*

*13. A semiconductor memory according to claim 11, wherein said second delay circuit receives an output signal of said second variable delay circuit and outputs said second signal.*

*14. A semiconductor memory according to claim 11, wherein a circuit configuration of said first variable delay circuit is identical to that of said second variable delay circuit.*

*15. A semiconductor memory according to claim 11, further comprising an output circuit which performs a data output operation in synchronism with said second clock.*

* * * * *